12) United States Patent
Ishii et al.

(10) Patent No.: US 8,791,766 B2
(45) Date of Patent: Jul. 29, 2014

(54) RESONATING ELEMENT, RESONATOR, ELECTRONIC DEVICE, ELECTRONIC APPARATUS, MOVING VEHICLE, AND METHOD OF MANUFACTURING RESONATING ELEMENT

(75) Inventors: Osamu Ishii, Tatsuno (JP); Shiro Murakami, Shiojiri (JP)

(73) Assignee: Seiko Epson Corporation (JP)

( * ) Notice: Subject to any disclaimer, the term of this patent is extended or adjusted under 35 U.S.C. 154(b) by 23 days.

(21) Appl. No.: 13/587,252

(22) Filed: Aug. 16, 2012

(65) Prior Publication Data

US 2013/0043960 A1 Feb. 21, 2013

(30) Foreign Application Priority Data

Aug. 18, 2011 (JP) ................................ 2011-178783
Aug. 24, 2011 (JP) ................................ 2011-182245
Jun. 11, 2012 (JP) ................................ 2012-131639

(51) Int. Cl.
*H03B 5/32* (2006.01)
*H01L 41/04* (2006.01)

(52) U.S. Cl.
USPC ............ 331/158; 310/346; 310/348; 310/368

(58) Field of Classification Search
USPC ................. 310/315, 344, 346, 348, 368, 370; 331/154, 156, 158
See application file for complete search history.

(56) References Cited

U.S. PATENT DOCUMENTS

| | | | |
|---|---|---|---|
| 3,694,677 A * | 9/1972 | Guttwein et al. ............. | 310/369 |
| 4,454,444 A * | 6/1984 | Fujiwara et al. ............. | 310/360 |
| 5,185,550 A | 2/1993 | Morita et al. | |
| 5,235,240 A * | 8/1993 | Morita et al. ................. | 310/365 |
| 5,307,034 A * | 4/1994 | Morita et al. ................. | 333/187 |
| 5,436,523 A * | 7/1995 | Staudte ......................... | 310/348 |
| 6,750,593 B2 * | 6/2004 | Iwata ............................ | 310/321 |
| 6,987,347 B2 * | 1/2006 | Yoshio et al. ................. | 310/320 |
| 7,098,574 B2 * | 8/2006 | Iwata ............................ | 310/320 |
| 7,235,913 B2 | 6/2007 | Iwata | |
| 7,298,069 B2 | 11/2007 | Yagishita | |
| 7,436,106 B2 | 10/2008 | Maruyama | |
| 8,026,652 B2 | 9/2011 | Yasuike | |
| 8,234,774 B2 * | 8/2012 | Hagelin et al. .................. | 29/594 |
| 2004/0036380 A1 | 2/2004 | Oda et al. | |
| 2008/0048527 A1 * | 2/2008 | Yoshio et al. ................. | 310/348 |
| 2011/0241790 A1 * | 10/2011 | Amano ......................... | 331/156 |
| 2012/0306321 A1 | 12/2012 | Ishii | |
| 2013/0043960 A1 | 2/2013 | Ishii et al. | |

FOREIGN PATENT DOCUMENTS

| | | |
|---|---|---|
| JP | 59-040715 | 3/1984 |
| JP | 61-187116 | 11/1986 |
| JP | 02-079508 | 3/1990 |
| JP | 03-235409 | 10/1991 |
| JP | 08-084044 | 3/1996 |

(Continued)

*Primary Examiner* — Levi Gannon
(74) *Attorney, Agent, or Firm* — Harness, Dickey & Pierce, P.L.C.

(57) ABSTRACT

A piezoelectric resonating element includes a piezoelectric substrate having a rectangular vibrating portion and a thick-walled portion, excitation electrodes and, and lead electrodes. The thick-walled portion includes a fourth thick-walled portion, a third thick-walled portion, a first thick-walled portion, and a second thick-walled portion. The third thick-walled portion includes a third slope portion and a third thick-walled body, and at least one slit is formed in the third thick-walled portion.

18 Claims, 28 Drawing Sheets

(56) References Cited

FOREIGN PATENT DOCUMENTS

| | | |
|---|---|---|
| JP | 09-246903 | 9/1997 |
| JP | 09-326667 | 12/1997 |
| JP | 2000-278080 A | 10/2000 |
| JP | 2001-016069 | 1/2001 |
| JP | 2001-016069 A | 1/2001 |
| JP | 2001-144578 | 5/2001 |
| JP | 2001-251160 | 9/2001 |
| JP | 2002-033640 | 1/2002 |
| JP | 2002-198772 | 7/2002 |
| JP | 2002-246869 | 8/2002 |
| JP | 2002-246869 A | 8/2002 |
| JP | 2003-087087 | 3/2003 |
| JP | 2003-110388 | 4/2003 |
| JP | 2003-264446 | 9/2003 |
| JP | 2004-088138 | 3/2004 |
| JP | 2004-088138 A | 3/2004 |
| JP | 2004-165743 | 6/2004 |
| JP | 2004-165798 | 6/2004 |
| JP | 2004-165798 A | 6/2004 |
| JP | 2004-260695 | 9/2004 |
| JP | 2005-020141 | 1/2005 |
| JP | 2005-033293 A | 2/2005 |
| JP | 2005-303825 | 10/2005 |
| JP | 2005-303825 A | 10/2005 |
| JP | 2005-354588 | 12/2005 |
| JP | 2006-203700 | 8/2006 |
| JP | 2007-158486 | 6/2007 |
| JP | 2007-214941 | 8/2007 |
| JP | 2007-318350 | 12/2007 |
| JP | 2009-135856 | 6/2009 |
| JP | 2009-158999 | 7/2009 |
| JP | 2009-159000 | 7/2009 |
| JP | 2009-159000 A | 7/2009 |
| JP | 2009-164824 | 7/2009 |
| JP | 2009-188483 | 8/2009 |
| JP | 2009-246583 | 10/2009 |
| JP | 2009-246583 A | 10/2009 |
| JP | 2010-011222 | 1/2010 |
| JP | 2010-011222 A | 1/2010 |
| JP | 2010-074840 | 4/2010 |
| JP | 2010-268498 | 11/2010 |
| JP | 2011-045112 | 3/2011 |
| JP | 2011-045113 | 3/2011 |

* cited by examiner

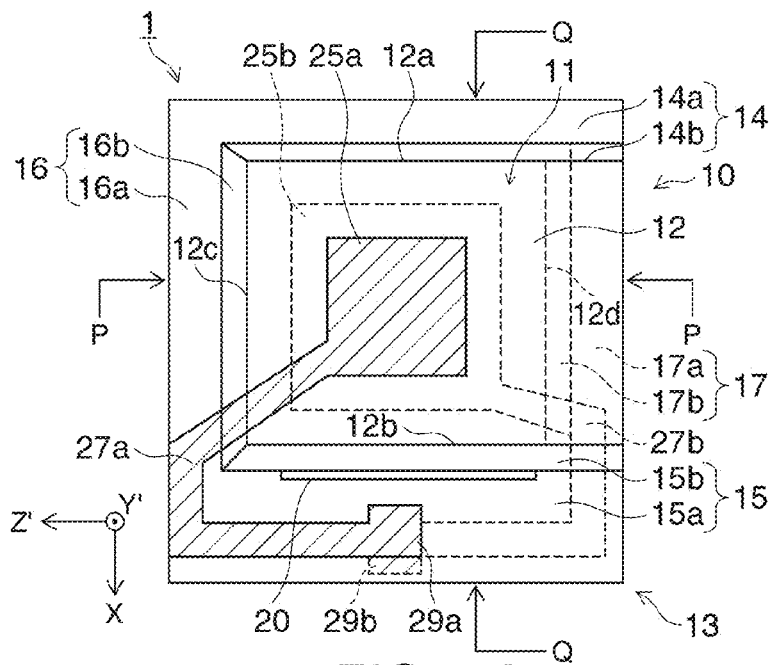
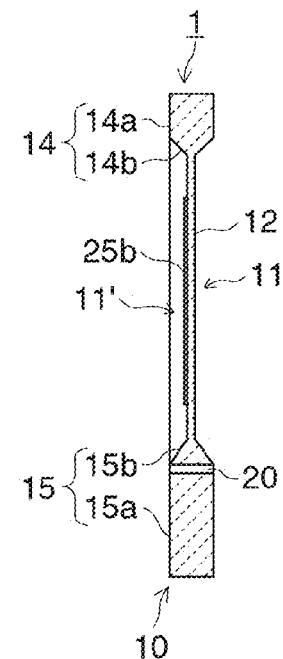
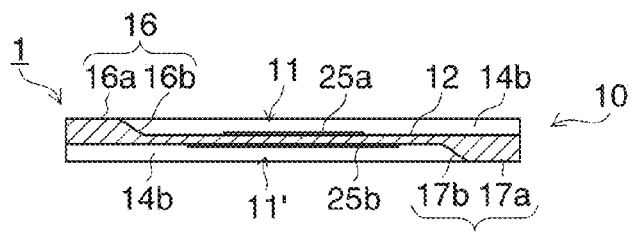
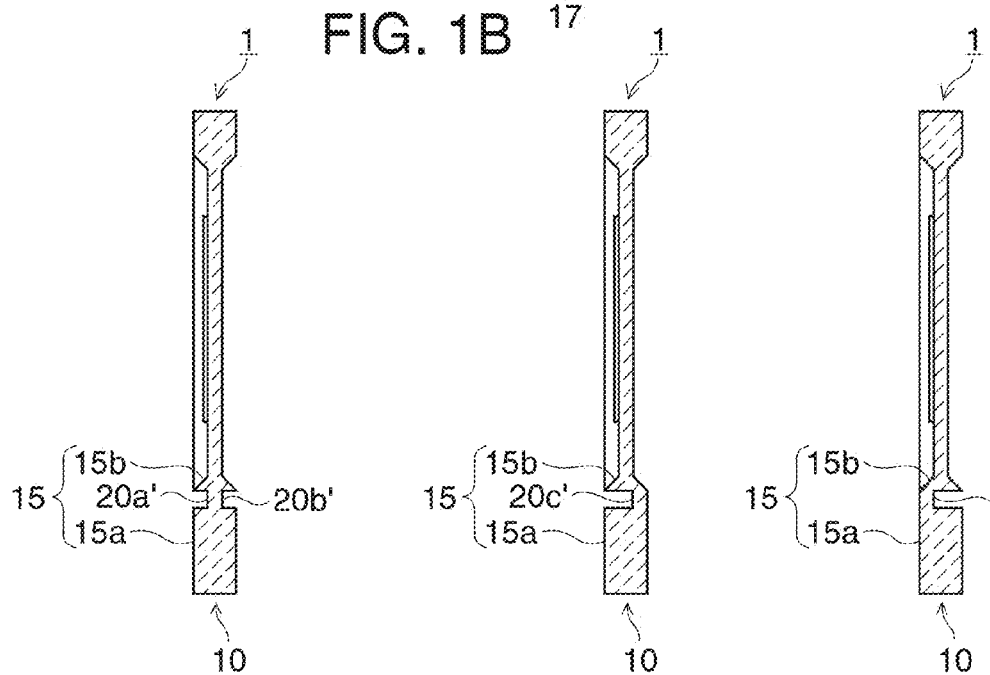
FIG. 1A
FIG. 1B
FIG. 1C
FIG. 1D
FIG. 1E
FIG. 1F

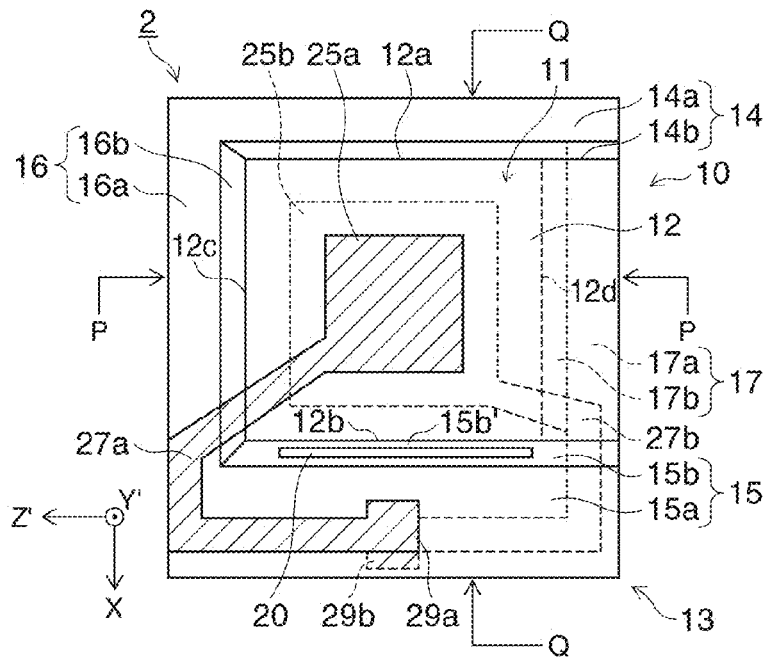
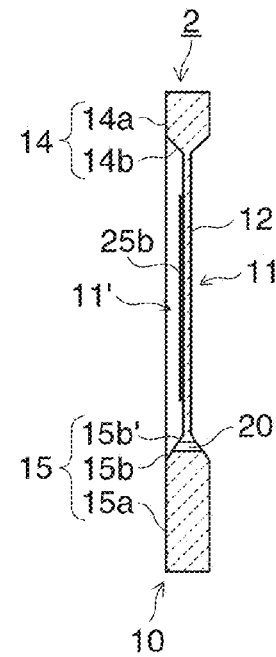
FIG. 5A
FIG. 5C
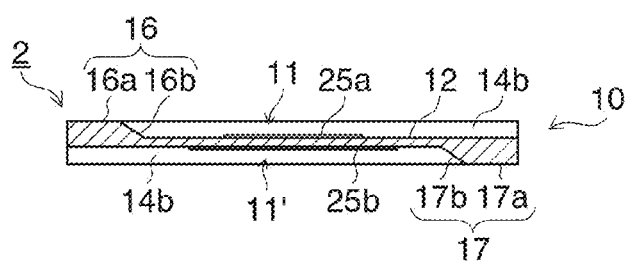
FIG. 5B

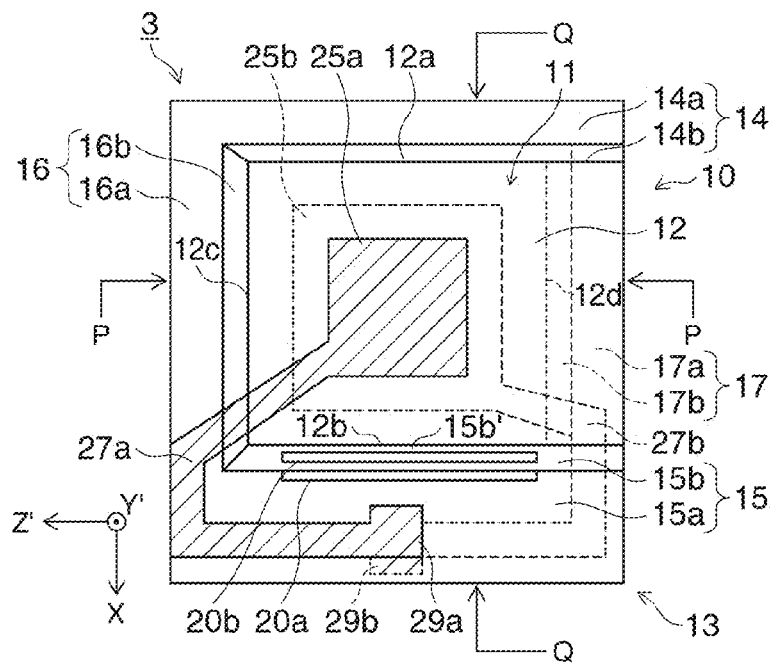
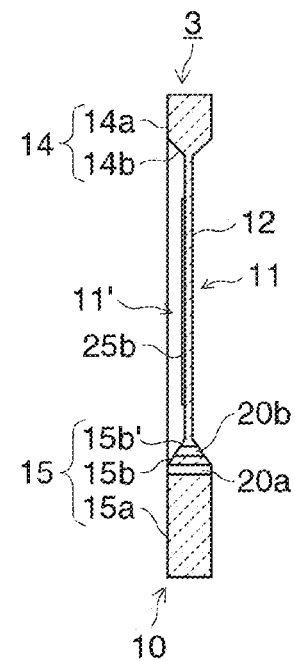
FIG. 6A
FIG. 6C
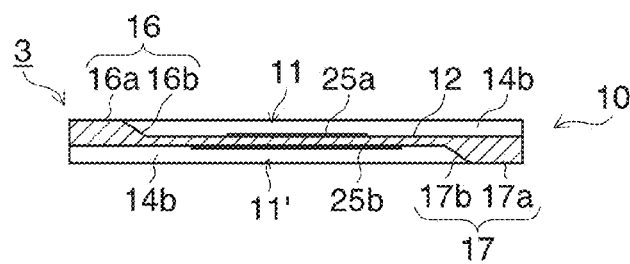
FIG. 6B

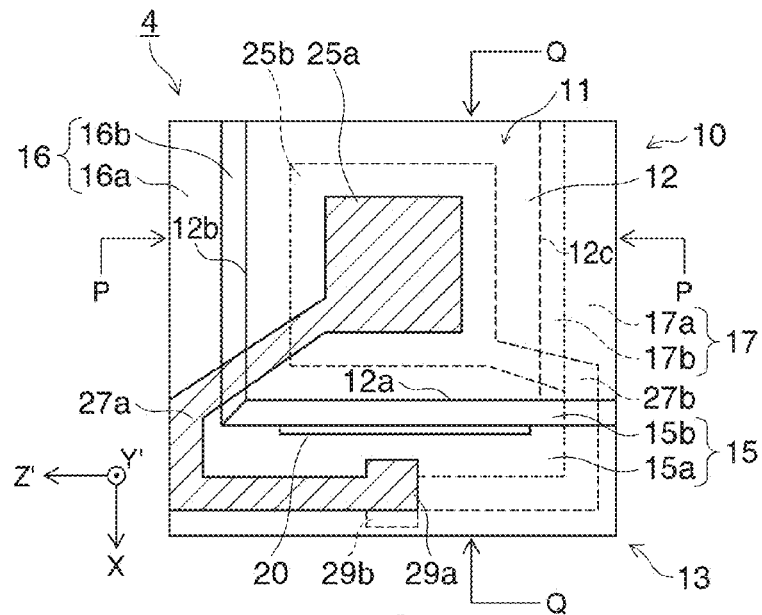
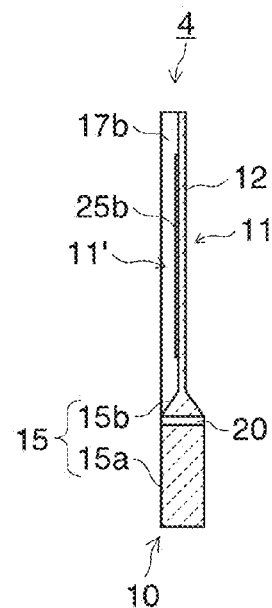
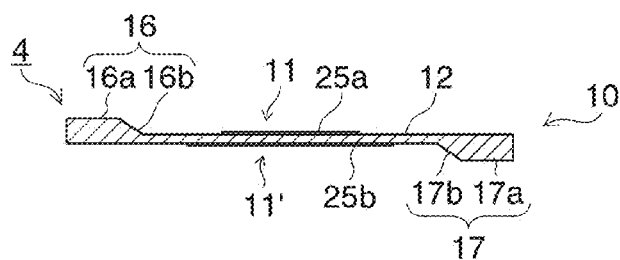
FIG. 8A
FIG. 8C
FIG. 8B
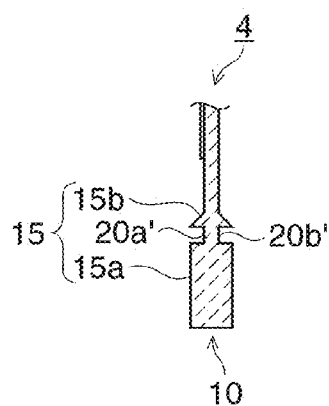
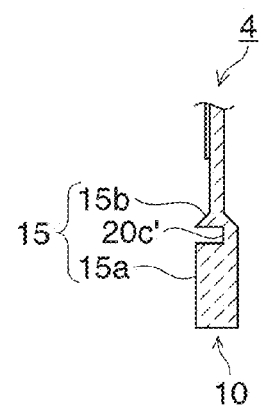
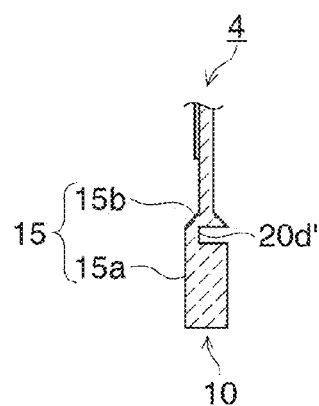
FIG. 8D    FIG. 8E    FIG. 8F

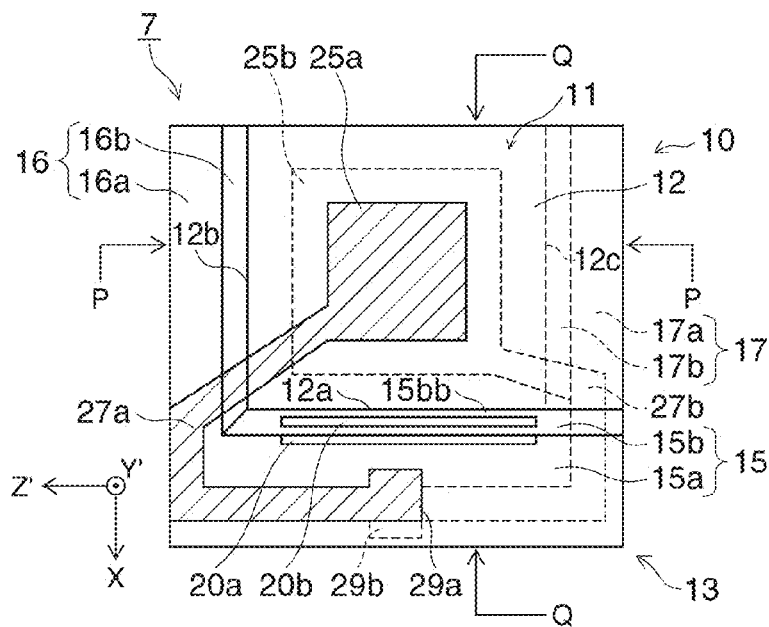
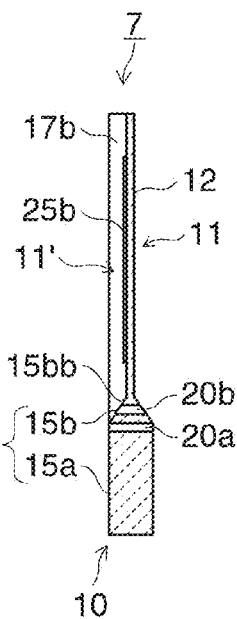
FIG. 13A  FIG. 13C
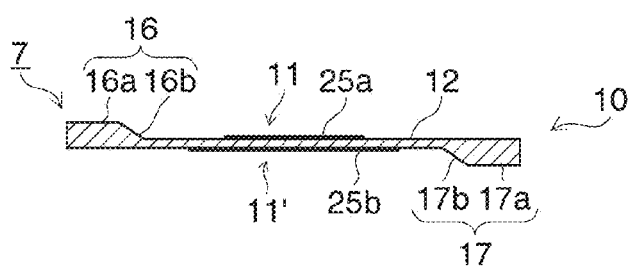
FIG. 13B

RESONATING ELEMENT, RESONATOR, ELECTRONIC DEVICE, ELECTRONIC APPARATUS, MOVING VEHICLE, AND METHOD OF MANUFACTURING RESONATING ELEMENT

BACKGROUND

1. Technical Field

The invention relates to a resonator that excites a thickness-shear vibration mode, and more particularly, to a resonating element having a so-called inverted mesa structure, a resonator, an electronic device, and an electronic apparatus using the resonator, a moving vehicle using the resonator, and a method of manufacturing the vibrating element.

2. Related Art

An AT-cut quartz crystal resonator which is an example of a resonator is used in various fields such as in a piezoelectric oscillator and an electronic apparatus since it excites a thickness-shear vibration mode as its main vibration mode and is ideal for decreasing size and increasing output frequency, as well as exhibiting excellent cubic curve with frequency-temperature characteristics.

In recent years, there has been a demand to further increase the output frequency of the AT-cut quartz crystal resonator, which has led to a need to further decrease the thickness of a vibrating portion of a resonator element used in the AT-cut quartz crystal resonator. However, there is a problem in that when the vibrating portion is made thinner, the rigidity of the vibrating portion decreases, and the impact resistance or the like deteriorates.

To solve this problem, for example, JP-A-2003-264446 discloses an AT-cut resonator having a so-called inverted mesa structure which increases the output frequency by forming depressed portions (vibrating portions) on both principal surfaces, namely the front and rear surfaces of a quartz crystal substrate so as to face each other. Specifically, the AT-cut resonator has a configuration in which a third thick-walled portion is formed along an X-axis direction of the vibrating portion, and a first thick-walled portion and a second thick-walled portion are formed along the outer edges in a Z-axis direction of the vibrating portion with the vibrating portion interposed so as to extend from both end portions of the third thick-walled portion. An X-long substrate is used as the quartz crystal substrate, and an excitation electrode is formed in a region where the flatness of the vibrating portion formed in the depressed portion is secured.

However, since etching is generally used in forming of the AT-cut resonator having the inverted mesa structure, an etching residue (also referred to as "fillet") is generated at the boundary between the vibrating portion and the first and second thick-walled portions formed along the Z-axis direction. However, it is confirmed that there is a problem in that when this etching residue is generated, the effective area of the vibrating portion decreases, and a CI value of a main vibration mode and the ratio (CIs/CIm) of a CI value (CIs) of an adjacent spurious vibration mode to the CI value (CIm) of a main vibration mode or the like does not satisfy a standard value (for example, 1.8 or more).

SUMMARY

An advantage of some aspects of the invention is to solve at least a part of the problems described above, and the invention can be implemented as the following forms or application examples.

Application Example 1

This application example is directed to a vibrating element including a substrate, the substrate including: a vibrating portion; a first thick-walled portion having a thickness greater than that of the vibrating portion, formed to be integrated with the vibrating portion along a first outer edge of the vibrating portion; and a second thick-walled portion having a thickness greater than that of the vibrating portion, formed to be integrated with the vibrating portion along a second outer edge of the vibrating portion, facing the first outer edge, in which the first thick-walled portion protrudes further than a principal surface of the vibrating portion, and the second thick-walled portion protrudes further than another principal surface on the rear side of the principal surface of the vibrating portion.

According to the vibrating element having this configuration, the first thick-walled portion protrudes further than a principal surface of the vibrating portion, and the second thick-walled portion protrudes further than the other principal surface on the rear side of the vibrating portion. Thus, the first and second thick-walled portions can be formed selectively on a principal surface where an etching residue is not generated, and the effective area of the vibrating portion can be increased. By doing so, a CI value of a main vibration mode and the ratio (CIs/CIm, a standard value thereof is 1.8 or more) of a CI value (CIs) of an adjacent spurious vibration mode to the CI value (CIm) of a main vibration mode is improved. Further, since the first and second thick-walled portions are formed, it is possible to obtain a vibrating element in which the vibrating portion is supported tightly, and which is resistant to vibration, impact, or the like.

Application Example 2

This application example is directed to the vibrating element according to the above-described application example, wherein a third thick-walled portion having a thickness greater than that of the vibrating portion is formed to be integrated with the vibrating portion along a third outer edge of the vibrating portion, connecting one set of ends of the first and second outer edges respectively.

According to this configuration, since the first to third thick-walled portions are formed along the three outer edges of the vibrating portion, it is possible to obtain a vibrating element in which the vibrating portion is supported more tightly, and which is more resistant to vibration, impact, or the like.

Application Example 3

This application example is directed to the vibrating element according to the above-described application example, wherein a fourth thick-walled portion having a thickness greater than that of the vibrating portion is formed to be integrated with the vibrating portion along a fourth outer edge of the vibrating portion, connecting the other set of ends of the first and second outer edges respectively.

According to this configuration, since the first to fourth thick-walled portions are formed along the four outer edges of the vibrating portion, that is, to surround the vibrating portion, it is possible to obtain a vibrating element in which the vibrating portion is supported more tightly, and which is more resistant to vibration, impact, or the like.

Application Example 4

This application example is directed to the vibrating element according to any one of the above-described application examples, wherein the substrate is a rotated Y-cut quartz crystal substrate.

According to this configuration, by forming a vibrating element using a quartz crystal substrate cut at the cutting angle, it is possible to form a vibrating element according to required specifications and is cut at a more appropriate cut angle. In addition, it is possible to obtain a high-frequency vibrating element having frequency-temperature characteristics compatible with the specifications and a low CI value and a high CI value ratio.

Application Example 5

This application example is directed to the vibrating element according to the above-described application example, wherein the third thick-walled portion is on a positive X-axis side in relation to the vibrating portion in a plan view thereof.

According to this configuration, it is possible to form a so-called X-long vibrating element in which the dimension in the X-axis direction is greater than the dimension in the Z'-axis direction.

Application Example 6

This application example is directed to the vibrating element according to the above-described application example, wherein the fourth thick-walled portion is on a negative X-axis side in relation to the vibrating portion in a plan view thereof.

According to this configuration, it is possible to form a so-called X-long vibrating element in which the dimension in the X-axis direction is greater than the dimension in the Z'-axis direction.

Application Example 7

This application example is directed to the vibrating element according to the above-described application example, wherein the third thick-walled portion includes a slope portion having a thickness that increases as the slope portion proceeds from one edge thereof, which is continuous with the vibrating portion, to the other edge thereof, and a thick-walled body that is continuous with the other edge of the slope portion.

According to this configuration, it is possible to confine a vibrational displacement in the vibrating portion and to hold the vibrating portion easily.

Application Example 8

This application example is directed to the vibrating element according to the above-described application example, wherein at least one slit is formed in the third thick-walled portion.

According to this configuration, by forming at least one slit in the third thick-walled portion, it is possible to suppress spreading of stress resulting from bonding or fixing. Thus, it is possible to obtain a vibrating element having excellent frequency-temperature characteristics, CI-temperature characteristics, and frequency-aging characteristics.

Application Example 9

This application example is directed to the vibrating element according to the above-described application example, wherein the slit is formed in the thick-walled body along a boundary portion between the slope portion and the thick-walled body.

According to this configuration, since the slit is formed in the thick-walled body along the boundary portion between the slope portion and the thick-walled body, it is possible to suppress spreading of stress occurring when bonding or fixing a piezoelectric vibrating element. Thus, it is possible to obtain a piezoelectric vibrating element having excellent frequency-temperature characteristics, CI-temperature characteristics, and frequency-aging characteristics.

Application Example 10

This application example is directed to the vibrating element according to the above-described application example, wherein the slit is disposed in the slope portion so as to be separated from the third outer edge of the vibrating portion.

According to this configuration, since the slit is disposed in the slope portion so as to be separated from the third outer edge of the vibrating portion, it is easy to form the slit and it is possible to suppress spreading of stress occurring when bonding or fixing the vibrating element. Thus, it is possible to obtain a vibrating element having excellent frequency-temperature characteristics and CI-temperature characteristics.

Application Example 11

This application example is directed to the vibrating element according to the above-described application example, wherein the slit includes a first slit disposed in the thick-walled body, and a second slit disposed in the slope portion so as to be separated from the third outer edge of the vibrating portion.

According to this configuration, since two slits are formed between the vibrating portion and the thick-walled body, it is possible to better suppress spreading of stress occurring when bonding or fixing the vibrating element. Thus, it is possible to obtain a vibrating element having excellent frequency reproducibility, frequency-temperature characteristics, CI-temperature characteristics, and frequency-aging characteristics.

Application Example 12

This application example is directed to the vibrating element according to the above-described application example, wherein the first slit is disposed in the thick-walled body along the boundary portion between the slope portion and the thick-walled body.

According to this configuration, it is possible to suppress spreading of stress occurring when bonding or fixing the vibrating element and to obtain a vibrating element having excellent frequency-temperature characteristics and CI-temperature characteristics.

Application Example 13

This application example is directed to a resonator including: the vibrating element according to any one of the above-described application examples; and a package that accommodates the vibrating element.

According to this configuration, the resonator includes the vibrating element in which the first and second thick-walled portions are formed to support the vibrating portion tightly, and which is resistant to vibration, impact, or the like, it is possible to improve the vibration resistance and the impact resistance of the resonator. Moreover, since a high fundamental frequency resonator is miniaturized, and stress resulting from bonding and fixing is suppressed, it is possible to obtain a resonator having excellent frequency reproducibility, frequency-temperature characteristics, CI-temperature characteristics, and frequency-aging characteristics. Further, it is possible to obtain a vibrating element in which the CI value of a main vibration mode is low, and the ratio of the CI value in an adjacent spurious vibration mode to the CI value of a main vibration mode, that is, a CI value ratio, is high, and to obtain a resonator having a small capacitance ratio.

Application Example 14

This application example is directed to an electronic device including a package, in which the vibrating element according to any one of the above-described application examples, and an electronic component are included.

According to this configuration, by selecting an electronic device based on the demands of a customer, it is possible to make the most of the vibrating element of the application example described above. For example, it is possible to obtain a compact and high frequency (for example, in the 490 MHz band) electronic device having excellent frequency reproducibility, frequency-temperature characteristics, and frequency-aging characteristics.

The electronic device has a configuration in which the vibrating element and an electronic component (for example, a thermistor) are accommodated in a package. Since the thermistor which is a thermosensor is disposed very closely to the piezoelectric vibrating element, it is possible to sense a temperature change of the piezoelectric vibrating element immediately. Moreover, by incorporating an electronic component, it is possible to lessen the load on the apparatus being used.

Application Example 15

This application example is directed to the electronic device according to the above-described application example, wherein the electronic component includes at least one of a variable capacitance element, a thermistor, an inductor, and a capacitor.

According to this configuration, when the electronic device (vibrating device) is formed using any one of a variable capacitance element, a thermistor, an inductor, and a capacitor, a compact and low-cost device ideal for an electronic device compatible with required specifications can be obtained.

Application Example 16

This application example is directed to an electronic device including a package, in which the vibrating element according to any one of the above-described application examples, and an oscillation circuit that excites the vibrating element are included.

According to this configuration, by selecting an electronic device based on the demands of a customer, it is possible to make the most of the vibrating element of the application example described above. For example, it is possible to obtain a compact and high frequency (for example, in the 490 MHz band) electronic device having excellent frequency reproducibility, frequency-temperature characteristics, and frequency-aging characteristics. Moreover, since the vibrating device uses a fundamental-mode vibrating element, a capacitance ratio is low, and a frequency variable width increases. Further, it is possible to obtain a voltage-controlled oscillator having an excellent S/N ratio.

Application Example 17

This application example is directed to an electronic apparatus including the vibrating element according to any one of the above-described application examples.

According to this configuration, since the resonator according to the application example described above is used in the electronic apparatus, it is possible to provide an electronic apparatus including a reference frequency source which has excellent stability at high frequencies and an excellent S/N ratio.

Application Example 18

This application example is directed to an electronic apparatus including the electronic device according to Application Example.

According to this configuration, since the electronic device according to the application example described above is used in the electronic apparatus, it is possible to provide an electronic apparatus including a reference frequency source which has excellent stability at high frequencies and an excellent S/N ratio.

Application Example 19

This application example is directed to a moving vehicle including the vibrating element according to any one of Application Examples.

According to this configuration, since the vibrating element used in the moving vehicle is a vibrating element which is resistant to vibration, impact, and the like, it is possible to provide a moving vehicle of which the vibration resistance and the impact resistance are improved. Moreover, it is possible to provide a moving vehicle including a reference frequency source which has excellent stability at high frequencies and an excellent S/N ratio.

Application Example 20

This application example is directed to a method of manufacturing a vibrating element including a vibrating portion, a first thick-walled portion having a thickness greater than that of the vibrating portion, formed to be integrated with the vibrating portion along a first outer edge of the vibrating portion, and protruding further than a principal surface of the vibrating portion, and a second thick-walled portion having a thickness greater than that of the vibrating portion, formed to be integrated with the vibrating portion along a second outer edge of the vibrating portion, facing the first outer edge protruding further than another principal surface on the rear side of the principal surface of the vibrating portion. The method includes: preparing a substrate; forming the first and second thick-walled portions by etching the substrate; forming an outer shape of the vibrating element by etching the substrate; and forming electrodes on the vibrating element.

According to this manufacturing method, it is possible to manufacture the vibrating element of the application example described above by a simple processing step. For example, by forming desired thick-walled portions at optional positions on the front and rear principal surfaces, a vibrating element in which the vibrating portion is supported tightly and which is resistant to vibration, impact, or the like can be manufactured easily.

BRIEF DESCRIPTION OF THE DRAWINGS

The invention will be described with reference to the accompanying drawings, wherein like numbers reference like elements.

FIGS. 1A to 1F are schematic views illustrating the structure of a piezoelectric vibrating element according to a first embodiment, in which FIG. 1A is a plan view, FIG. 1B is a cross-sectional view of cross-section P-P as seen from a positive X-axis direction, FIG. 1C is a cross-sectional view of a Q-Q cross-section as seen from a positive Z'-axis direction, and FIGS. 1D, 1E, and 1F are cross-sectional views of the Q-Q cross-section as seen from the positive Z'-axis direction, illustrating a slit shape according to a modification example.

FIGS. 5A to 5C are schematic views illustrating the structure of a piezoelectric vibrating element according to a second embodiment, in which FIG. 5A is a plan view, FIG. 5B is a cross-sectional view of a P-P cross-section as seen from the positive X-axis direction, and FIG. 5C is across-sectional view of a Q-Q cross-section as seen from the positive Z'-axis direction.

FIGS. 6A to 6C are schematic views illustrating the structure of a piezoelectric vibrating element according to a third embodiment, in which FIG. 6A is a plan view, FIG. 6B is a cross-sectional view of a P-P cross-section as seen from the positive X-axis direction, and FIG. 6C is across-sectional view of a Q-Q cross-section as seen from the positive Z'-axis direction.

FIGS. 8A to 8F are schematic views illustrating the structure of a piezoelectric vibrating element according to a fourth embodiment, in which FIG. 8A is a plan view, FIG. 8B is a cross-sectional view of a P-P cross-section as seen from a positive X-axis direction, FIG. 8C is a cross-sectional view of a Q-Q cross-section as seen from a positive Z'-axis direction, and FIGS. 8D, 8E, and 8F are cross-sectional views of the Q-Q cross-section as seen from the positive Z'-axis direction, illustrating a slit shape according to a modification example.

FIGS. 12A to 12C are schematic views illustrating the structure of a piezoelectric vibrating element according to a fifth embodiment, in which FIG. 12A is a plan view, FIG. 12B is a cross-sectional view of a P-P cross-section as seen from the positive X-axis direction, and FIG. 12C is a cross-sectional view of a Q-Q cross-section as seen from the positive Z'-axis direction.

FIGS. 13A to 13C are schematic views illustrating the structure of a piezoelectric vibrating element according to a sixth embodiment, in which FIG. 13A is a plan view, FIG. 13B is a cross-sectional view of a P-P cross-section as seen from the positive X-axis direction, and FIG. 13C is a cross-sectional view of a Q-Q cross-section as seen from the positive Z'-axis direction.

FIGS. 23A and 23B are views illustrating the configuration of a piezoelectric resonator, in which FIG. 23A is a vertical cross-sectional view, and FIG. 23B is a plan view excluding a lid portion.

FIGS. 35A to 35C illustrate a modification example of a piezoelectric vibrating element, in which FIG. 35A is a plan view, FIG. 35B is an enlarged view of a main part, and FIG. 35C is a cross-sectional view of the main part.

DESCRIPTION OF EXEMPLARY EMBODIMENTS

Figure 2:
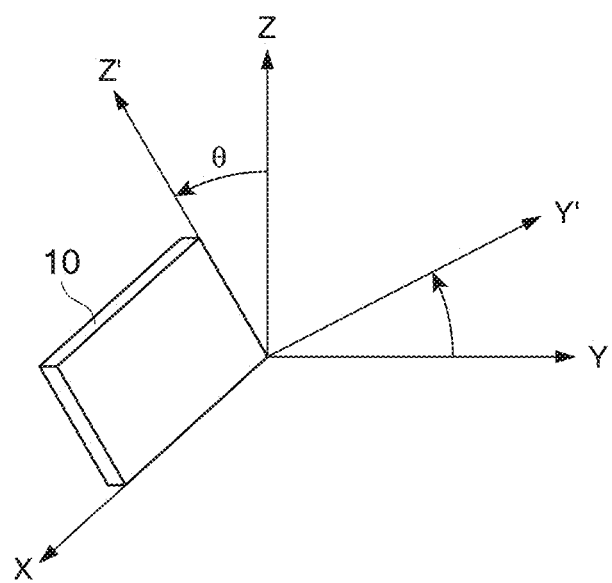
FIG. 2 is a diagram illustrating the relation between an AT-cut quartz crystal substrate and crystal axes thereof.

Hereinafter, embodiments of the invention will be described in detail with reference to the drawings.

First Embodiment of Vibrating Element

FIGS. 1A to 1F are schematic views illustrating the configuration of a piezoelectric vibrating element according to a first embodiment of a vibrating element of the invention. FIG. 1A is a plan view, FIG. 1B is a cross-sectional view of a P-P cross-section as seen from a positive X-axis direction, FIG. 1C is a cross-sectional view of a Q-Q cross-section as seen from a positive Z'-axis direction, and FIGS. 1D, 1E, and 1F are cross-sectional views of the Q-Q cross-section as seen from the positive Z'-axis direction, illustrating a slit shape according to a modification example.

The piezoelectric vibrating element 1 includes a piezoelectric substrate 10 as a substrate including a planar thin-walled vibrating portion 12 (hereinafter referred to as a vibrating portion 12) having a thin-walled vibrating region and a thick-walled portion 13 that is continuous with the vibrating portion 12, excitation electrodes 25a and 25b formed on both principal surfaces of the vibrating portion 12 so as to face each other, lead electrodes 27a and 27b that respectively extend from the excitation electrodes 25a and 25b toward the thick-walled portion 13, and pad electrodes 29a and 29b that are respectively connected to the terminating ends of the lead electrodes 27a and 27b.

Here, both principal surfaces mean a combination of a principal surface (also referred to as a front surface) and a principal surface (also referred to as a rear surface or the other principal surface) on the rear side of the principal surface. Moreover, the vibrating region is a region where vibration energy is confined, that is, a region on an inner side of a region where vibration energy amounts to approximately zero. The ratio of the dimension of the vibrating region in the X-axis direction to the dimension of the vibrating region in the Z'-axis direction is 1.26:1 as is widely known. Moreover, the vibrating portion 12 means a thin-walled portion including the vibrating region and a peripheral portion thereof.

The piezoelectric substrate 10 has a rectangular shape and includes the vibrating portion 12 and the thick-walled portion 13 having an annular quadrangular shape and a thickness greater than that of the vibrating portion 12, integrated with the vibrating portion 12 along the four sides of the peripheral edge (outer edge) of the vibrating portion 12. That is, the thick-walled portion 13 is formed so as to protrude any of both principal surfaces of the vibrating portion 12.

The thick-walled portion 13 includes a first thick-walled portion 16, a second thick-walled portion 17, a third thick-walled portion 15, and a fourth thick-walled portion 14.

The first and second thick-walled portions 16 and 17 are formed along a side 12c as a first outer edge and a side 12d as a second outer edge, facing each other with the vibrating portion 12 interposed, respectively. The fourth and third thick-walled portions 14 and 15 are formed along a side 12a as a fourth outer edge and a side 12b as a third outer edge, facing each other with the vibrating portion 12 interposed, respectively.

The two sets of sides 12c and 12d and sides 12a and 12b facing each other are disposed approximately parallel to each other with the vibrating portion 12 interposed.

The fourth thick-walled portion 14 protrudes from both principal surfaces while extending along the side 12a of the vibrating portion 12 between one set of other ends of the first and second thick-walled portions 16 and 17. That is, the fourth thick-walled portion 14 is formed on the negative X-axis side of the vibrating portion 12. Moreover, the fourth thick-walled portion 14 includes a fourth slope portion 14b having a thickness that gradually increases as the slope portion 14b proceeds from one edge continuous with the side 12a of the vibrating portion 12 toward the other edge on the negative X-axis side and a fourth thick-walled body 14a having a thick-walled quadrangular prism shape continuous with the other edge of the fourth slope portion 14b. That is, as illustrated in FIG. 1C, the fourth thick-walled portion 14 protrudes from both principal surfaces (front and rear surfaces) of the vibrating portion 12.

Similarly, the third thick-walled portion 15 protrudes from both principal surfaces while extending along the side 12b of the vibrating portion 12 between one set of ends of the first and second thick-walled portions 16 and 17. That is, the third thick-walled portion 15 is formed on the positive X-axis side of the vibrating portion 12. The third thick-walled portion 15 includes a third slope portion 15b having a thickness that gradually increases as the third slope portion 15b proceeds from one edge continuous with the side 12b of the vibrating portion 12 toward the other edge on the positive X-axis side and a third thick-walled body 15a having a thick-walled quadrangular prism shape continuous with the other edge of the third slope portion 15b. That is, as illustrated in FIG. 1C, the third thick-walled portion 15 protrudes from both principal surfaces (front and rear surfaces) of the vibrating portion 12.

The thick-walled bodies (the fourth and third thick-walled bodies 14a and 15a and the like) mean a region having a constant thickness approximately parallel to the Y'-axis.

The first thick-walled portion 16 protrudes from a principal surface along the side 12c of the vibrating portion 12. That is, the first thick-walled portion 16 is formed on the positive Z'-axis side of the vibrating portion 12 on the front surface side. Moreover, the first thick-walled portion 16 includes a first slope portion 16b having a thickness that gradually increases as the slope portion 16b proceeds from one edge continuous with the side 12c of the vibrating portion 12 toward the other edge on the positive Z'-axis side and a first thick-walled body 16a having a thick-walled quadrangular prism shape continuous with the other edge of the first slope portion 16b. That is, a principal surface of the first thick-walled portion 16 protrudes from a principal surface (front surface) of the vibrating portion 12. Moreover, the other principal surface of the first thick-walled portion 16 and the other principal surface (a principal surface on the rear side of the principal surface) of the vibrating portion 12 are continuously connected and form the same surface. Even when an energy confining region having a mesa shape protrudes from the vibrating region, the principal surface of the peripheral portion of the vibrating region and the other principal surface of the first thick-walled portion 16 may be continuously connected and form the same surface.

In this embodiment, it is preferable that the other principal surface of the first thick-walled portion 16 and the other principal surface of the vibrating portion 12 are continuously connected to form the same surface. However, the other principal surface of the first thick-walled portion 16 may protrude from the other principal surface of the vibrating portion 12 to a small extent such that the effect of an etching residue on the vibrating portion 12 is small, that is, the effective area of the vibrating region of the vibrating portion 12 is not affected.

The second thick-walled portion 17 protrudes from a principal surface on the rear side of the principal surface while extending along the side 12d of the vibrating portion 12. That is, the second thick-walled portion 17 is formed on the negative Z'-axis side of the vibrating portion 12 on the rear surface side. Moreover, the second thick-walled portion 17 includes a second slope portion 17b having a thickness that gradually increases as the second slope portion 17b proceeds from one edge continuous with the side 12d of the vibrating portion 12 toward the other edge on the negative Z'-axis side and a second thick-walled body 17a having a thick-walled quadrangular prism shape continuous with the other edge of the second slope portion 17b. That is, a principal surface of the second thick-walled portion 17 protrudes from the other principal surface (rear surface) of the vibrating portion 12, and the second thick-walled portion 17 connects the other ends of the fourth and third thick-walled portions 14 and 15 on the rear surface side of the vibrating portion 12. Moreover, the other principal surface of the second thick-walled portion 17 and a principal surface of the vibrating portion 12 are continuously connected and form the same surface. Even when an energy confining region having a mesa shape protrudes from the vibrating region, the principal surface of the peripheral portion of the vibrating region and the other principal surface of the second thick-walled portion 17 may be continuously connected and form the same surface.

In this embodiment, it is preferable that the other principal surface of the second thick-walled portion 17 and the other principal surface of the vibrating portion 12 are continuously connected to form the same surface. However, the other principal surface of the second thick-walled portion 17 may protrude from the other principal surface of the vibrating portion 12 to a small extent such that the effect of an etching residue on the vibrating portion 12 is small, that is, the effective area of the vibrating region of the vibrating portion 12 is not affected.

The first and second thick-walled portions 16 and 17 are in point-symmetry with respect to the center of the vibrating portion 12 as illustrated in FIG. 1B. Moreover, one set of surfaces (front surfaces) of the fourth and third thick-walled bodies 14a and 15a and one surface (front surface) of the first thick-walled body 16a are on the same plane, and one set of surfaces (rear surfaces) of the fourth and third thick-walled bodies 14a and 15a and a surface (rear surface) of the second thick-walled body 17a are on the same plane. Moreover, the respective end portions of the first, second, third, and fourth thick-walled portions 16, 17, 15, and 14 are connected to form an annular quadrangular shape, and the vibrating portion 12 is held at the central portion of the annular quadrangular shape.

The four sides of the periphery of the vibrating portion 12 having an approximately quadrangular shape are surrounded by the first, second, third, and fourth thick-walled portions 16, 17, 15, and 14. That is, etching is performed so as to progress from both principal surfaces of the piezoelectric substrate 10 having a rectangular planar shape to thereby form two depressed portions facing both principal surfaces. After that, unnecessary portions are cut and remove to realize miniaturization, whereby the thin-walled vibrating portion 12 is formed.

Further, the piezoelectric substrate 10 includes at least one stress-mitigating slit 20 which penetrates through the third thick-walled portion 15. In the embodiment illustrated in FIGS. 1A to 1F, the slit 20 is formed in the plane of the third thick-walled body 15a along a boundary portion (connecting portion) between the third slope portion 15b and the third thick-walled body 15a separated from the side 12b of the vibrating portion 12.

As above, since the slit 20 is disposed so as to be separated from the side 12b of the vibrating portion 12, it is easy to form the slit. Further, since the slit 20 is disposed closely to the boundary portion (connecting portion) of the third thick-walled body 15a, it is possible to secure a large area for a supported portion (pad electrode) 29a of the third thick-walled body 15a and to increase the diameter of a conductive adhesive to be applied. In contrast, if the slit 20 is disposed closely to the supported portion (pad electrode) 29a of the third thick-walled body 15a, the area of the supported portion (pad electrode) 29a decreases, and the diameter of a conductive adhesive needs to be decreased. As a result, an absolute amount of conductive filler contained in the conductive adhesive also decreases so that conductive properties are degraded. Thus, there is a problem in that the resonance frequency of the piezoelectric vibrating element 1 becomes unstable, and frequency variation (commonly known as frequency fluctuation) is likely to occur.

Therefore, it is preferable that the slit 20 is disposed closely to the boundary portion (connecting portion) of the third thick-walled body 15a.

The slit 20 is not limited to a penetrating slit as illustrated in FIG. 1C but may be a groove-shaped slit having a bottom portion. The groove-shaped slit may have two slits formed on both front and rear surface sides of the third thick-walled portion 15, respectively, for example. Specifically, as illustrated in FIG. 1D, the groove-shaped slit may include a first bottomed slit 20a' formed on the rear surface side of the third thick-walled portion 15 and a second bottomed slit 20b' formed on the front surface side of the third thick-walled portion 15. Moreover, as illustrated in FIG. 1E, the slit 20 may be configured as a third bottomed slit 20c' formed on the rear surface side of the third thick-walled portion 15. Further, as illustrated in FIG. 1F, the slit 20 may be configured as a fourth bottomed slit 20d' formed on the front surface side of the third thick-walled portion 15.

Moreover, the slit according to the embodiment of the invention is surrounded by the third thick-walled portion 15 in a plan view thereof. When the slit is a bottomed groove-shaped slit as illustrated in FIGS. 1D to 1F, the bottom portion of the slit may be thicker or thinner than the vibrating portion.

The shape of the slit 20 described herein may be applied to other embodiments, modification examples, and application examples described later.

The piezoelectric substrate 10 is formed of a piezoelectric material such as a quartz crystal which belongs to a trigonal system. As illustrated in FIG. 2, an example of the piezoelectric substrate 10 is a rotated Y-cut quartz crystal substrate in which in an orthogonal coordinate system made up of an X-axis (electrical axis), a Y-axis (mechanical axis), and a Z-axis (optical axis), an axis obtained by tilting the Z-axis in the negative Y-axis direction about the X-axis is defined as a Z'-axis, an axis obtained by tilting the Y-axis in the positive Z-axis direction is defined as a Y'-axis, the substrate is formed on a plane parallel to the X-axis and the Z'-axis, and a direction parallel to the Y'-axis is defined as a thickness direction. In this embodiment, an AT-cut quartz crystal substrate which is an example of the rotated Y-cut quartz crystal substrate will be described.

The AT-cut quartz crystal substrate is a flat plane cut from a quartz crystal along a plane obtained by rotating an XZ-plane around the X-axis by an angle $\theta$ as illustrated in FIG. 2. The angle $\theta$ is approximately 35° 15' in the case of the AT-cut quartz crystal substrate. The axes obtained by rotating the Y and Z-axes around the X-axis by an angle $\theta$ are defined as Y' and Z'-axes, respectively. Thus, the AT-cut quartz crystal substrate has orthogonal crystal axes X, Y', and Z'. In the AT-cut quartz crystal substrate, the thickness direction is the Y'-axis, the XZ'-plane (a plane including the X and Z'-axes) orthogonal to the Y'-axis is a principal surface thereof, and thickness-shear vibration is excited as main vibration.

The piezoelectric substrate according to the embodiment of the invention is not limited to an AT-cut substrate in which the angle $\theta$ is approximately 35° 15', but naturally, the invention can be broadly applied to piezoelectric substrates, such as BT-cut that excites thickness-shear vibration.

As illustrated in FIG. 1A, the piezoelectric substrate 10 has a rectangular shape in which a direction parallel to the Y'-axis (hereinafter referred to as a "Y'-axis direction") is a thickness direction, a direction parallel to the X-axis (hereinafter referred to as an "X-axis direction") is a long side, and a direction parallel to the Z'-axis (hereinafter referred to as a "Z'-axis direction") is a short side.

The excitation electrodes 25a and 25b that drive the piezoelectric substrate 10 have a quadrangular shape in the embodiment illustrated in FIGS. 1A to 1F, and are formed on both front and rear surfaces at approximately the central portion of the vibrating portion 12 so as to face each other. As illustrated in FIG. 1B, the area of the excitation electrode 25b on the rear surface side is sufficiently larger than the area of the excitation electrode 25a on the front surface side. This is to prevent an energy-confining coefficient due to the mass effect of an excitation electrode from increasing more than necessary. That is, when the area of the excitation electrode 25b on the rear surface side is sufficiently large, a plate back amount $\Delta$ (=(fs−fe)/fs, where "fs" is a cut-off frequency of a piezoelectric substrate, and "fe" is a frequency when an excitation electrode is attached to the entire surface of the piezoelectric substrate) depends on only the mass effect of the excitation electrode 25a on the front surface side.

The excitation electrodes 25a and 25b are formed by depositing nickel (Ni) on a base and depositing gold (Au) thereon in a superimposed manner using a deposition apparatus or a sputtering apparatus. The thickness of gold (Au) is preferably controlled within a range where ohmic loss does not increase so that only a main vibration mode is in a confining mode (S0), and oblique inharmonic modes (A0, A1, ...) and symmetrical inharmonic modes (S1, S3, ...) are not in the confining mode. However, in a 490 MHz band piezoelectric vibrating element, for example, when deposition is performed so as to prevent ohmic loss due to the electrode thickness, a little confinement of low-order inharmonic modes is inevitable.

The excitation electrode 25a on the front surface side is electrically connected to the pad electrode 29a formed on the front surface of the third thick-walled body 15a by the lead electrode 27a which extends from the vibrating portion 12 to the front surface of the third thick-walled body 15a via the front surfaces of the first slope portion 16b and the first thick-walled body 16a. Moreover, the excitation electrode 25b on the rear surface side is electrically connected to the pad electrode 29b formed on the rear surface of the third thick-walled body 15a by the lead electrode 27b which extends from the vibrating portion 12 to the rear surface of the third thick-walled body 15a via the front surfaces of the second slope portion 17b and the second thick-walled body 17a.

The embodiment illustrated in FIG. 1A is an example of a lead-out structure of the lead electrodes 27a and 27b, and the lead electrode 27a may be led out via other supporting portion. However, the lead electrodes 27a and 27b is preferably as short as possible, and it is preferable to suppress an increase in electrostatic capacitance by making an arrangement so that the lead electrodes 27a and 27b do not cross each other. An increase in electrostatic capacitance may degrade a capacitance ratio γ of the piezoelectric vibrating element 1 (the capacitor ratio is the ratio of a parallel capacitance (electrostatic capacitor) C0 to a series capacitor (motional capacitor) C1).

Moreover, in the embodiment of FIGS. 1A to 1F, an example in which the pad electrode 29a and 29b are formed closely to both front and rear surfaces of the piezoelectric substrate 10, respectively, has been illustrated. When the piezoelectric vibrating element 1 is accommodated in a package, the piezoelectric vibrating element 1 is reversed, the pad electrode 29a is fixed, and the pad electrode 29b and the electrode terminal of the package are connected by bonding wire. In this way, when the piezoelectric vibrating element 1 is supported at one point, it is possible to decrease the stress resulting from a conductive adhesive.

Moreover, the pad electrodes 29a and 29b of the piezoelectric vibrating element 1 may be formed at a larger gap than the example described above.

The reason why the slit 20 is formed between the vibrating portion 12 and the pad electrodes 29a and 29b which are the supported portions of the piezoelectric vibrating element 1 is to prevent spreading of the stress occurring when a conductive adhesive is hardened.

That is, when the pad electrodes 29a and 29b of the piezoelectric vibrating element 1 are supported on a package using a conductive adhesive, first, a conductive adhesive is applied to the supported portion (pad electrode) 29a of the third thick-walled body 15a. After that, the piezoelectric vibrating element 1 is reversed so that the supported portion 29a is placed on an element-mounting pad of the package or the like and pressed lightly. In order to harden the conductive adhesive, the piezoelectric vibrating element 1 is held in a high-temperature furnace for a predetermined period. In a high-temperature state, both the third thick-walled body 15a and the package expand, and the adhesive also softens temporarily. Thus, no stress occurs in the supported portion (pad electrode) 29a. After the conductive adhesive is hardened, the third thick-walled body 15a and the package are cooled. When the temperature returns to the room temperature (25° C.), the stress occurring from the hardened conductive adhesive is transmitted to the supported portion (pad electrode) 29a due to a difference between the linear expansion coefficients of the conductive adhesive, the package, and the third thick-walled body 15a. The stress further spreads from the third thick-walled body 15a to the fourth thick-walled portion 14, the first thick-walled portion 16, and the vibrating portion 12. The stress-mitigating slit 20 is formed in order to prevent spreading of the stress.

The relation between the formation portion of the slit 20 and the stress (∝ strain) occurring in the piezoelectric substrate 10 is generally analyzed by a simulation using the finite element method. The smaller the stress in the vibrating portion 12, the more excellent the frequency-temperature characteristics, the frequency reproducibility, and the frequency-aging characteristics the piezoelectric vibrating element has.

Examples of the conductive adhesive include a silicone-based adhesive, an epoxy-based adhesive, a polyimide-based adhesive, and a bismaleimide-based adhesive. Among these examples, a polyimide-based conductive adhesive is used taking a frequency-aging variation due to outgassing of the piezoelectric vibrating element 1 into consideration. Since a polyimide-based conductive adhesive is hard, by supporting the piezoelectric vibrating element 1 in one position, it is possible to further decrease the magnitude of the occurring stress than supporting the same at two separate positions. The one-point mounting method is used in the piezoelectric vibrating element 1 for targeting 490 MHz-band voltage-controlled piezoelectric oscillators (VCXO: Voltage Controlled Crystal Oscillator).

That is, a conductive adhesive is applied to the pad electrode 29a, and the piezoelectric vibrating element 1 is reversed. The pad electrode 29a is placed on the element-mounting pad of an accommodating package, is dried and fixed and connected to the element-mounting pad. The other pad electrode 29b is electrically connected to the element-mounting pad using bonding wire. As illustrated in FIG. 1A, since the pad electrodes 29a and 29b are formed so as to approximately face each other, one-point mounting is realized.

The piezoelectric substrate 10 illustrated in FIGS. 1A to 1F is a so-called X-long piezoelectric substrate in which the length in the X-axis direction is larger than the length in the Z'-axis direction. As is widely known, this is because a smaller frequency variation occurs when force is applied to both ends in the Z'-axis direction of the AT-cut quartz crystal substrate as compared to a frequency variation when the same force is applied to both ends in the X-axis direction of the AT-cut quartz crystal substrate. That is, as for the piezoelectric vibrating element, it is preferable to provide a supporting point along the Z'-axis direction since the frequency variation due to the stress can be suppressed.

Moreover, in the embodiment illustrated in FIGS. 1A to 1F, although the thin-walled vibrating portion 12 has a rectangular shape, both corner portions corresponding to both end portions of the side 12c of the thin-walled vibrating portion 12 connected to the first thick-walled portion 16 may be chamfered.

In the embodiment of FIGS. 1A to 1F, although a quadrangular shape, that is, a square shape or a rectangular shape (that is, long in the X-axis direction) has been exemplified as the shape of the excitation electrodes 25a and 25b, the excitation electrode used in the piezoelectric vibrating element 1 of the embodiment of the invention is not limited to this.

Figure 3:
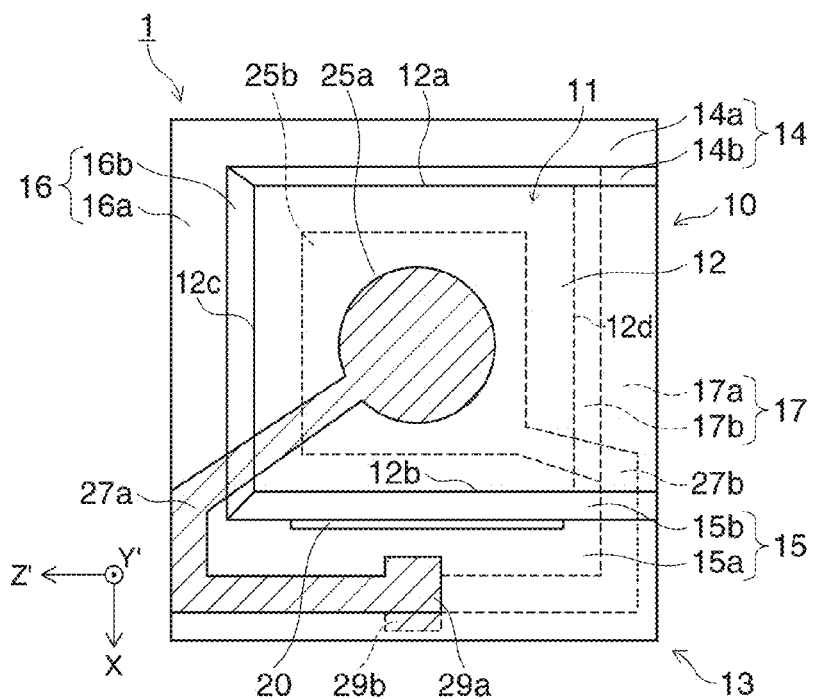
FIG. 3 is a plan view illustrating a modification example of the piezoelectric vibrating element of the first embodiment.

In an embodiment illustrated in FIG. 3, the excitation electrode 25a on the front surface side of the drawing has a circular shape, and the excitation electrode 25b on the rear surface side of the drawing has a quadrangular shape sufficiently larger than the excitation electrode 25a. The excitation electrode 25b on the rear surface side may have a sufficiently large circular shape.

Figure 4:
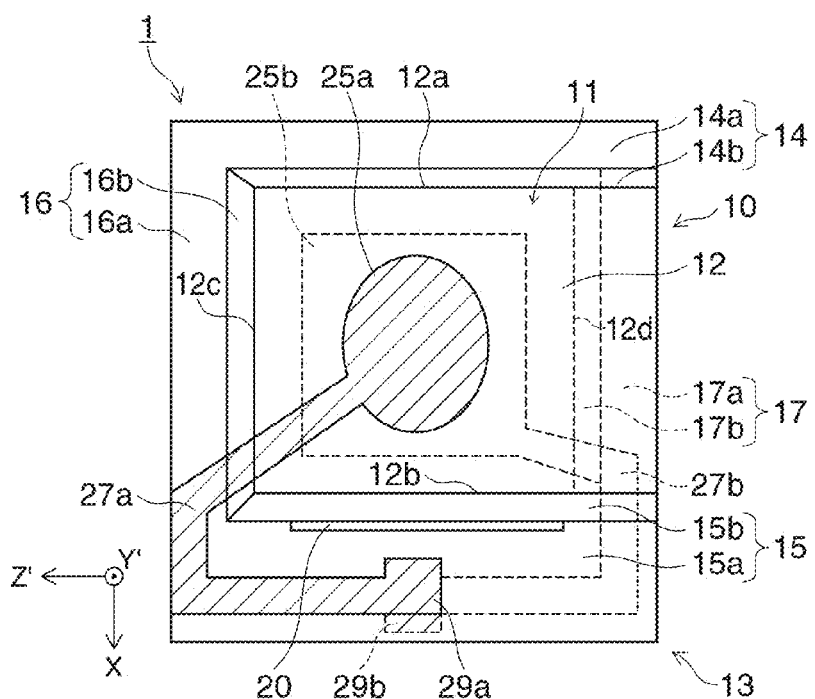
FIG. 4 is a plan view illustrating another modification example of the piezoelectric vibrating element of the first embodiment.

In an embodiment illustrated in FIG. 4, the excitation electrode 25a on the front surface side of the drawing has an elliptical shape, and the excitation electrode 25b on the rear surface side of the drawing has a quadrangular shape sufficiently larger than the excitation electrode 25a. Due to the elastic constant anisotropy, a displacement distribution in the X-axis direction is different from a displacement distribution in the Z'-axis direction. A cut surface of the displacement distribution cut along a plane parallel to the X-Z'-plane has an elliptical shape. Thus, the piezoelectric vibrating element 1 can be driven most efficiently when the excitation electrode 25a having an elliptical shape is used. That is, it is possible to minimize the capacitance ratio γ (=C0/C1, where C0 is electrostatic capacitance and C1 is series resonance capacitance) of the piezoelectric vibrating element 1.

Moreover, the excitation electrode 25a may have an oval shape.

Second embodiment of Vibrating Element

FIGS. 5A to 5C are schematic views illustrating the structure of a piezoelectric vibrating element 2 according to a second embodiment. FIG. 5A is a plan view of the piezoelectric vibrating element 2, FIG. 5B is a cross-sectional view of a P-P cross-section as seen from the positive X-axis direction, and FIG. 5C is a cross-sectional view of a Q-Q cross-section as seen from the positive Z'-axis direction.

The piezoelectric vibrating element 2 is different from the piezoelectric vibrating element 1 illustrated in FIGS. 1A to 1F in that the stress-mitigating slit 20 is formed at a different position. In this embodiment the slit 20 is formed in the third slope portion 15b that is, separated from the side 12b of the thin-walled vibrating portion 12. Unlike the piezoelectric vibrating element 1, the slit 20 is formed so as to be separated from both edges of the third slope portion 15b rather than forming the slit 20 in the third slope portion 15b along the side 12b of the vibrating portion 12 so that one edge of the slit 20 is in contact with the side 12b. That is, an ultra-narrow slope portion 15b' that is, connected to the side 12b of the vibrating portion 12 is left in the third slope portion 15b. In other words, the ultra-narrow slope portion 15b' is formed between the side 12b and the slit 20.

The reason why the ultra-narrow slope portion 15b' is left is as follows. When the excitation electrodes 25a and 25b are formed in the vibrating portion 12 and are excited by applying a high-frequency voltage, inharmonic modes (A0, S1, A1, S2, . . . ) are excited in addition to the main vibration mode (S0). It is preferable that only the main vibration mode (S0) is in the confining mode, and the other inharmonic modes are in a propagating mode (non-confining mode). However, if the vibrating portion 12 is made thin and the fundamental frequency is several hundreds of MHz, it is necessary to increase the thickness of the excitation electrodes 25a and 25b to a predetermined thickness or more in order to prevent ohmic loss of an electrode film. Thus, the plate back amount increases, and an inharmonic mode adjacent to the main vibration mode becomes an energy confining mode. The magnitude (proportional to the CI value) of the amplitude of the low-order inharmonic mode can be suppressed by preventing the occurrence of standing waves in the inharmonic mode. That is, the shapes both edges in the Z'-axis direction of the vibrating portion 12 of FIGS. 5A to 5C are in point-symmetry with respect to the center of the vibrating portion 12 as illustrated in FIG. 5B, and the shapes both edges in the X-axis direction are asymmetrical due to the presence of the ultra-narrow slope portion 15b'. Thus, it is possible to suppress the amplitude of standing waves in the low-order inharmonic mode.

Third Embodiment of Vibrating Element

FIGS. 6A to 6C are schematic views illustrating the structure of a piezoelectric vibrating element 3 according to a third embodiment. FIG. 6A is a plan view of the piezoelectric vibrating element 3, FIG. 6B is a cross-sectional view of a P-P cross-section as seen from the positive X-axis direction, and FIG. 6C is a cross-sectional view of a Q-Q cross-section as seen from the positive Z'-axis direction.

The piezoelectric vibrating element 3 is different from the piezoelectric vibrating element 1 illustrated in FIGS. 1A to 1F in that two stress-mitigating slits 20a and 20b are formed in parallel in the third thick-walled portion 15. That is, the first slit 20a is formed in the plane of the third thick-walled body 15a, and the second slit 20b is formed in the plane of the third slope portion 15b.

By forming individual slits in the plane of the third thick-walled body 15a and the plane of the third slope portion 15b, respectively, it is possible to better suppress spreading of the stress occurring when bonding or fixing the piezoelectric vibrating element 3. Thus, it is possible to obtain the piezoelectric vibrating element 3 having excellent frequency reproducibility, frequency-temperature characteristics, CI-temperature characteristics, and frequency-aging characteristics.

Figure 7A:
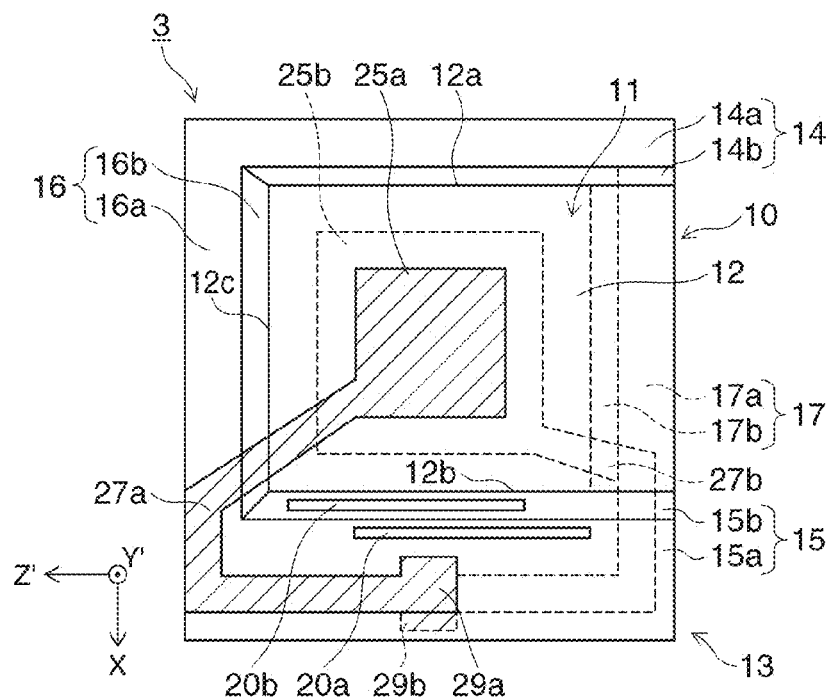
FIGS. 7A and 7B are plan views illustrating the configuration of a modification example of the third embodiment.
Figure 7B:
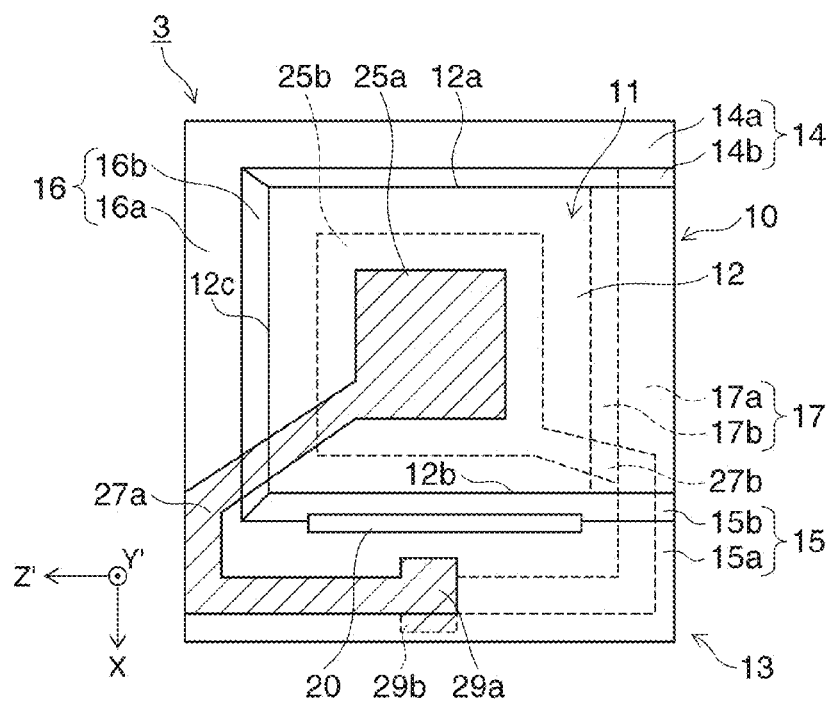

The first and second slits 20a and 20b may be disposed so as to be shifted from each other in the Z'-axis direction as illustrated by the plan view in FIG. 7A rather than just disposing the same in parallel to each other in the X-axis direction as illustrated by the plan view in FIG. 6A. According to the piezoelectric vibrating element 3 having two slits 20a and 20b, it is possible to enhance the advantage of suppressing the stress occurring due to the conductive adhesive from spreading to the vibrating portion 12. Moreover, the piezoelectric vibrating element 3 of a modification example illustrated in FIG. 7B has a configuration in which the slit 20 extends over the third slope portion 15b and the third thick-walled body 15a so that the advantages of the slits 20, 20a, and 20b illustrated respectively in FIGS. 1A to 1F and FIGS. 6A to 6C are achieved.

Fourth Embodiment of Vibrating Element

FIGS. 8A to 8F are schematic views illustrating the structure of a piezoelectric vibrating element 4 according to a fourth embodiment. FIG. 8A is a plan view of the piezoelectric vibrating element 4, FIG. 8B is a cross-sectional view of a P-P cross-section as seen from a positive X-axis direction, and FIG. 8C is a cross-sectional view of a Q-Q cross-section as seen from a positive Z'-axis direction.

The piezoelectric vibrating element 4 includes a piezoelectric substrate 10 including a vibrating portion 12 having a thin-walled rectangular vibrating region and a thick-walled portion 13 having a thickness greater than that of the vibrating portion 12, integrated with the vibrating portion 12, excitation electrodes 25a and 25b formed on the front and rear surfaces (both principal surfaces) of the vibrating portion 12, respectively, and lead electrodes 27a and 27b that respectively extend from the excitation electrodes 25a and 25b toward pad electrodes 29a and 29b formed in respective thick-walled portions 13.

The thick-walled portion 13 includes a third thick-walled portion 15 that extends along a side 12a of the vibrating portion 12 and protrudes from both principal surfaces and a first thick-walled portion 16 that extends along a side 12b continuous with one end portion of the side 12a of the vibrating portion 12 and is continuous with one end portion of the third thick-walled portion 15 on a principal surface side (front surface side) of the vibrating portion 12. Further, the thick-walled portion 13 includes a second thick-walled portion 17 that extends along a side 12c continuous with the other end portion of the side 12a of the vibrating portion 12 and bis continuous with the other end portion of the third thick-walled portion 15 on the other principal surface side (rear surface side) of the vibrating portion 12. That is, the piezoelectric substrate 10 includes an integrated thick-walled portions 13 (first, second, and third thick-walled portions 16, 17, and 15) that extends along three sides 12*a*, 12*b*, and 12*c* of the vibrating portion 12, and the first and second thick-walled portions 16 and 17 are in point-symmetry with respect to the center of the vibrating portion 12. The two sides 12*b* and 12*c* face each other and are disposed approximately in parallel to each other with the vibrating portion 12 interposed.

A principal surface of the first thick-walled portion 16 protrudes from a principal surface (front surface) of the vibrating portion 12. Moreover, the other principal surface of the first thick-walled portion 16 and the other principal surface of the vibrating portion 12 are continuously connected and form the same surface.

A principal surface of the second thick-walled portion 17 protrudes from the other principal surface (rear surface) of the vibrating portion 12. Moreover, the other principal surface of the second thick-walled portion 17 and a principal surface of the vibrating portion 12 are continuously connected and form the same surface.

Even when an energy confining region having a mesa shape protrudes from the vibrating region, the principal surface of the peripheral portion of the vibrating region and the other principal surface of the second thick-walled portion 17 may be continuously connected and form the same surface.

The third thick-walled portion 15 includes a third slope portion 15*b* continuous with the side 12*a* of the vibrating portion 12 and having a thickness that gradually increases as the third slope portion 15*b* proceeds from one edge (inner edge) connected to the side 12*a* of the vibrating portion 12 toward the other edge (outer edge) and a third thick-walled portion 15*a* having a thick-walled quadrangular prism shape continuous with the other edge (outer edge) of the third slope portion 15*b*.

Similarly, the first thick-walled portion 16 includes a first slope portion 16*b* continuous with the side 12*b* of the vibrating portion 12 and having a thickness that gradually increases as the first slope portion 16*b* proceeds from one edge (inner edge) connected to the side 12*b* of the vibrating portion 12 toward the other edge (outer edge) and a first thick-walled body 16*a* having a thick-walled quadrangular prism shape continuous with the other edge (outer edge) of the first slope portion 16*b*.

Moreover, the second thick-walled portion 17 includes a second slope portion 17*b* continuous with the side 12*c* of the vibrating portion 12 and having a thickness that gradually increases as the second slope portion 17*b* proceeds from one edge (inner edge) connected to the side 12*c* of the vibrating portion 12 toward the other edge (outer edge) and second thick-walled body 17*a* having a thick-walled quadrangular prism shape continuous with the other edge (outer edge) of the second slope portion 17*b*.

At least one slit 20 penetrates through the third thick-walled portion 15.

One set of surfaces (front surfaces) of the third and first thick-walled portions 15 and 16 are on the same plane, that is, on the X-Z' plane of the coordinate axes illustrated in FIGS. 8A to 8F. The other surface (rear surface) of the third thick-walled portion 15 and the rear surface of the second thick-walled portion 17 are on the same plane (the X-Z' plane).

In other words, the other principal surface (rear surface) of the vibrating portion 12 and the other surface (rear surface) of the first thick-walled portion 16 are on the same plane, and a principal surface (front surface) of the vibrating portion 12 and the other surface (front surface) of the second thick-walled portion 17 are on the same plane. That is, an unnecessary thick-walled portion is reduced.

Moreover, the third thick-walled portion 15 protrudes from the front and rear surfaces (both surfaces) of the vibrating portion 12. Moreover, the first and second thick-walled portions 16 and 17 protrude from only one surface of the piezoelectric substrate so as to be in point-symmetry with respect to the center of the vibrating portion 12 as illustrated in FIG. 8B.

At least one stress-mitigating slit 20 penetrates through the third thick-walled portion 15 so as to extend along the Z'-axis direction between the vibrating portion 12 and the pad electrodes 29*a* and 29*b* which are supported portions. In the embodiment illustrated in FIGS. 8A to 8F, the slit 20 is formed in the third thick-walled body 15*a* along the boundary portion (connecting portion) between the third slope portion 15*b* and the third thick-walled body 15*a*.

The thick-walled bodies (15*a*, 16*a*, and 17*a*) mean a region having a constant thickness in the Y'-axis direction.

The slit 20 is not limited to a penetrating slit as illustrated in FIG. 8C but may be a groove-shaped slit having a bottom portion. The groove-shaped slit may have two slits formed on both front and rear surface sides of the third thick-walled portion 15, respectively, for example. Specifically, as illustrated in FIG. 8D, the groove-shaped slit may include a first bottomed slit 20*a*' formed on the front surface side of the third thick-walled portion 15 and a second bottomed slit 20*b*' formed on the rear surface side of the third thick-walled portion 15. Moreover, as illustrated in FIG. 8E, the slit 20 may be configured as a third bottomed slit 20*c*' formed on the front surface side of the third thick-walled portion 15. Further, as illustrated in FIG. 8F, the slit 20 may be configured as a fourth bottomed slit 20*d*' formed on the rear surface side of the third thick-walled portion 15.

The shape of the slit 20 described herein may be applied to other embodiments, modification examples, and application examples described later.

The configuration of electrodes such as the excitation electrodes 25*a* and 25*b* and the lead electrodes 27*a* and 27*b* for driving the piezoelectric substrate 10 and the reason for providing the slit 20 are the same as those of the first embodiment, and description thereof will not be provided.

Figure 9A:
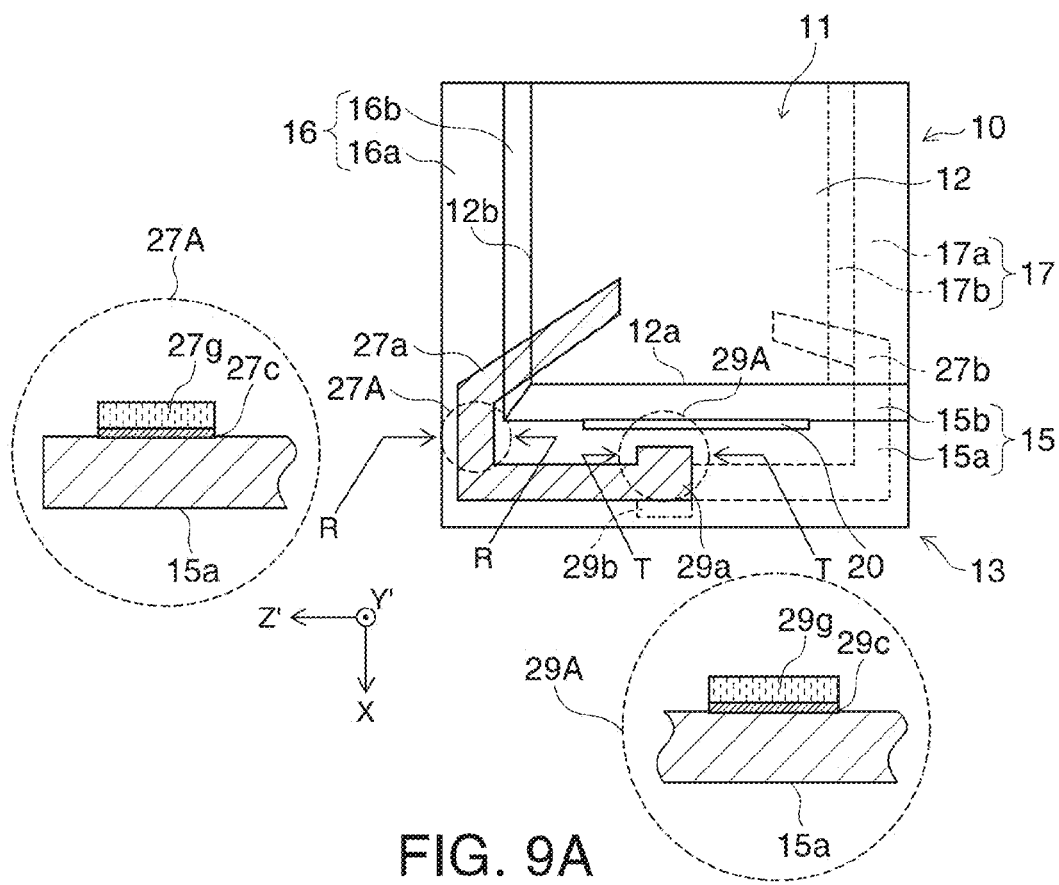
FIG. 9A is a plan view illustrating the configuration of a lead electrode and a pad electrode.
Figure 9B:
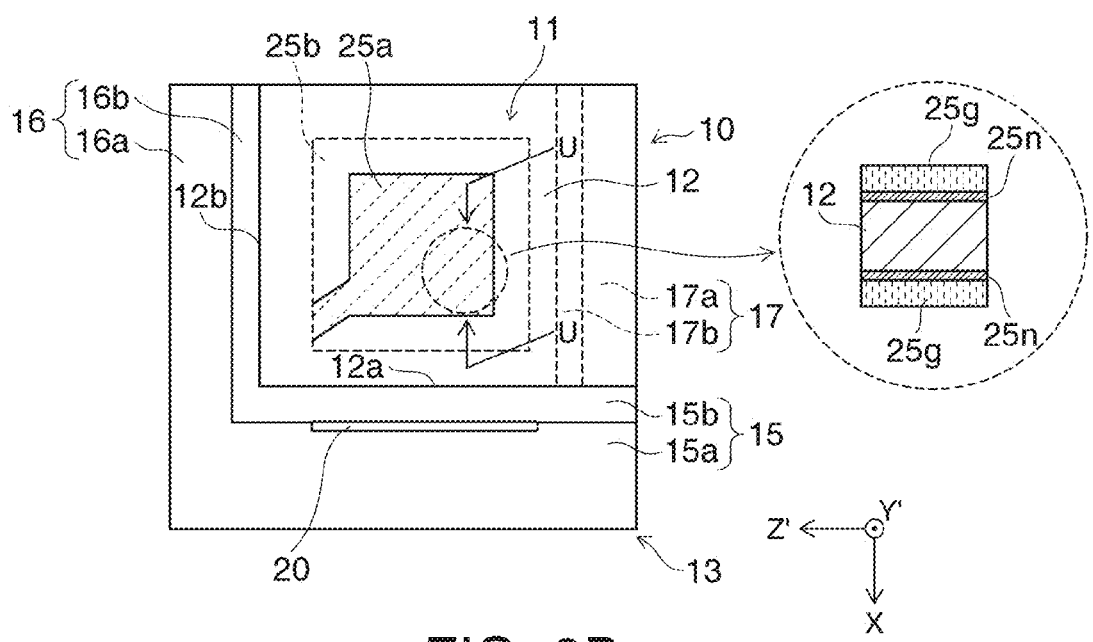
FIG. 9B is a plan view illustrating the configuration of an excitation electrode.

FIGS. 9A and 9B are plan views illustrating the constituent members of the piezoelectric vibrating element 4. FIG. 9A is a plan view illustrating the arrangement and the configuration of the lead electrodes 27*a* and 27*b* and the pad electrodes 29*a* and 29*b* formed on the piezoelectric substrate 10, and FIG. 9B is a plan view illustrating the arrangement and the configuration of the excitation electrodes 25*a* and 25*b*. The lead electrode 27*a* is formed so as to extend from an assumed edge of the excitation electrode 25*a* on the front surface side and to be connected to the pad electrode 29*a* formed on the front surface at the central portion of the third thick-walled portion 15 via the front surface of the first thick-walled portion 16. Moreover, the lead electrode 27*b* is formed so as to extend from an assumed edge of the excitation electrode 25*b* on the rear surface side and to be connected to the pad electrode 29*b* formed on the rear surface at the central portion of the third thick-walled portion 15 via the front surface of the second thick-walled portion 17 on the rear surface side.

The lead electrodes 27*a* and 27*b* include a first layer formed of a thin film of chromium (Cr) and a second layer formed of a thin film of gold (Au) stacked on the first layer. An enlarged cross-sectional view of a part of the lead electrode 27*a* taken along line R-R is illustrated within a broken-line circle 27A on the left side in FIG. 9A. The lead electrode 27*a* has a configuration in which a thin film 27*c* of chromium (Cr)

is formed on the front surface side (upper surface side) of the first and third thick-walled portions 16 and 15 as a base, and a thin film 27g of gold (Au) is stacked on the thin film 27c. The lead electrode 27b has the same configuration as the lead electrode 27a.

Moreover, the pad electrodes 29a and 29b formed on the front and rear surfaces at the central portion of the third thick-walled portion 15 include a first layer formed of a thin film of chromium (Cr) and a second layer formed of a thin film of gold (Au) stacked on the first layer. An enlarged cross-sectional view of a part of the pad electrode 29a taken along line T-T is illustrated within a broken-line circle 29A at the bottom in FIG. 9A. The pad electrode 29a has a configuration in which a thin film 29c of chromium (Cr) is formed on the front surface side (upper surface side) of the third thick-walled portion 15 as a base, and a thin film 29g of gold (Au) is stacked on the thin film 29c. The pad electrode 29b has the same configuration as the pad electrode 29a.

Since the lead electrodes 27a and 27b and the pad electrodes 29a and 29b are formed in the same step, the thin films 27c and 29c of chromium (Cr) on the first layer have a thickness of 100 Å (1 Å=0.1 nm (nanometer)), for example, and the thin films 27g and 29g of gold (Au) on the second layer have a thickness of 2000 Å, for example, that is, larger than the above thickness. Thus, ohmic loss of the lead electrodes 27a and 27b and the pad electrodes 29a and 29b does not occur, and the bonding strength is sufficient.

Another metal film may be interposed between the thin film of chromium (Cr) and the thin film of gold (Au).

FIG. 9B is a plan view illustrating the arrangement and configuration of the excitation electrodes 25a and 25b formed on the piezoelectric substrate 10 so as to match the lead electrodes 27a and 27b formed in the previous step. The excitation electrode 25a is formed on the front surface side of the piezoelectric substrate 10, and the excitation electrode 25b is formed on the rear surface side so as to occupy an area sufficiently larger than the area of the excitation electrode 25a so that the excitation electrode 25a fits within the area of the excitation electrode 25b. As an example, the excitation electrodes 25a and 25b include a first layer formed of a thin film of nickel (Ni) and a second layer formed of a thin film of gold (Au) stacked on the first layer. An enlarged cross-sectional view of a part of the excitation electrodes 25a and 25b taken along broken-line circle U-U is illustrated within a broken-line circle on the right side in FIG. 9B. A thin film 25n of nickel (Ni) is formed on the first layer on the front and rear surfaces of the vibrating portion 12, and a thin film 25g of gold (Au) is stacked on the second layer. The thin film 25n of nickel (Ni) on the first layer has a thickness of 70 Å, for example, and the thin film 25g of gold (Au) on the second layer has a thickness of 600 Å, for example.

Another metal film may be interposed between the thin film of nickel (Ni) and the thin film of gold (Au).

The reason why the lead electrodes 27a and 27b, the pad electrodes 29a and 29b, and the excitation electrodes 25a and 25b are formed of different electrode materials and have different film thicknesses will be described below. It is assumed that the fundamental frequency of the vibrating portion 12 of the piezoelectric substrate 10 is 490 MHz, for example. It is also assumed that the first and second layers of the lead electrodes 27a and 27b, the pad electrodes 29a and 29b, and the excitation electrodes 25a and 25b are formed of thin films of nickel (Ni) and gold (Au) having thicknesses of 70 Å and 600 Å, respectively, for example. The main vibration occurs sufficiently in the confining mode, and it is expected that the crystal impedance (CI; equivalent resistance) decreases. However, since the thickness of the thin film of gold (Au) of the lead electrodes 27a and 27b is small, there is a problem in that ohmic loss of the thin film occurs, and the CI value of the piezoelectric vibrating element 4 increases. Moreover, when the pad electrodes 29a and 29b include thin films of nickel (Ni) and gold (Au) having thicknesses of 70 Å and 600 Å, respectively, there is another problem in that the wire bonding strength becomes insufficient.

Moreover, when the first and second layers of the lead electrodes 27a and 27b, the pad electrodes 29a and 29b, and the excitation electrodes 25a and 25b are formed of thin films of chromium (Cr) (first layer) and gold (Au) (second layer) having respective thicknesses of 70 Å and 600 Å, there is another problem in that since the thin film of gold (Au) is thin, chromium (Cr) may diffuse into the thin film of gold (Au) as a result of heat, ohmic loss of the thin film occurs, and the CI value of the main vibration mode increases.

Therefore, the lead electrodes 27a and 27b, the pad electrodes 29a and 29b, and the excitation electrodes 25a and 25b were formed by separate steps, and the materials and the thicknesses of the electrode thin films were set so as to be optimal for the functions of the respective thin films. That is, the thicknesses of the excitation electrodes 25a and 25b were set to be low such that the thin film of nickel (Ni) has a thickness of 70 Å, and the thin film of gold (Au) has a thickness of 600 Å so that the main vibration mode is in the confining mode, and as much as possible, the adjacent inharmonic and overtone modes are in the propagating (non-confining) mode. On the other hand, the thicknesses of the lead electrodes 27a and 27b and the pad electrodes 29a and 29b were set to be large such that the thin film of chromium (Cr) has a thickness of 100 Å, and the thin film of gold (Au) has a thickness of 2000 Å so that the film resistance of the narrow lead electrode decreases, and the bonding strength increases.

The thicknesses described above are examples, and in the embodiment of the invention, are not limited to these numerical values but change in accordance with the frequency of the vibrating portion 12. However, it should be noted that the excitation electrodes 25a and 25b may be formed of stacked films of nickel (Ni) and gold (Au) having the optimum thicknesses by taking the energy confinement theory and ohmic loss of a thin film into consideration. Moreover, the lead electrodes 27a and 27b and the pad electrodes 29a and 29b may be formed of stacked films of chromium (Cr) and gold (Au) having necessary thicknesses by taking ohmic loss of a thin film and the bonding strength into consideration.

The method of manufacturing the excitation electrodes 25a and 25b, the lead electrodes 27a and 27b, and the pad electrodes 29a and 29b will be described later.

In the fourth embodiment illustrated in FIGS. 8A to 8F, although a quadrangular shape, that is, a square shape or a rectangular shape (that is, long in the X-axis direction) has been exemplified as the shape of the excitation electrodes 25a and 25b, the shape of the excitation electrode is not limited to this.

Figure 10:
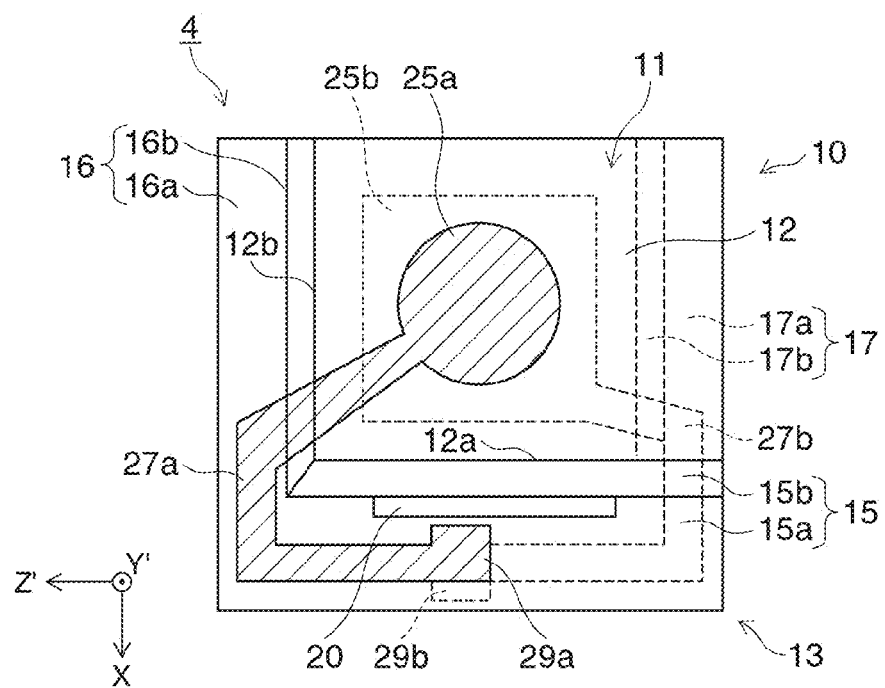
FIG. 10 is a plan view illustrating a modification example of the piezoelectric vibrating element of the fourth embodiment.

In an embodiment illustrated in FIG. 10, the excitation electrode 25a on the front surface side has a circular shape, and the excitation electrode 25b on the rear surface side is a quadrangular electrode having an area sufficiently larger than the excitation electrode 25a such that the excitation electrode 25a fits within the area of the excitation electrode 25b. Moreover, the excitation electrode 25b on the rear surface side may have a circular shape having a sufficiently large area.

Figure 11:
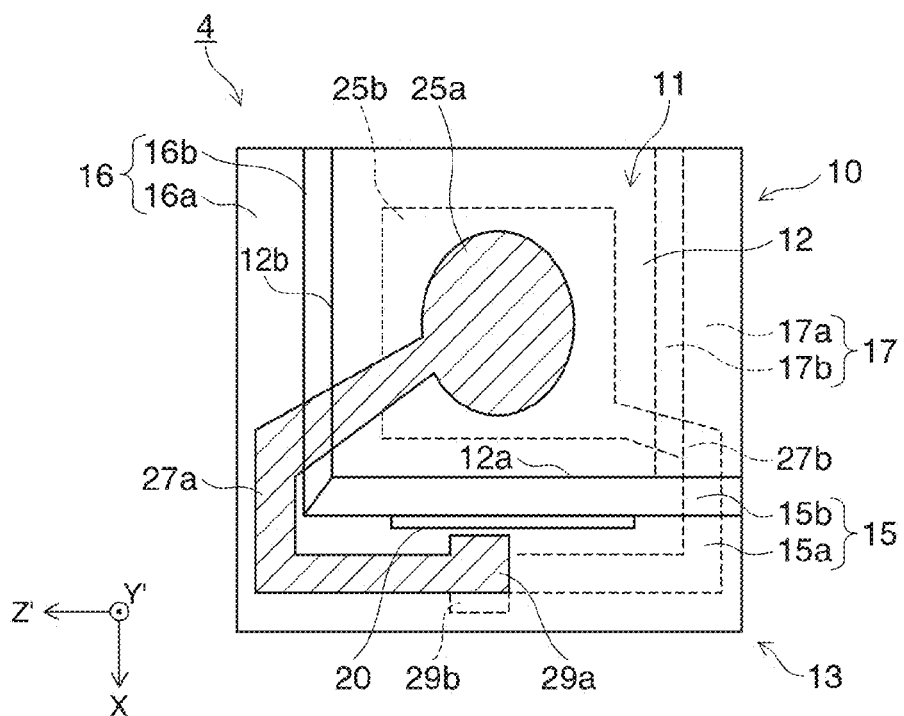
FIG. 11 is a plan view illustrating another modification example of the piezoelectric vibrating element of the fourth embodiment.

In an embodiment illustrated in FIG. 11, the excitation electrode 25a on the front surface side has an elliptical shape, and the excitation electrode 25b on the rear surface side is a quadrangular electrode having an area sufficiently larger than the excitation electrode 25a such that the excitation electrode 25a fits within the area of the excitation electrode 25b. When the piezoelectric substrate 10 is quartz crystal, due to the elastic constant anisotropy, a displacement distribution in the X-axis direction is different from a displacement distribution in the Z'-axis direction. A cut surface of the displacement distribution cut along a plane parallel to the X-Z'-plane has an elliptical shape. Thus, the piezoelectric vibrating element 4 can be driven most efficiently when the excitation electrode 25a having an elliptical shape is used. That is, it is possible to minimize the capacitance ratio γ (=C0/C1, where C0 is electrostatic capacitance and C1 is series resonance capacitance) of the piezoelectric vibrating element 4. Moreover, the excitation electrode 25a may have an elliptical shape. Further, the excitation electrode 25b on the rear surface side may have a circular shape, an elliptical shape, an oblong shape, or the like having an area sufficiently larger than the area of the excitation electrode 25a such that the excitation electrode 25a fits into the area of the excitation electrode 25b.

Fifth Embodiment of Vibrating Element

Figure 12A:
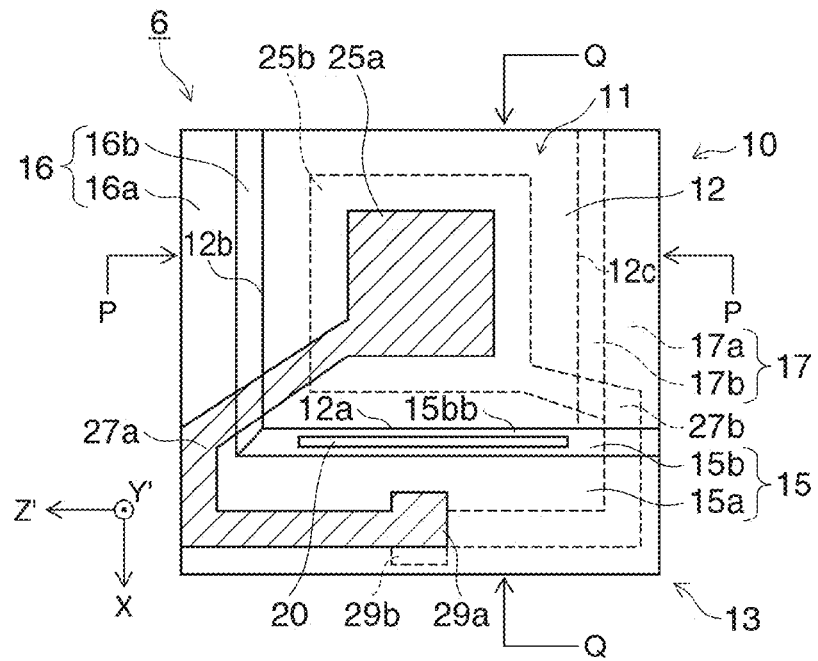
Figure 12C:
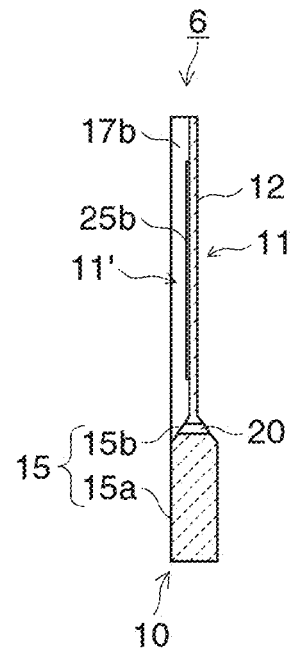
Figure 12B:
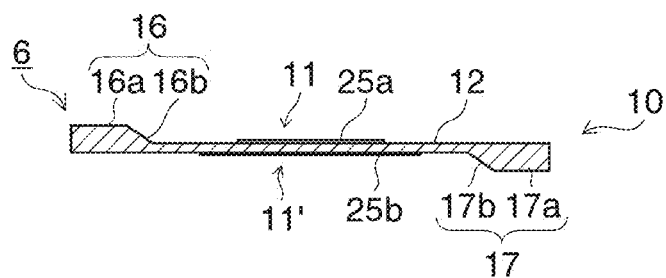

FIGS. 12A to 12C are schematic views illustrating the structure of a piezoelectric vibrating element 6 according to a fifth embodiment. FIG. 12A is a plan view of the piezoelectric vibrating element 6, FIG. 12B is a cross-sectional view of a P-P cross-section as seen from the positive X-axis direction, and FIG. 12C is a cross-sectional view of a Q-Q cross-section as seen from the positive Z'-axis direction.

The piezoelectric vibrating element 6 is different from the piezoelectric vibrating element 4 illustrated in FIGS. 8A to 8F in that the stress-mitigating slit 20 is formed at a different position. In this embodiment, the slit 20 penetrates through the third slope portion 15b that is separated from the edge of the side 12a of the thin-walled vibrating portion 12. Unlike the piezoelectric vibrating element 4, the slit 20 is formed so as to be separated from both edges of the third slope portion 15b rather than forming the slit 20 in the third slope portion 15b along the side 12a of the vibrating portion 12 so that one edge of the slit 20 is in contact with the side 12a. That is, an ultra-narrow slope portion 15bb that is, connected to the edge of the side 12a of the vibrating portion 12 is left in the third slope portion 15b. In other words, the ultra-narrow slope portion 15bb is formed between the side 12a and the slit 20.

The reason why the ultra-narrow slope portion 15bb is left is as follows. When a high-frequency voltage is applied to the excitation electrodes 25a and 25b disposed in the vibrating portion 12 to excite the vibrating portion 12, inharmonic and overtone modes (A0, S1, A1, S2, . . . ) are excited in addition to the main vibration mode (S0). It is preferable that only the main vibration mode (S0) is in the confining mode, and the other inharmonic and overtone modes are in a propagating mode (non-confining mode). However, if the vibrating portion 12 is made thin and the fundamental frequency is as high as several hundreds of MHz, it is necessary to increase the thickness of the excitation electrodes 25a and 25b to a predetermined thickness or more in order to prevent ohmic loss of an electrode film. Thus, when the thicknesses of the excitation electrodes 25a and 25b are set to the predetermined thicknesses or more, a low-order inharmonic and overtone mode adjacent to the main vibration mode becomes the confining mode.

The magnitude of the amplitude (CI) of the low-order inharmonic and overtone mode can be suppressed by preventing the occurrence of standing waves in the inharmonic mode. That is, since both edges in the X-axis direction of the vibrating portion 12 of FIGS. 12A to 12C are asymmetrical due to the presence of a narrow piece (the ultra-narrow slope portion 15bb), it is possible to suppress the amplitude of standing waves in the low-order inharmonic and overtone mode.

Sixth Embodiment of Vibrating Element

FIGS. 13A to 13C are schematic views illustrating the structure of a piezoelectric vibrating element 7 according to a sixth embodiment. FIG. 13A is a plan view of the piezoelectric vibrating element 7, FIG. 13B is a cross-sectional view of a P-P cross-section as seen from the positive X-axis direction, and FIG. 13C is a cross-sectional view of a Q-Q cross-section as seen from the positive Z'-axis direction.

The piezoelectric vibrating element 7 is different from the piezoelectric vibrating element 4 illustrated in FIGS. 8A to 8F, in that two stress-mitigating slits 20a and 20b are formed. That is, the first slit 20a penetrates through the third thick-walled body 15a, and the second slit 20b penetrates through the third slope portion 15b. The purpose of forming individual slits 20a and 20b in the third thick-walled body 15a and the third slope portion 15b has been described above, and the redundant description thereof will not be provided.

Figure 14:
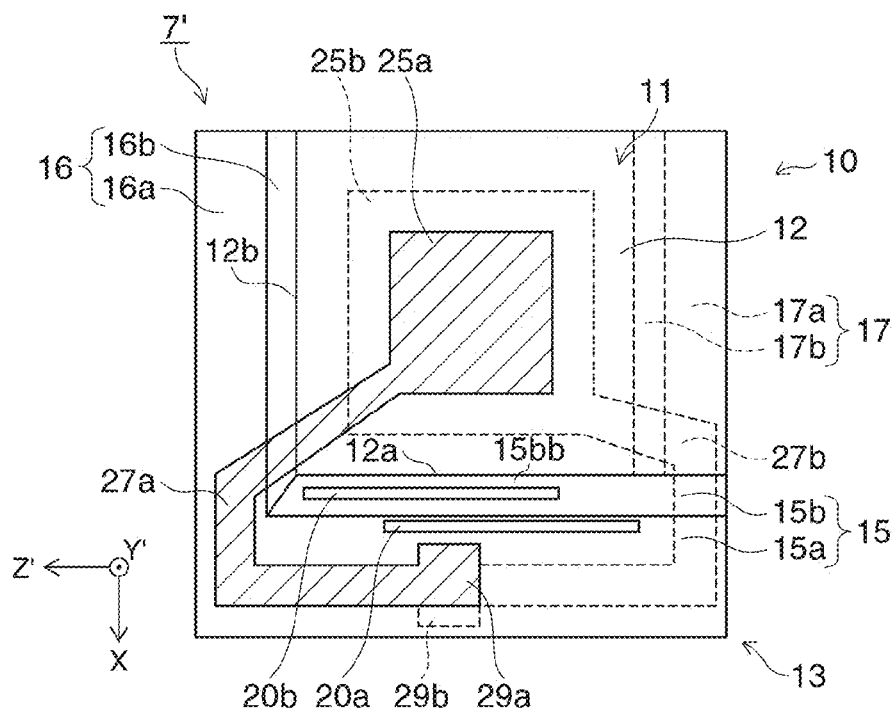
FIG. 14 is a plan view illustrating the configuration of a modification example of the piezoelectric vibrating element of the sixth embodiment.

FIG. 14 is a plan view illustrating the configuration of a piezoelectric vibrating element 7' according to a modification example of the piezoelectric vibrating element 7 illustrated in FIGS. 13A to 13C. In the piezoelectric vibrating element 7', the first slit 20a penetrates through the third thick-walled body 15a, and the second slit 20b penetrates through the third slope portion 15b. However, the piezoelectric vibrating element 7' is different from the piezoelectric vibrating element 7 in that the first and second slits 20a and 20b are disposed in a stepped form so as to be shifted from each other in the Z'-axis direction rather than arranging the first and second slits 20a and 20b in parallel in the X-axis direction as illustrated by the plan view in FIG. 13A. By forming two slits 20a and 20b, it is possible to prevent the stress occurring due to the conductive adhesive from spreading to the vibrating portion 12.

Figure 15:
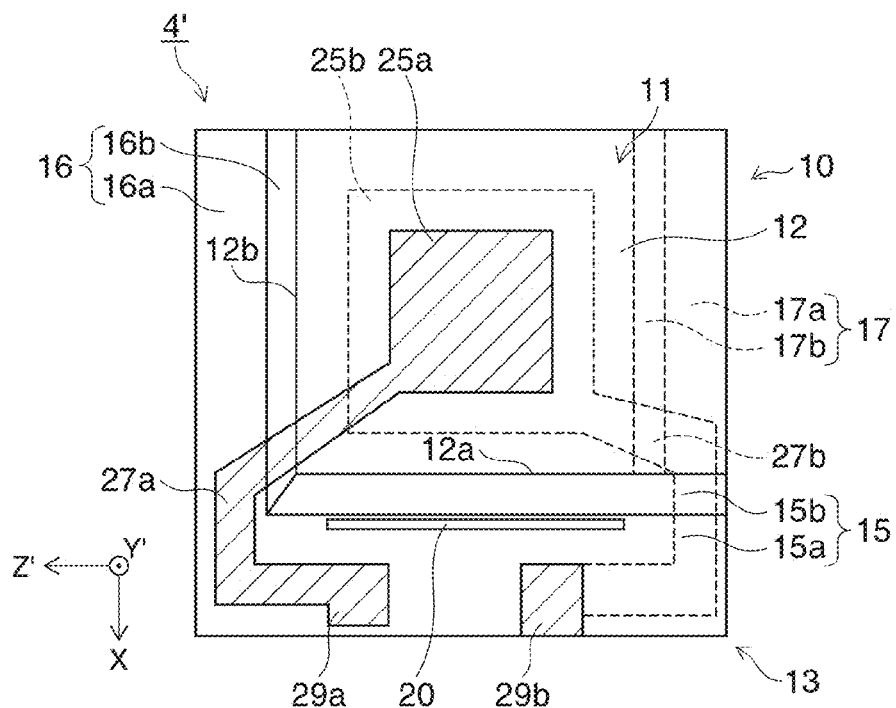
FIG. 15 is a plan view illustrating the configuration of a modification example of the piezoelectric vibrating element of the fourth embodiment.

FIG. 15 is a plan view illustrating the configuration of a piezoelectric vibrating element 4' according to a modification example of the piezoelectric vibrating element 4 of the embodiment illustrated in FIGS. 8A to 8F. The piezoelectric vibrating element 4' has a configuration in which the lead electrode 27a extends from an edge of the excitation electrode 25a on the front surface side so as to be connected to the pad electrode 29a formed on the front surface of the third thick-walled portion 15 via the front surface (upper surface) of the first thick-walled portion 16. Moreover, the lead electrode 27b extends from an edge of the excitation electrode 25b on the rear surface side so as to be continuous with the pad electrode 29b formed on the rear surface side of the third thick-walled portion 15 via the front surface of the second thick-walled portion 17.

The piezoelectric vibrating element 4' is different from the piezoelectric vibrating element 4 of the embodiment illustrated in FIGS. 8A to 8F in that the pad electrodes 29a and 29b are disposed at different positions. The pad electrodes 29a and 29b are formed on the front surface of the third thick-walled body 15a so as to be separated from each other. The pad electrode 29b is formed of a conductive thin film that extends from the rear surface to the front surface over the edge of the piezoelectric substrate 10 so as to be electrically connected to the lead electrode 27b formed on the rear surface. The pad electrodes 29a and 29b are configured such that a conductive adhesive is applied to the pad electrodes 29a and 29b on the front surface side, and the pad electrodes 29a and 29b are placed on the element-mounting pads of a package by reversing the piezoelectric vibrating element, whereby electrical connection is easily achieved.

Figure 16:
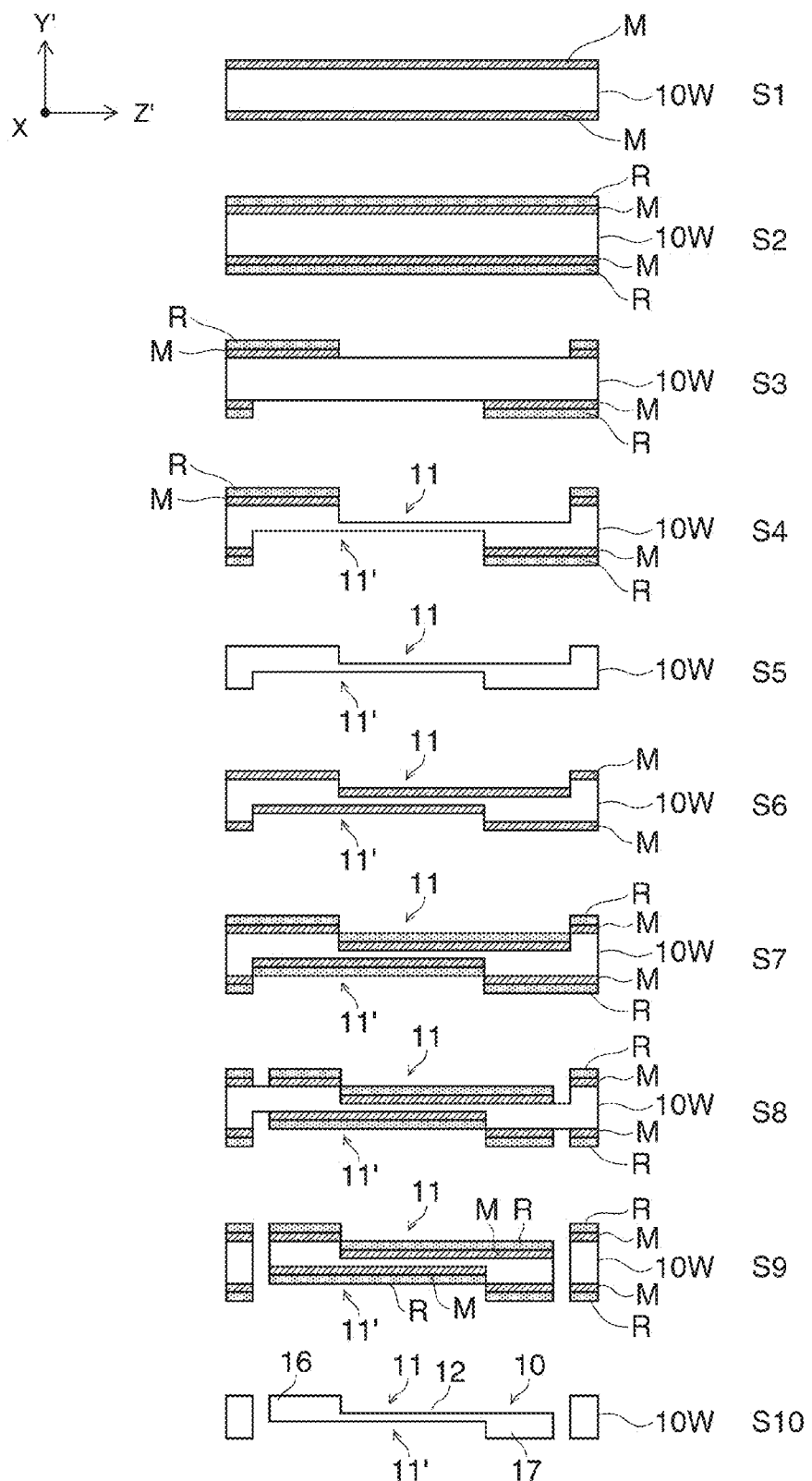
FIG. 16 is a schematic view illustrating the steps of forming the outer shape of a piezoelectric substrate and forming slits.

Method of Manufacturing Vibrating Element
Step of Forming Outer Shape of Element FIG. 16 is a schematic view illustrating the manufacturing steps associated with the step of forming depressed portions 11 and 11' on both surfaces of the piezoelectric substrate 10 and forming the outer shape of the piezoelectric substrate 10 and the slit 20. In this example, the manufacturing steps of multiple piezoelectric vibrating elements 1 on a quartz crystal wafer 10W which is an example of a piezoelectric wafer are illustrated. In the cross-sectional views, the steps of forming a fragmented piezoelectric vibrating element 1 are illustrated.

In step S1, the quartz crystal wafer 10W having a predetermined thickness (for example, 80 μm) with both surfaces (front and rear surfaces) polished is sufficiently washed and dried. After that, a metal film (anticorrosive film) Min which gold (Au) is stacked on a base of chromium (Cr) is formed on the front and rear surfaces by sputtering or the like.

In step S2, a photoresist film (referred to as a resist film) R is applied on the upper surfaces of the metal films M on the front and rear surfaces.

In step S3, the resist films R at the positions corresponding to the depressed portions 11 and 11' on the front and rear surfaces, are sensitized using an exposure apparatus and a mask pattern. When the resist film R sensitized by the exposure is developed and separated, the metal film M at a position corresponding to the depressed portions 11 and 11' on the front and rear surfaces is exposed. When the metal films M exposed by the separation of the resist film R are dissolved and removed using a solution such as aqua regia, the front and rear surfaces of the quartz crystal wafer 10W at the position corresponding to the depressed portions 11 and 11' are exposed.

In step S4, the exposed front and rear surfaces of the quartz crystal wafer 10W are etched to a desired thickness using a mixed solution of hydrofluoric acid and ammonium fluoride.

In step S5, the resist films R on the front and rear surfaces are separated using a predetermined solution, and the metal film M on the exposed front and rear surfaces is removed using aqua regia or the like. In a plan view of the quartz crystal wafer 10W of this stage, the depressed portions 11 and 11' on the front and rear surfaces are slightly shifted from each other, and the depressed portions 11 and 11' on the same plane are arranged regularly in a grid form.

In step S6, a metal film M (Cr+Au) is formed on both surfaces of the quartz crystal wafer 10W obtained in step S5.

In step S7, a resist film R is applied to both surfaces of the metal film M (Cr+Au) formed in step S6.

In step S8, the resist films R at positions corresponding to the outer shape of the piezoelectric substrate 10 and a slit (not illustrated), are sensitized and developed from both front and rear surfaces using an exposure apparatus and a predetermined mask pattern to thereby separate the resist film R. Further, the exposed metal film M is dissolved and removed using a solution such as aqua regia.

In step S9, both surfaces of the exposed quartz crystal wafer 10W are etched using a mixed solution of hydrofluoric acid and ammonium fluoride to thereby form the outer shape of the piezoelectric substrate 10 and a slit (not illustrated).

In step S10, the remaining resist film R is separated, and the exposed redundant metal film M is dissolved and removed. In this stage of the quartz crystal wafer 10W, multiple piezoelectric substrates 10 are connected by narrow supporting pieces and are arranged regularly in a grid form. In this embodiment, as illustrated by step S10, the depressed portions 11 and 11' are formed on both principal surfaces of the piezoelectric substrate 10 to form the vibrating portion 12, and the first and second thick-walled portions 16 and 17 continuous with the vibrating portion 12 are formed to be in point-symmetry with respect to the center of the piezoelectric substrate 10.

After step S10 ends, the thicknesses of the vibrating portions 12 of the multiple piezoelectric substrates 10 arranged regularly on the quartz crystal wafer 10W in a grid form are measured by an optical method, for example. When the measured thicknesses of each of the vibrating portions 12 are larger than a predetermined thickness, the respective thicknesses are finely adjusted so as to fall within a predetermined thickness range.

First Step of Forming Electrodes of Element

Figure 17:
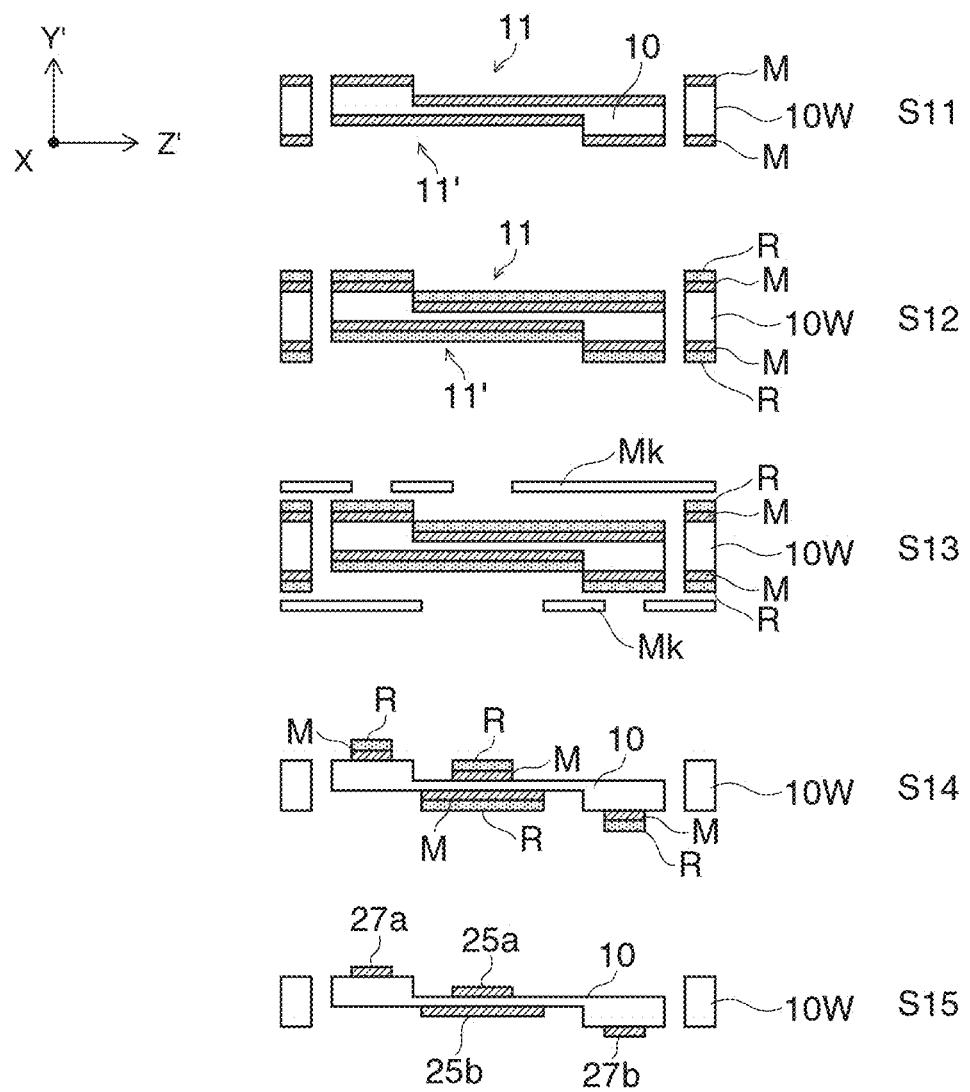
FIG. 17 is a schematic view illustrating the steps of forming the excitation electrode and the lead electrode of a piezoelectric vibrating element.

The flow (step) of forming the excitation electrodes 25a and 25b and the lead electrodes 27a and 27b on the respective piezoelectric substrates 10 after the thicknesses of the vibrating portions 12 of the multiple piezoelectric substrates 10 formed on the quartz crystal wafer 10W are adjusted so as to fall within a predetermined thickness range will be described using a schematic view illustrated in FIG. 17.

In step S11, a thin film of nickel (Ni) is formed on the entire front and rear surfaces of the quartz crystal wafer 10W by sputtering or the like, and a thin film of gold (Au) is stacked thereon to form the metal film M.

In step S12, a resist is applied to the metal films M to form the resist film R.

In step S13, the resist film R at the positions of the excitation electrodes 25a and 25b and the lead electrodes 27a and 27b is sensitized using a mask pattern Mk.

In step S14, the sensitized resist film R is developed and left, and the resist film R which is not sensitized is separated using a solution. Subsequently, the resist film R is separated, and the exposed metal film M is dissolved and removed using a solution such as aqua regia or the like.

In step S15, the resist film R left on the metal film M is separated, whereby the excitation electrodes 25a and 25b, the lead electrode 27a and 27b, and the like are formed on the respective piezoelectric substrates 10. After that, the narrow supporting pieces formed by-half etching, connected to the multiple piezoelectric substrates 10 of the quartz crystal wafer 10W are broken, whereby the divided and fragmented individual piezoelectric vibrating elements 1 are obtained.

Figure 18:
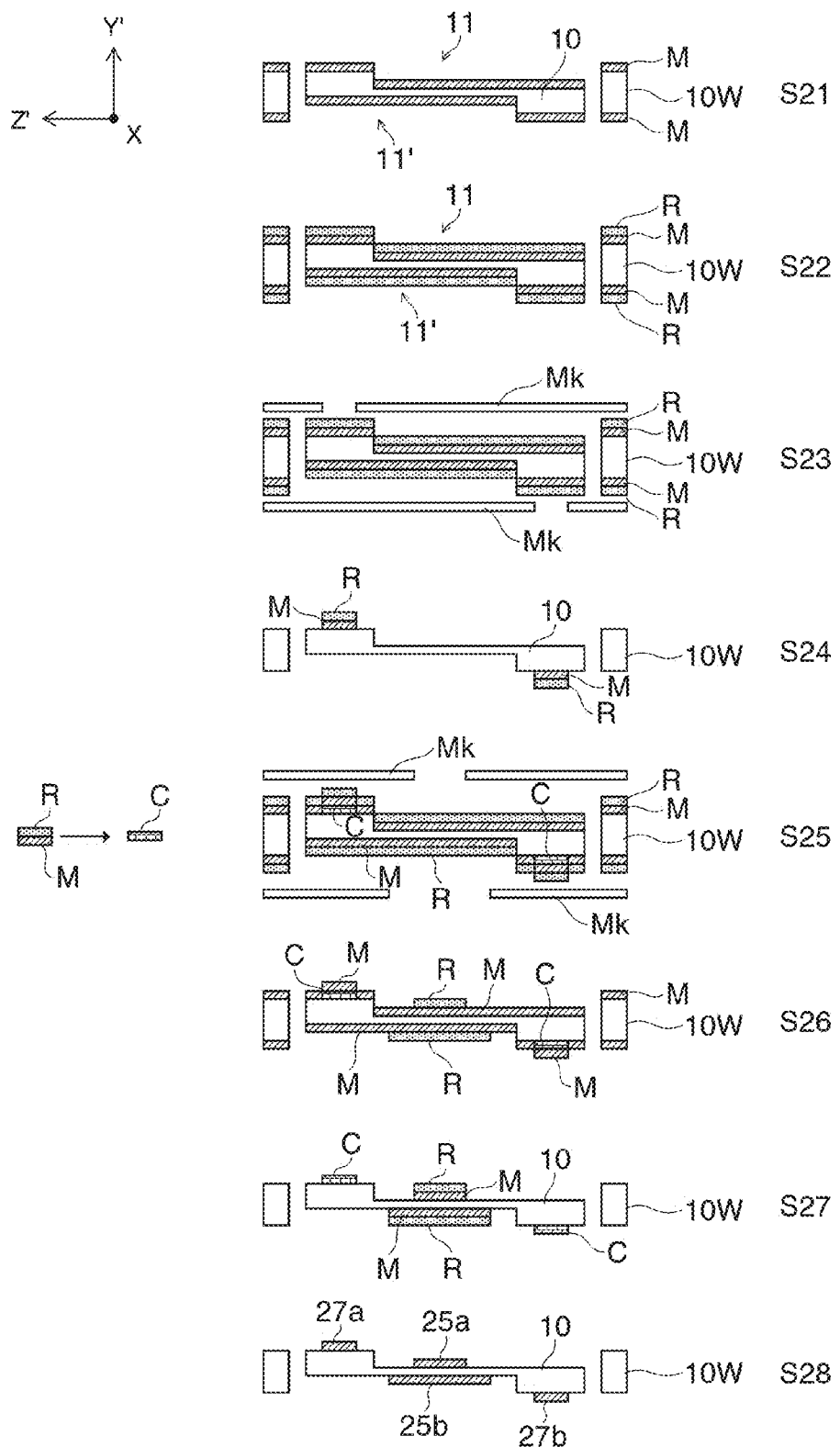
FIG. 18 is a schematic view illustrating another example of the step of forming the excitation electrode and the lead electrode of a piezoelectric vibrating element.

Second Step of Forming Electrodes of Element Another flow (step) of forming the excitation electrodes 25a and 25b and the lead electrodes 27a and 27b on the respective piezoelectric substrates 10 after the thicknesses of the vibrating portions 12 of the multiple piezoelectric substrates 10 formed on the quartz crystal wafer 10W are adjusted so as to fall within a predetermined thickness range will be described using a schematic view illustrated in FIG. 18.

In step S21, a thin film of chromium (Cr) is formed on the entire front and rear surfaces of the quartz crystal wafer 10W by sputtering or the like and a thin film of gold (Au) is stacked thereon to thereby form the metal film M.

In step S22, a resist is applied to the metal films M, and the resist film R is formed.

In step S23, the resist film R at the positions of the lead electrodes 27a and 27b and the pad electrodes 29a and 29b is sensitized using mask patterns Mk for the lead electrodes and the pad electrodes.

In step S24, the sensitized resist film R is developed and left, and the resist film R which is not sensitized is separated. The metal film M exposed by the separation is dissolved and removed using a solution such as aqua regia. The resist film R on the lead electrodes 27a and 27b and the pad electrodes 29a and 29b is left as it is.

In step S25, a thin film of nickel (Ni) is formed on the entire front and rear surfaces of the quartz crystal wafer 10W by sputtering or the like, and a thin film of gold (Au) is stacked thereon to thereby form the metal film M. Further, the resist film R is applied to the metal film M. In the drawing corresponding to step S25, in order to avoid complication, a combined layer of the metal film M and the resist film R for the lead electrodes 27a and 27b and the pad electrodes 29a and 29b is denoted by a symbol C (M+R). Moreover, the resist film R at the position corresponding to the excitation electrodes 25a and 25b is sensitized using a mask pattern Mk for the excitation electrodes.

In step S26, the sensitized resist film R is developed and left, and the resist film R which is not sensitized is separated using a solution.

In step S27, the resist film R is separated, and the exposed metal film M is dissolved and removed using a solution such as aqua regia.

When the unnecessary resist film R remaining on the metal film M is separated, the excitation electrodes 25a and 25b of (Ni+Au) and the lead electrodes 27a and 27b and the pad electrodes 29a and 29b of (Cr+Au) are formed on the front and rear surfaces of the respective piezoelectric substrates 10 (step S28). After that, the narrow supporting pieces formed by-half etching, connected to the multiple piezoelectric substrates 10 of the quartz crystal wafer 10W are broken, whereby the divided and fragmented individual piezoelectric vibrating elements 1 are obtained.

However, when a quartz crystal is wet-etched, although the etching progresses along the Z-axis, the quartz crystal has such an etching anisotropy unique to quartz crystal that the etching rate changes depending on the direction of each of the crystal axes. Thus, an etching surface appearing due to this etching anisotropy is different depending on the direction of each of the crystal axes, which has been discussed in many academic papers and patent documents focusing on etching anisotropy as their research theme. Despite this, a material that presents clearly organized thinking on etching anisotropy of quartz crystal is not known.

An advanced nano-machining technique is required to manufacture a compact piezoelectric vibrating element. However, according to documents, practically, in many cases, the appearing crystal surfaces are different possibly depending on a difference in various etching conditions (the type of etching solution, an etching rate, an etching temperature, and the like).

Therefore, the inventor repeatedly performed etching simulations, trial production experiments, and nano-level surface analysis, and observations when manufacturing the piezoelectric vibrating element according to the embodiment of the invention using a photolithography technique and a wet-etching technique and found that the piezoelectric resonator according to the embodiment of the invention can be realized as the following embodiments. This will be described in detail below.

Figure 19A:
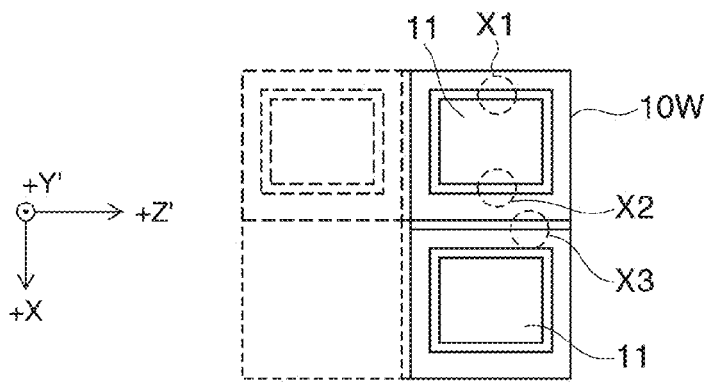
FIG. 19A is a plan view of a depressed portion formed by etching.
Figure 19B:
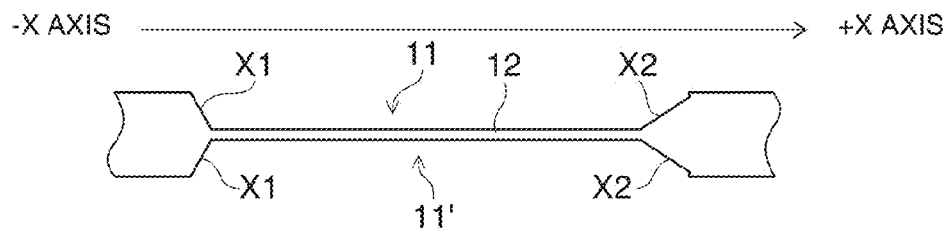
FIGS. 19B to 19E are diagrams illustrating a cut end surface (cut surface) of one cross-section of a depressed portion and a groove portion in the X-axis direction.

FIGS. 19A to 19E and FIGS. 20A to 20E are diagrams illustrating the depressed portions 11 and 11' formed on both surfaces of the quartz crystal wafer 10W by etching. FIG. 19A is a plan view of the quartz crystal wafer 10W in step S5 of FIG. 16. In this stage, the depressed portions 11 and 11' are formed regularly in a grid form on both surfaces of the quartz crystal wafer 10W. FIG. 19B illustrates a cut surface (cut end surface) of the quartz crystal wafer 10W taken along the X-axis direction that passes through the depressed portions 11 and 11'. The wall surfaces of the depressed portion 11 on the upper side (front surface side) and the depressed portion 11' on the lower side (rear surface side) of the quartz crystal wafer 10W are sloped wall surfaces rather than vertical wall surfaces.

That is, the wall surface in the negative X-axis direction of the depressed portion 11 on the upper side forms a sloped wall surface X1, and the wall surface in the positive X-axis direction forms a sloped wall surface X2. Moreover, the wall surface in the negative X-axis direction of the depressed portion 11' on the lower side forms the sloped wall surface X1 and the wall surface in the positive X-axis direction forms the sloped wall surface X2. The respective sloped wall surfaces are etched to be bilaterally symmetrical to the X-axis that passes through the center in the Y-axis direction of the vibrating portion 12. As above, since the progress of etching exhibits anisotropy in the crystal axis direction, etching openings are generally disposed so as to be slightly shifted from each other on the upper and lower surfaces.

Figure 19C:
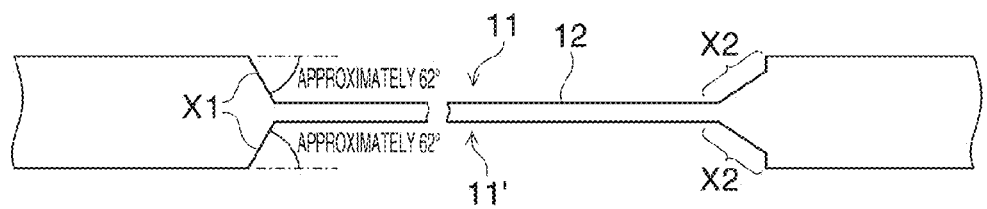
Figure 19D:
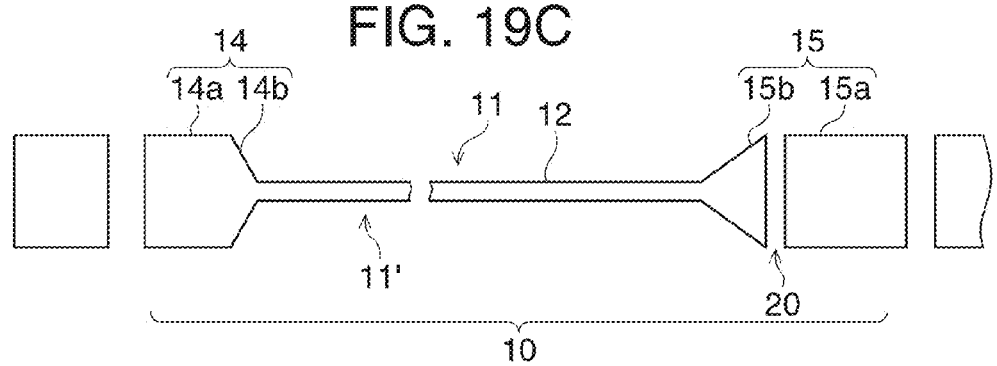
Figure 19E:
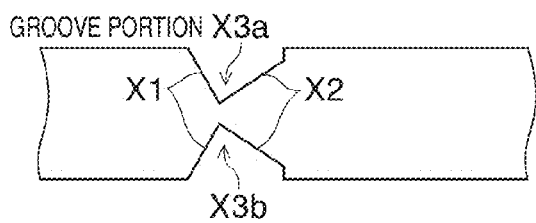

FIGS. 19C to 19E are enlarged views of the sloped wall surfaces X1 and X2 of the depressed portions 11 and 11' and a sloped wall surface X3 of a groove portion. The sloped wall surface X1 in the negative X-axis direction of the depressed portion 11 on the upper side is etched at an angle of approximately 62° with respect to the plane of the quartz crystal wafer 10W as illustrated in FIG. 19C. Moreover, the sloped wall surface X2 in the positive X-axis direction is first etched by a small thickness in a direction orthogonal (90°) to the plane of the quartz crystal wafer 10W, and after that, the etching progresses with a gentle slope. The wall surface in the negative X-axis direction of the depressed portion 11' on the lower side forms the sloped wall surface X1 and the wall surface in the positive X-axis direction forms the sloped wall surface X2. That is, the sloped wall surface of the depressed portion 11 on the upper side and the sloped wall surface of the depressed portion 11' on the lower side are in bilateral symmetry with respect to the X-axis that passes through the center in the Y-axis direction of the vibrating portion 12.

Both surfaces of the vibrating portion 12 formed by the bottom surface of the depressed portion 11 on the upper side and the bottom surface of the depressed portion 11' on the lower side are etched approximately in parallel to the plane before etching, of the quartz crystal wafer 10W. That is, the vibrating portion 12 has a flat plate shape of which the front and rear surfaces are approximately parallel.

FIG. 19D is a cross-sectional view illustrating the outer shape of the piezoelectric substrate 10 and the slit 20. The outer shape and the slit 20 are formed by the etching step S9 of FIG. 16. The fourth thick-walled portion 14 including the fourth thick-walled body 14a and the fourth slope portion 14b is formed in the end portion in the negative X-axis direction (the left side of the drawing). The third thick-walled portion 15 including the third thick-walled body 15a and the third slope portion 15b is formed in the end portion in the positive X-axis direction (the right side of the drawing). The slit 20 is formed in the plane of the third thick-walled body 15a.

FIG. 19E is a cross-sectional view of a breaking groove portion (narrow supporting piece) which is formed in the quartz crystal wafer 10W by the etching step S9 of FIG. 16. The cross-section of the groove portion formed to be orthogonal to the X-axis has a wedge shape. The reason why the cross-section has an approximately wedge shape is that a sloped wall surface X3a of the groove portion on the upper side of the piezoelectric substrate 10 is made up of the sloped wall surface X1 in the negative X-axis direction and the sloped wall surface X2 in the positive X-axis direction, and a sloped wall surface X3b of the groove portion on the lower side is formed to be bilaterally symmetrical to the sloped wall surface X3a on the upper side with respect to the center of the groove portion about the X-axis that passes through the center in the Y-axis direction (thickness direction) of the quartz crystal wafer 10W.

When an electrode is formed in the formation plane of the depressed portions 11 and 11', it is necessary to avoid the vertical wall surface of the sloped wall surface X2. It is preferable to avoid the wall surface since the electrode film is likely to rupture in that wall surface.

Figure 20A:
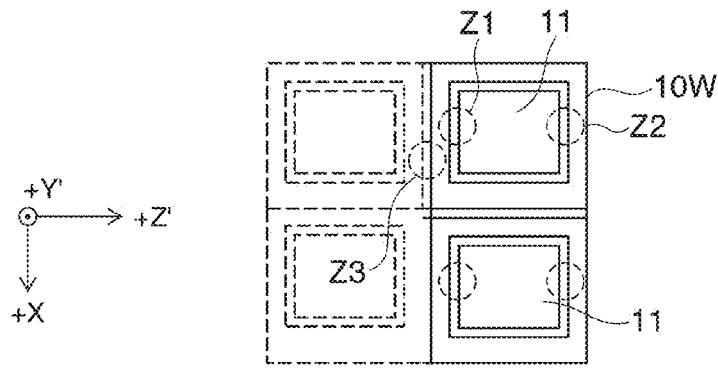
FIG. 20A is a plan view of a depressed portion formed by etching.
Figure 20B:
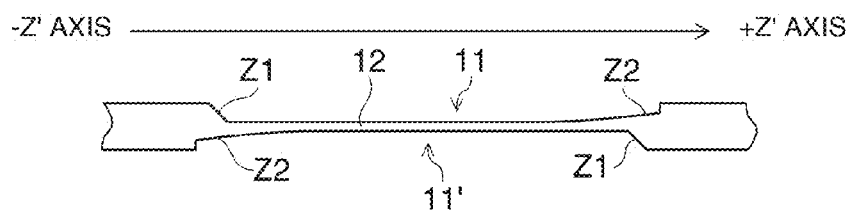
FIGS. 20B to 20E are diagrams illustrating a cut surface of one cross-section of a depressed portion and a groove portion in the Z'-axis direction.

FIG. 20A is a plan view of the quartz crystal wafer 10W in step S5 of FIG. 16. FIG. 20B illustrates the cut surface (cut end surface) of the quartz crystal wafer 10W taken along the Z'-axis direction of the upper-side depressed portion 11 and the lower-side depressed portion 11'. A wall surface in the negative Z'-axis direction of the upper-side depressed portion 11 forms the sloped wall surface Z1, and a wall surface in the Z'-axis direction forms the sloped wall surface Z2. The lower-side depressed portion 11' is formed in point-symmetry to the upper-side depressed portion 11 with respect to the center of the vibrating portion 12. That is, the wall surface in the negative Z'-axis direction of the lower-side depressed portion 11' forms the sloped wall surface Z2, and the wall surface in the positive Z'-axis direction forms the sloped wall surface Z1.

Figure 20C:
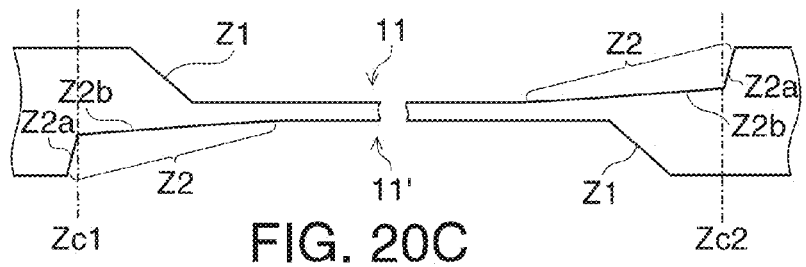
Figure 20D:
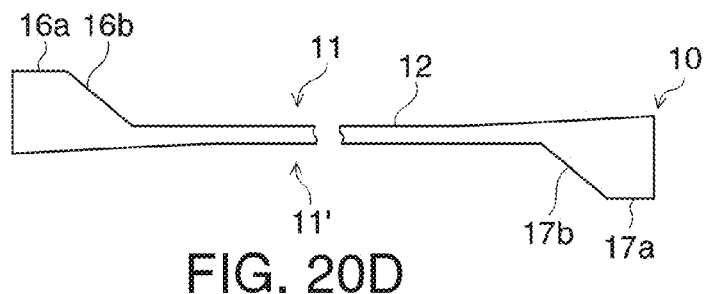
Figure 20E:
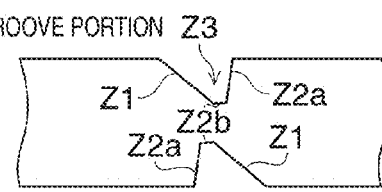

FIGS. 20C to 20E are enlarged views of the sloped wall surfaces Z1 and Z2 of the upper and lower-side depressed portions 11 and 11' and the sloped wall surface Z3 of the groove portion. A wall surface in the negative Z'-axis direction of the upper-side depressed portion 11 is etched at a relatively gentle angle with respect to the plane of the quartz crystal wafer 10W to form the sloped wall surface Z1 as illustrated on the left side of FIG. 20C. The wall surface in the positive Z'-axis direction forms the sloped wall surface Z2 as illustrated on the right side of FIG. 20C. That is, although the quartz crystal wafer 10W is first etched at a steep angle with respect to the plane of the quartz crystal wafer 10W to form a steep sloped wall surface Z2a, the etching progresses with a gentle slope, and a sloped wall surface Z2b is formed. The sloped wall surfaces Z1 and Z2 in the Z'-axis direction of the lower-side depressed portion 11' are in point-symmetry to the upper-side depressed portion 11 with respect to the center of the vibrating portion 12.

FIG. 20D is a cross-sectional view of the outer shape of the piezoelectric substrate 10 after outer-shape processing is performed by etching the piezoelectric substrate 10 from the positions indicated by two broken lines Zc1 and Zc2 in FIG. 20C. The outer shape is formed by the etching step S9 of FIG. 16. The first thick-walled portion 16 including the first thick-walled body 16a and the first slope portion 16b is formed in the end portion in the negative Z'-axis direction (the left side of the drawing). The second thick-walled portion 17 including the second thick-walled body 17a and the second slope portion 17b is formed in the end portion in the positive Z'-axis direction (right side of the drawing). The first and second thick-walled portions 16 and 17 are formed to be approximately in point-symmetry with respect to the center of the vibrating portion 12.

FIG. 20E is a cross-sectional view of the upper and lower-side groove portions formed to be orthogonal to the Z'-axis direction, in which both have a sloped wall surface Z3 having a wedge-shaped cross-section. The upper and lower-side groove portions are groove portions for breaking the quartz crystal wafer 10W. The sloped wall surface Z3 of the upper-side groove portion includes the sloped wall surface Z1 in the negative Z'-axis direction of the depressed portion 11 and the sloped wall surface Z2 (including wall surfaces Z2a and Z2b) in the positive Z'-axis direction. The sloped wall surface Z3 of the lower-side groove portion has an approximately wedge-shaped cross-section since the sloped wall surface Z3 is formed to be in point-symmetry to the upper-side sloped wall surface Z3 with respect to the center of the groove portion.

When the breaking groove portions are formed in the X-axis direction and the Z'-axis direction, it becomes easy to break the quartz crystal wafer 10W since the groove portions have a wedge-shaped cross-section.

One of the features of this embodiment is that etching progresses from both principal surfaces of the quartz crystal wafer 10W so that the depressed portions 11 and 11' are formed so as to face both principal surfaces respectively and form the vibrating portion 12. Thus, it is possible to shorten the processing time required for etching by half. Another feature of this embodiment is that both of the portions on the outer side than the broken lines Zc1 and Zc2 illustrated in FIG. 20D are removed by etching so that the piezoelectric substrate 10 can be miniaturized. Etching progresses from both principal surfaces of the piezoelectric substrate 10, and the etching depth from the respective principal surfaces of the piezoelectric substrate 10 can be decreased. Therefore, it is possible to suppress thickness unevenness of the thin-walled vibrating portion 12 between the respective fragment layout regions in the quartz crystal wafer 10W or between the respective quartz crystal wafers 10W.

This is because there is a problem in that if the piezoelectric substrate 10 is soaked in an etching solution for a long period, the concentration of the etching solution may differ from position to position. Due to the concentration difference, there is a problem in that it is not possible to maintain the uniformity of etching of the piezoelectric substrate 10. As a result, thickness unevenness of the vibrating portion may occur between the respective fragment layout regions in the quartz crystal wafer or between respective quartz crystal wafers. Therefore, it becomes difficult to control the thickness of the vibrating portion.

Further, the manufacturing method was established under the assumption that both end portions which are unnecessary as the vibrating portion 12 are removed as illustrated in FIGS. 20C and 20D. In this way, it was possible to decrease the size of the piezoelectric vibrating element 1 while securing the area of a flat ultra-thin portion serving as the vibrating portion as compared to the structure including the thick-walled portion exemplified as the related art.

Further, as described above, a smaller frequency variation occurs when force (stress or strain resulting from mounting) is applied to both ends in the Z'-axis direction of an AT-cut quartz crystal substrate as compared to a frequency variation when the same force is applied to both ends in the X-axis direction of the AT-cut quartz crystal substrate. In this way, since the piezoelectric substrate 10 is configured as a so-called X-long substrate in which the length in the X-axis direction is larger than the length in the Z'-axis direction, it is possible to secure the area of the vibrating portion 12 which is long in the X-axis direction.

Moreover, since the thick-walled portion 13 is formed at least one of the front and rear principal surfaces of the vibrating portion 12 along the entire periphery of the vibrating portion 12 of the piezoelectric vibrating element 1 of the embodiment, the end portion of the vibrating portion 12 will not be exposed to the outside. In this way, from the perspective of reliability such as the impact resistance of the piezoelectric vibrating element 1 of the present embodiment, even when the piezoelectric vibrating element 1 is struck by something, for example, during manufacturing of the piezoelectric vibrating element 1 or during the course of mounting the piezoelectric vibrating element 1 on a package (container) and manufacturing a piezoelectric resonator, since the piezoelectric vibrating element 1 has high rigidity, it is possible to maintain high reliability.

As a result, it is possible to perform design by taking into consideration the fact that a displacement distribution of the thickness-shear vibration mode excited in the vibrating portion has an elliptical shape which is long in the X-axis direction due to the elastic constant anisotropy. Thus, it is possible to design the ratio (ideally 1.26:1) of the length in the long axis to the length in the short axis so as to sufficiently fall within the range of approximately 1.14:1 to 1.39:1 by taking dimension unevenness of manufactured products into consideration.

Figure 21A:
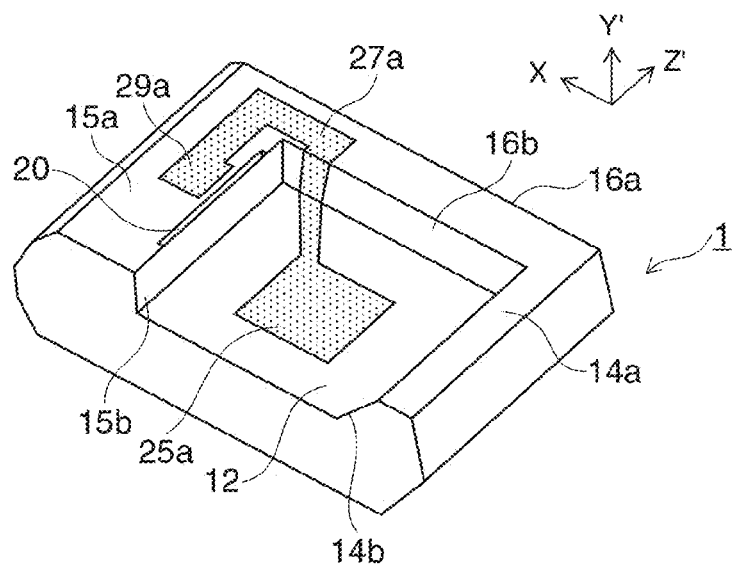
FIG. 21A is a perspective view illustrating the configuration of the piezoelectric vibrating element according to the first embodiment.
Figure 21B:
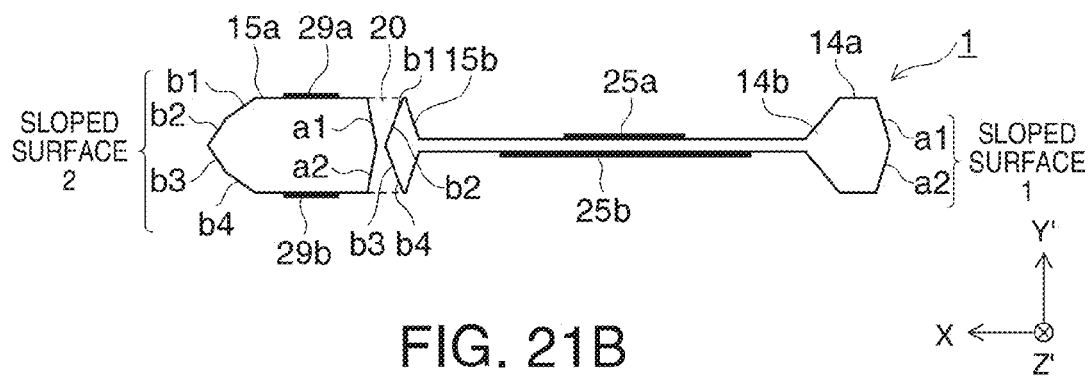
FIG. 21B is a cross-sectional view of the Q-Q cross-section of FIGS. 1A to 1F as seen from the negative Z'-axis direction.

FIGS. 21A and 21B are detailed view of the piezoelectric vibrating element 1 illustrated in FIGS. 1A to 1F, in which FIG. 21A is a perspective view, and FIG. 21B is a cross-sectional view of the Q-Q cross-section of FIG. 1A as seen from the negative Z'-axis direction. As illustrated in FIG. 21A, an outer end surface crossing the X-axis of the piezoelectric vibrating element 1 has a sloped surface. That is, as illustrated in FIG. 21B, an end surface on the negative X-axis side has a sloped surface 1 (including sloped surfaces a1 and a2), and an end surface on the positive X-axis side has a sloped surface 2 (including sloped surfaces b1, b2, b3, and b4). The shapes of the cross-sections parallel to the XY'-plane, of the sloped surfaces 1 and 2 are different.

Moreover, looking at the vicinities of the portion crossing the principal front surface of the piezoelectric substrate 10, neither of the sloped surfaces 1 and 2 has a vertical wall surface of the sloped wall surface X2 formed in the positive X-axis direction as illustrated in FIGS. 19B and 19E. This is because the etching time required for forming the sloped surface 1 (a1 and a2) and the sloped surface 2 is sufficiently longer than the etching time required for forming the depressed portions 11 and 11' since the etching of the sloped surfaces continues until etching penetrates through the outer shape of the piezoelectric substrate (quartz crystal substrate) 10. Thus, due to the effect of over-etching, a vertical wall surface does not appear.

It was confirmed that the sloped surfaces a1 and a2 that constitute the sloped surface 1 are approximately symmetrical with respect to the X-axis. It was also confirmed that in the sloped surfaces b1, b2, b3, and b4 that constitute the sloped surface 2, the sloped surfaces b1 and b4 and the sloped surfaces b2 and b3 each are approximately symmetrical with respect to the X-axis. Further, it was confirmed that the inclination angle α of the sloped surfaces a1 and a2 with respect to the X-axis and the inclination angle β of the sloped surfaces b1 and b4 with respect to the X-axis satisfy a relation of β<α.

Figure 22:
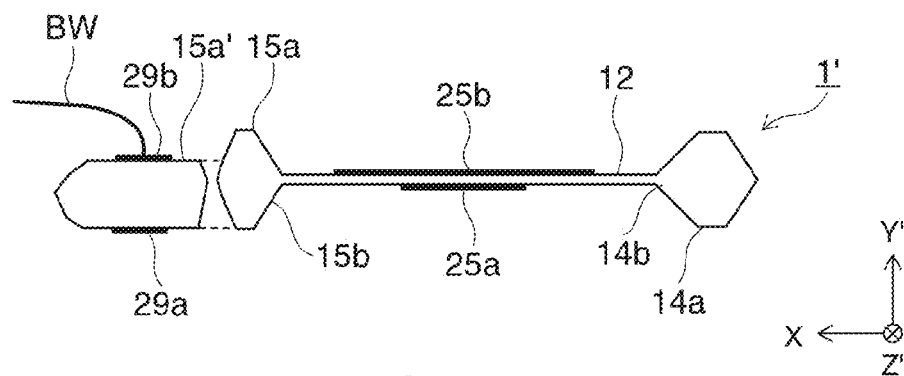
FIG. 22 is a view illustrating a modification example of the piezoelectric vibrating element of the first embodiment and is a cross-sectional view of the Q-Q cross-section of FIGS. 1A to 1F as seen from the negative Z'-axis direction.

A piezoelectric vibrating element 1' of an embodiment illustrated in FIG. 22 is a modification example of the piezoelectric vibrating element 1 illustrated in FIGS. 1A to 1F and has a structure such that a third thick-walled body 15a' which is a part close to an outer end portion of the third thick-walled body 15a is made thin by etching or the like. This is to prevent an apex portion in the positive Y-axis direction of a bonding wire BW from making contact with a lid member put on a package when connecting the pad electrode 29b formed on the third thick-walled body 15a' and an external electrode terminal by the bonding wire BW.

As illustrated in the embodiments of FIGS. 1A to 1F, FIGS. 5A to 5C, FIG. 6A to 6C, and FIGS. 7A and 7B, it is possible to decrease the size of a high-frequency piezoelectric vibrating element and to obtain a piezoelectric vibrating element which is resistant to vibration, impact, or the like, and in which the thick-walled portion for supporting the vibrating portion is strong. Further, since spreading of stress resulting from bonding or fixing can be suppressed by forming a slit, it is possible to obtain piezoelectric vibrating element which has excellent frequency-temperature characteristics, CI-temperature characteristics, and frequency-aging characteristics, and in which the CI value of the main vibration mode is small, and the ratio, namely the CI value ratio, of the CI value of an adjacent spurious mode to the CI value of the main vibration mode is large.

Moreover, when the piezoelectric vibrating element is supported at one point, it is possible to decrease the stress occurring due to a conductive adhesive.

Moreover, when the thick-walled portion is formed in contact with the vibrating portion at an end portion thereof as illustrated in FIGS. 1A to 1F, FIGS. 5A to 5B, and FIGS. 6A to 6C, it is possible to improve the impact resistance and the vibration resistance of the piezoelectric vibrating element.

As illustrated in the embodiments of FIGS. 8A to 8F, FIGS. 12A to 12C, and FIGS. 13A to 13C, since the thick-walled portion is reduced, it is possible to miniaturize a high-frequency piezoelectric vibrating element using fundamental waves and to improve the impact resistance thereof and to make mass-production possible. Further, since spreading of stress resulting from bonding or fixing can be suppressed by forming at least one slit between the supporting portion and the vibrating region, it is possible to obtain a piezoelectric vibrating element having excellent frequency-temperature characteristics, CI-temperature characteristics, and frequency-aging characteristics.

Moreover, as illustrated in the embodiment of FIGS. 9A and 9B, the excitation electrodes 25a and 25b are formed of a combination of metal materials different from that of the lead electrodes 27a and 27b, and the pad electrodes 29a and 29b. That is, the excitation electrodes 25a and 25b are formed of a stacked film of nickel and gold, whereas the lead electrodes 27a and 27b and the pad electrodes 29a and 29b are formed of a stacked film of chromium and gold. By doing so, it is possible to obtain a piezoelectric vibrating element in which the CI value of the main vibration mode is small, and the ratio, namely the CI value ratio, of the CI value of an adjacent spurious mode to the CI value of the main vibration mode is large.

Moreover, in the piezoelectric vibrating element 1 illustrated in the embodiments of FIGS. 8A to 8F, FIGS. 12A to 12C, and FIGS. 13A to 13C, the other principal surface (rear surface) of the vibrating portion 12 and the other surface (rear surface) of the first thick-walled portion 16 are formed on the same plane, and a principal surface (front surface) of the vibrating portion 12 and the other surface (front surface) of the second thick-walled portion 17 are on the same plane. Thus, since an unnecessary thick-walled portion is reduced, it is possible to realize miniaturization and improve the impact resistance. Further, since the vibrating region is formed by etching from both front and rear surfaces of the piezoelectric substrate 10, it is possible to shorten the etching time. In addition, by removing the unnecessary thick-walled portion, it is possible to realize miniaturization and to obtain a high fundamental frequency piezoelectric vibrating element having excellent frequency-temperature characteristics.

As illustrated in the embodiments of FIGS. 6A to 6C and FIGS. 13A to 13C, since two slits are formed in the third thick-walled portion 15, it is possible to suppress spreading of stress occurring when bonding or fixing the piezoelectric vibrating element more efficiently. Thus, it is possible to obtain a piezoelectric vibrating element having excellent frequency reproducibility, frequency-temperature characteristics, CI-temperature characteristics, and frequency-aging characteristics.

Moreover, since the piezoelectric substrate 10 is formed by cutting at the cutting angle as shown in FIG. 2, it is possible to form a piezoelectric vibrating element which has the required specifications and is cut at a more appropriate cut angle. In addition, it is possible to obtain a high-frequency vibrating element having frequency-temperature characteristics compatible with the specifications and a low CI value and a high CI value ratio.

Moreover, since a rotated Y-cut quartz crystal substrate is used as the piezoelectric substrate, it is possible to utilize past results and experience obtained over years regarding photolithography technique and etching technique. Thus, it is possible to mass-produce the piezoelectric substrate, obtain a high-precision piezoelectric substrate, and improve the yield of a piezoelectric vibrating element considerably.

Moreover, as illustrated in FIGS. 1A to 1F, the third thick-walled portion 15 is configured to include the third slope portion 15b having a thickness that increases as the third slope portion 15b proceeds from one edge continuous with the vibrating portion 12 toward the other edge and the third thick-walled body 15a continuous with the other edge of the third slope portion 15b. Thus, it is possible to miniaturize a high fundamental frequency piezoelectric vibrating element and to obtain a piezoelectric vibrating element in which the vibrating portion is supported tightly and which is resistant to vibration, impact, or the like.

Resonator

First Embodiment of Resonator

Figure 23A:
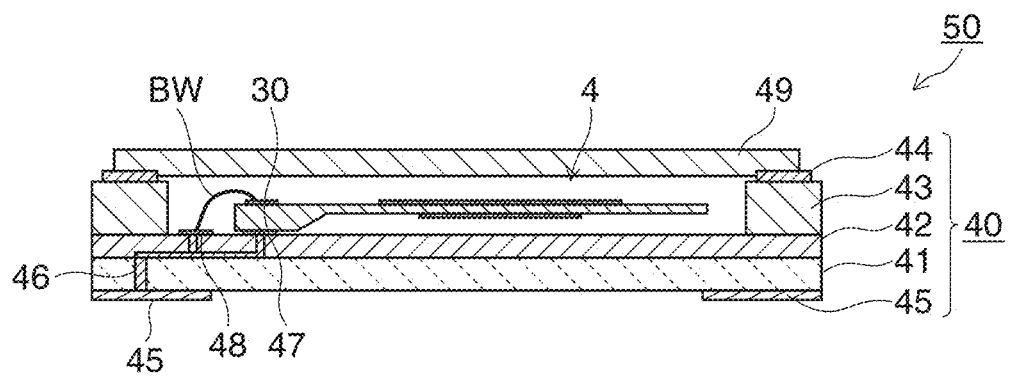
Figure 23B:
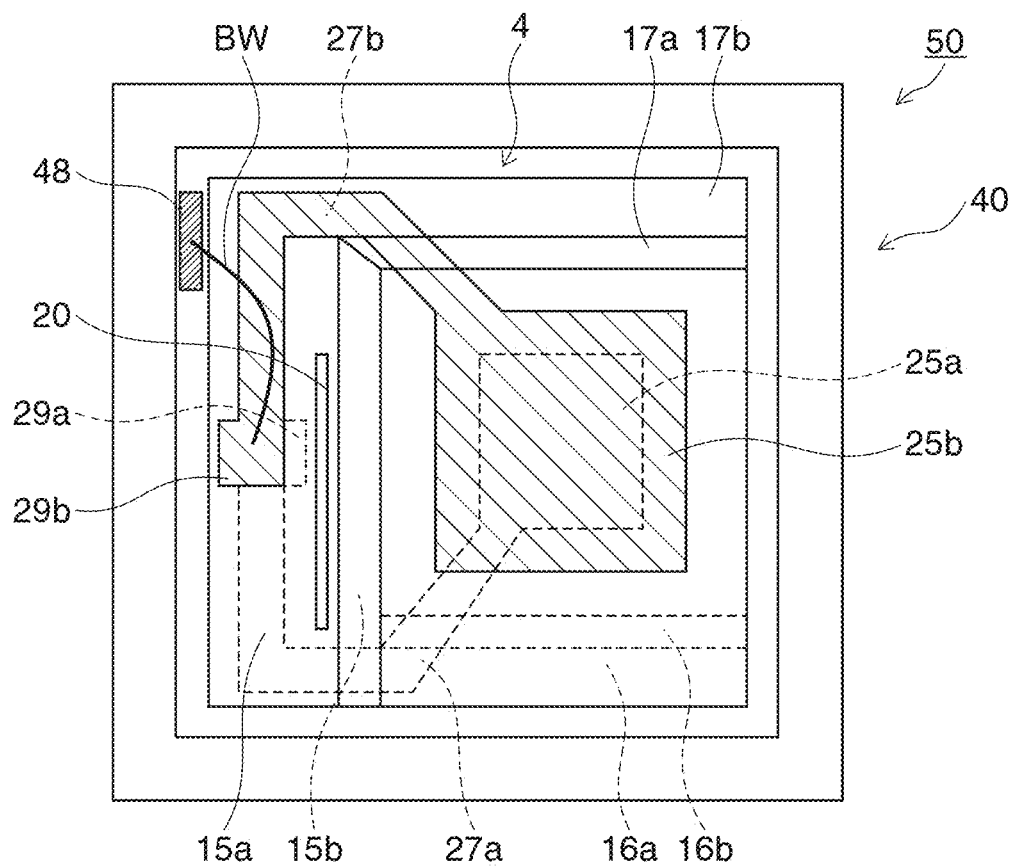

FIGS. 23A and 23B are views illustrating the configuration of a piezoelectric resonator 50 as an embodiment of a resonator according to the embodiment of the invention, in which FIG. 23A is a vertical cross-sectional view, and FIG. 23B is a plan view excluding a lid member. The piezoelectric resonator 50 includes the piezoelectric vibrating element 4 of the fourth embodiment, for example, and a package that accommodates the piezoelectric vibrating element 4. Although FIGS. 23A and 23B illustrates an example where the piezoelectric vibrating element 4 is used, other piezoelectric vibrating elements according to the other embodiments may be used. The package includes a package body 40 that is formed in a rectangular box-like form and a lid member 49 formed of metal, ceramics, glass, or the like.

As illustrated in FIGS. 23A and 23B, the package body 40 is formed by stacking a first substrate 41, a second substrate 42, and a third substrate 43. A ceramic green sheet of alumina is formed on the stacked structure as an insulating material, which is molded into a box-like form and is then sintered to obtain the package body 40. Multiple mounting terminals 45 are formed on the outer bottom surface of the first substrate 41. The third substrate 43 is an annular body with the central portion removed, and a metal seal ring 44 of kovar, for example, is formed on an upper peripheral edge of the third substrate 43.

The third and second substrates 43 and 42 form a concave portion (cavity) in which the piezoelectric vibrating element 4 is accommodated. Multiple element-mounting pads 47 which are electrically connected to the mounting terminals 45 via a conductor 46 are formed at a predetermined position on the upper surface of the second substrate 42. The element-mounting pads 47 are disposed at positions such that the element-mounting pads 47 correspond to the pad electrodes 29a formed on the third thick-walled body 15a when the piezoelectric vibrating element 4 is mounted.

When the piezoelectric vibrating element 4 is fixed to the package body 40, first, a conductive adhesive 30 is applied to the pad electrodes 29a of the piezoelectric vibrating element 4, and the piezoelectric vibrating element 4 is reversed and mounted on the element-mounting pads 47 so that a load is applied to the element-mounting pads 47. As the property of the conductive adhesive 30, the magnitude of stress ($\propto$ strain) resulting from the conductive adhesive 30 increases in the order of a silicone-based adhesive, an epoxy-based adhesive, and a polyimide-based adhesive. Moreover, the amount of outgassing increases in the order of a polyimide-based adhesive, an epoxy-based adhesive, and a silicone-based adhesive. In this embodiment, a polyimide-based adhesive having a small amount of outgassing is used as the conductive adhesive 30 taking aging into consideration.

The package body 40 is inserted into a high-temperature furnace maintained at a predetermined temperature for a predetermined period in order to harden the conductive adhesive 30 of the piezoelectric vibrating element 4 mounted on the package body 40. After the conductive adhesive 30 is hardened, the package body 40 is reversed, and the reversed pad electrode 29b on the front surface side and the electrode terminal 48 of the package body 40 are electrically connected by a bonding wire BW. As illustrated in FIG. 23B, since the piezoelectric vibrating element 4 is supported on or fixed to the package body 40 at only one point, that is, the conductive adhesive 30, it is possible to decrease the magnitude of the stress occurring due to the supporting or fixing.

After an annealing process is performed, a mass is added to or removed from the excitation electrode 25b to perform frequency adjustment. The lid member 49 is placed on the metal seal ring 44 formed on the upper surface of the package body 40, and the lid member 49 is sealed by seam-welding in a vacuum or an atmosphere of nitrogen ($N_2$) gas. Alternatively, the lid member 49 may be placed on a low melting point glass applied to the upper surface of the package body 40 and be tightly attached to the package body 40 by fusing the glass. The cavity of the package may be vacuumed or filled with an inert gas such as nitrogen $N_2$ gas, whereby the piezoelectric resonator 50 is obtained.

The piezoelectric vibrating element 4 includes the pad electrodes 29a and 29b which are formed closely to the upper and lower surfaces of the piezoelectric substrate that form the piezoelectric vibrating element 4. When the piezoelectric vibrating element 4 is accommodated in the package body 40, the piezoelectric vibrating element 4 is reversed, and the pad electrode 29a and the element-mounting pad 47 of the package body 40 are fixed and connected by the conductive adhesive 30. The pad electrode 29b on the front surface side and the electrode terminal 48 of the package are connected by the bonding wire BW. In this way, when the piezoelectric vibrating element 4 is supported at one point, it is possible to decrease the stress occurring due to the conductive adhesive 30. Moreover, when the package body 40 is accommodated, the piezoelectric vibrating element 4 is reversed so that the excitation electrode 25b having the larger area is on the upper side. Thus, it becomes easy to perform fine adjustment of the frequency of the piezoelectric vibrating element 4.

Second Embodiment of Resonator

Figure 24:
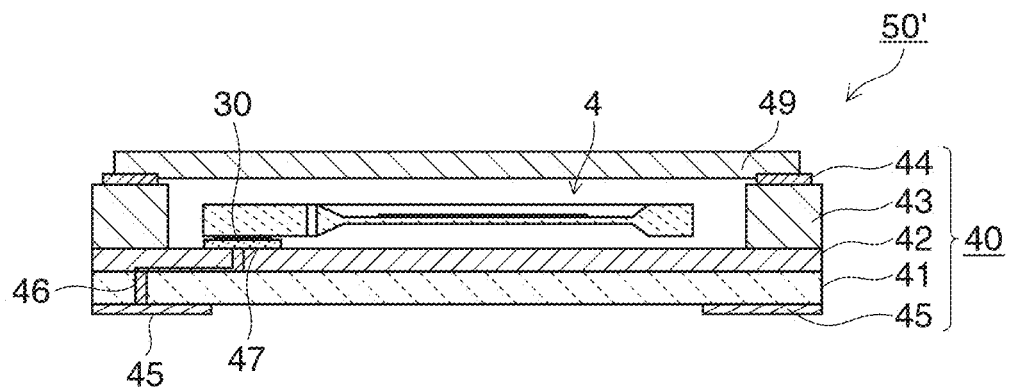
FIG. 24 is a vertical cross-sectional view illustrating the configuration of a modification example of a piezoelectric resonator.

FIG. 24 is a vertical cross-sectional view illustrating the configuration of a piezoelectric resonator 50' according to another embodiment of the resonator. The piezoelectric resonator 50' is different from that of the embodiment illustrated in FIGS. 23A and 23B in that the piezoelectric vibrating element 4 is supported by a different method. In the embodiment of FIGS. 23A and 23B, the piezoelectric vibrating element 4 is supported at one point. However, the embodiment of FIG. 24 has a structure in which the conductive adhesive 30 is applied to two positions (two points) of the third thick-walled portions 15 on one surface of the piezoelectric vibrating element 4 so that electrical connection, supporting, and fixing are realized. Although this structure is ideal for decreasing the height, there is a problem in that the stress resulting from the conductive adhesive 30 may increase slightly.

Therefore, by employing the piezoelectric vibrating elements 3, 7, and 7' which are the third and sixth embodiments, and in which two slits are formed as illustrated in FIGS. 6A to 6C and FIGS. 7A and 7B or FIGS. 13A to 13C and FIGS. 14A and 14B, it is expected that the effect of the stress on the vibrating portion can be suppressed. Alternatively, when the conductive adhesive is relatively hard, by decreasing the center-to-center distance of "two positions (two points)" where the conductive adhesive is applied, the strain (stress) associated with the mounting, occurring between the two points can be decreased. Alternatively, by using a silicone-based adhesive which is relatively soft as the conductive adhesive so that the conductive adhesive has shock-absorbing properties, the strain (stress) associated with the mounting, occurring between the two points can be decreased.

In the embodiments of the piezoelectric resonators 50 and 50' described above, although an example in which a stacked plate is used as the package body 40 has been described, the piezoelectric resonator may be formed using a single-layer ceramic plate as the package body 40 and using a cap having been subjected to spinning as the lid.

As described above, since the piezoelectric resonator uses the piezoelectric vibrating element 4 illustrated in the above-described embodiments, it is possible to miniaturize the high-frequency piezoelectric resonators 50 and 50' and to obtain a piezoelectric resonator having improved impact resistance. Moreover, since the piezoelectric vibrating element 4 is supported at one point, and at least one slit 20 is formed between the supported portion (the pad electrode 29a) and the vibrating portion 12, it is possible to decrease the stress occurring due to the conductive adhesive 30. As a result, it is possible to obtain a piezoelectric resonator having excellent frequency reproducibility, frequency-temperature characteristics, CI-temperature characteristics, and frequency-aging characteristics. Further, it is possible to obtain a piezoelectric vibrating element in which the CI value of a main vibration mode is low, and the ratio, that is, a CI value ratio, of the CI value in an adjacent spurious vibration mode to the CI value of a main vibration mode is high, and to obtain the piezoelectric resonators 50 and 50' having a small capacitance ratio 7.

Moreover, as illustrated in the embodiment of FIG. 24, by configuring the piezoelectric resonator having a two-point supporting structure, it is possible to obtain the piezoelectric resonator 50' having a small height. By forming two slits, it is possible to suppress the effect on the vibrating portion, of the supporting stress resulting from the two-point supporting structure.

Moreover, as illustrated in the embodiments of FIGS. 1A to 1F and FIG. 3 to FIGS. 6A to 6C, the piezoelectric resonator uses the piezoelectric vibrating elements 1, 2, and 3 in which the electrode materials of the excitation electrodes 25a and 25b are different from the electrode materials of the lead electrodes 27a and 27b and the pad electrodes 29a and 29b, and the thicknesses thereof are optimized to the respective functions of the electrodes. Thus, it is possible to obtain the piezoelectric vibrating elements 1, 2, and 3 in which the CI value of a main vibration mode is low, and the ratio, that is, a CI value ratio, of the CI value in an adjacent spurious vibration mode to the CI value of a main vibration mode is high.

Piezoelectric Device as Electronic Device

Figure 25:
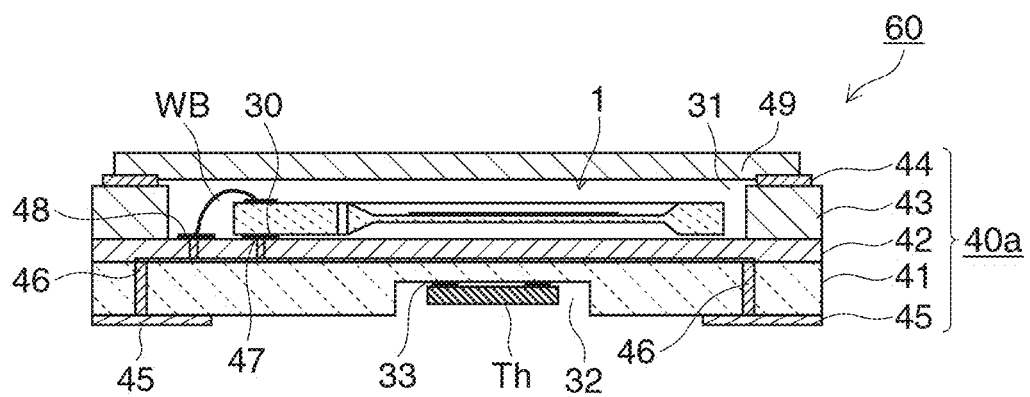
FIG. 25 is a vertical cross-sectional view of an electronic device (piezoelectric device).

FIG. 25 is a vertical cross-sectional view illustrating an embodiment of an electronic device according to the embodiment of the invention. A piezoelectric device 60 as the electronic device includes the piezoelectric vibrating element 1 of the first embodiment, a thermistor Th which is one of electronic components and is a thermosensor as a temperature sensor, and a package that accommodates the piezoelectric vibrating element 1 and the thermistor Th. Although this embodiment illustrates an example where the piezoelectric vibrating element 1 is used, the piezoelectric vibrating elements according to the other embodiments may be used.

The package includes a package body 40a and a lid member 49. The package body 40a includes a cavity 31 which is formed on an upper surface side so as to accommodate the piezoelectric vibrating element 1 and a concave portion 32 which is formed on an outer rear surface side so as to accommodate the thermistor Th. An element-mounting pad 47 is formed in an end portion of the inner bottom surface of the cavity 31 and is electrically connected to multiple mounting terminals 45 by a conductor 46 disposed in the inner side of the package body 40a.

A conductive adhesive 30 is applied to the pad electrode 29a of the piezoelectric vibrating element 1, and the piezoelectric vibrating element 1 is reversed and mounted on the element-mounting pad 47. The reversed pad electrode 29b on the front surface side and the electrode terminal 48 are connected by a bonding wire BW. A metal seal ring 44 formed of kovar or the like is formed on an upper portion of the package body 40a, and a lid member 49 is placed on the metal seal ring 44. The metal seal ring 44 is welded using a resistance welder or the like so that the cavity 31 is vacuum-sealed. The cavity 31 may be vacuumed or be filled with an inert gas. The terminals of the thermistor Th are connected to electronic component mounting pads 33 of the concave portion 32 on the rear surface using solder balls or the like, whereby the piezoelectric device 60 is obtained.

In the above embodiments, an example in which the concave portion 32 is formed on the outer lower surface side of the package body 40a so that electronic components are mounted in the concave portion 32 has been described. However, the concave portion 32 may be formed on the inner bottom surface of the package body 40a so that electronic components are mounted in the concave portion 32.

Moreover, an example in which the piezoelectric vibrating element 1 and the thermistor Th are accommodated in the package body 40a has been described. However, it is preferable that the electronic device is configured by accommodating at least one of a thermistor, a capacitor, a reactance element, and a semiconductor element in the package body 40a as an electronic component.

In the embodiment illustrated in FIG. 25, the piezoelectric vibrating element 1 and the thermistor Th are accommodated in the package body 40a. According to this configuration, since the thermistor Th as a thermosensor is disposed very closely to the piezoelectric vibrating element 1, it is possible to sense a temperature change of the piezoelectric vibrating element 1 quickly. Moreover, when the electronic device (piezoelectric device) includes the piezoelectric vibrating element according to the embodiment of the invention and the electronic component described above, since it is possible to form a high-frequency and compact electronic device (piezoelectric device), the electronic device can be used in various fields.

Moreover, when the electronic device (piezoelectric device) is formed using any one of a variable capacitance element, a thermistor, an inductor, and a capacitor as an electronic component, a compact electronic device compatible with the specifications can be realized at a low cost.

Figure 26A:
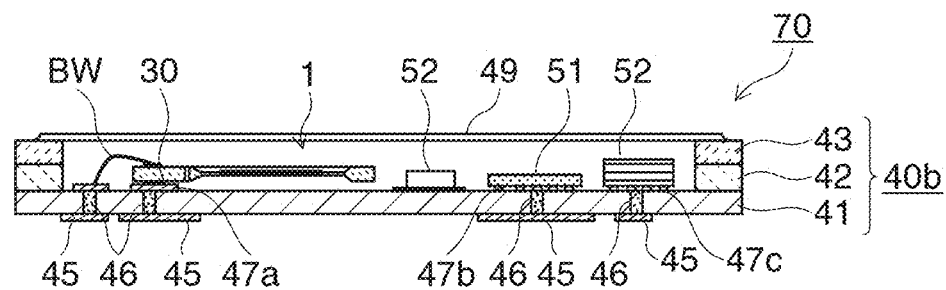
FIGS. 26A and 26B are a vertical cross-sectional view and a plan view, of an electronic device (piezoelectric device).
Figure 26B:
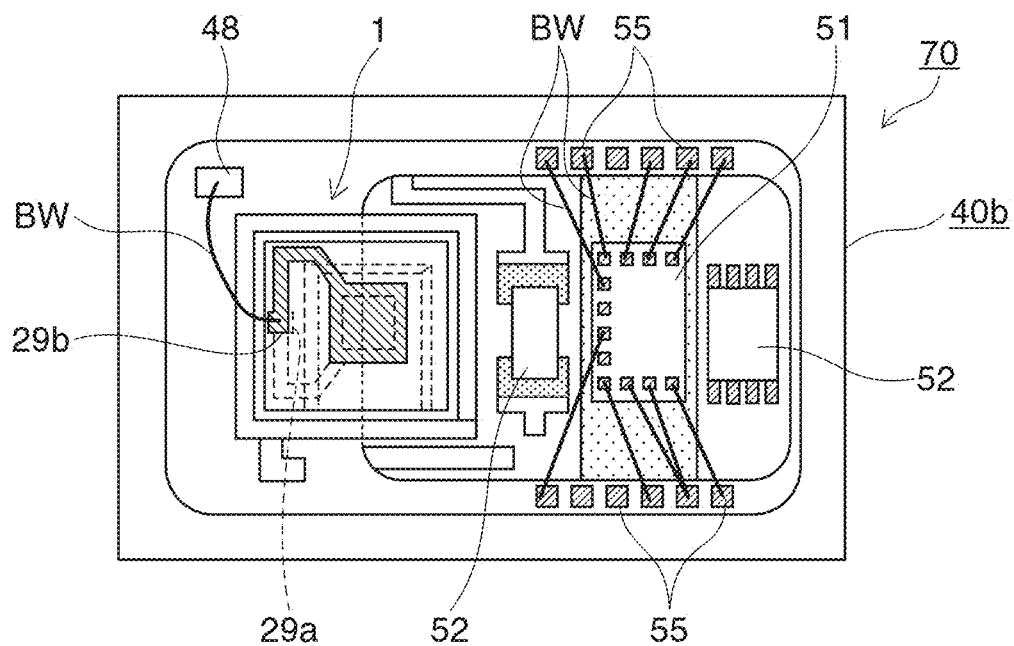

FIGS. 26A and 26B are views illustrating the configuration of a piezoelectric oscillator 70 which is one type of the electronic device according to the embodiment of the invention, in which FIG. 26A is a vertical cross-sectional view, and FIG. 26B is a plan view excluding a lid member. The piezoelectric oscillator 70 includes a package body 40b, a lid member 49, the piezoelectric vibrating element 1 of the first embodiment, an IC component 51 mounting an oscillation circuit for exciting the piezoelectric vibrating element 1, and at least one of electronic components 52 such as a variable capacitance element of which the capacitance varies with a voltage, a thermistor of which the resistance varies with a temperature, and an inductor. Although this embodiment illustrates an example where the piezoelectric vibrating element 1 is used, piezoelectric vibrating elements illustrated in the other embodiments may be used.

A conductive adhesive (polyimide-based adhesive) 30 is applied to the pad electrode 29a of the piezoelectric vibrating element 1, and the piezoelectric vibrating element 1 is reversed and mounted on an element-mounting pad 47a of the package body 40b so that the pad electrode 29a and the element-mounting pad 47a are electrically connected. The reversed pad electrode 29b on the upper surface side and the other electrode terminal 48 of the package body 40b are electrically connected by a bonding wire BW. The IC component 51 is fixed to a predetermined position of the package body 40b, and the terminals of the IC component 51 and the electrode terminals 55 of the package body 40b are connected by the bonding wire BW. Moreover, the electronic components 52 are mounted at predetermined positions of the package body 40b and are connected using a metal bump or the like. The package body 40b is vacuumed or filled with an inert gas such as nitrogen, and the package body 40b is sealed by the lid member 49, whereby the piezoelectric oscillator 70 is obtained.

According to the method of connecting the pad electrode 29b and the electrode terminal 48 of the package using the bonding wire BW, since the piezoelectric vibrating element 1 is supported at one point, it is possible to decrease the stress occurring due to the conductive adhesive 30. Moreover, when the package body 40b is accommodated, the piezoelectric vibrating element 1 is reversed so that the excitation electrode 25b having the larger area is on the upper side. Thus, it becomes easy to perform fine adjustment of the frequency of the piezoelectric oscillator 70 as the electronic device.

In the piezoelectric oscillator 70 illustrated in FIGS. 26A and 26B, the piezoelectric vibrating element 1, the IC component 51, and the electronic components 52 are disposed on the inner bottom surface of the same package body 40b. However, in a piezoelectric oscillator 70' of an embodiment illustrated in FIG. 27, an H-type package body 40a is used, and the piezoelectric vibrating element 1 is accommodated in a cavity 31 formed in an upper portion of the package body 40a. The cavity 31 is vacuumed or filled with nitrogen $N_2$ gas, and the package body 40a is sealed by a lid member 61. On the lower portion of the package body 40a, an IC component 51 that mounts an oscillation circuit for exciting the piezoelectric vibrating element 1, an amplification circuit, and the like, and an electronic component 52 such as a variable capacitance element and if necessary, an inductor, a thermistor, and a capacitor are disposed and electrically connected to terminals 67 of the package body 40a via metal bumps (Au bumps) 68.

In the electronic device (piezoelectric oscillator) 70' of this embodiment, since the piezoelectric vibrating element 1 is separated from the IC component 51 and the electronic component 52, and the piezoelectric vibrating element 1 is solely vacuum-sealed, the piezoelectric oscillator 70 has excellent frequency-aging characteristics.

Figure 27:
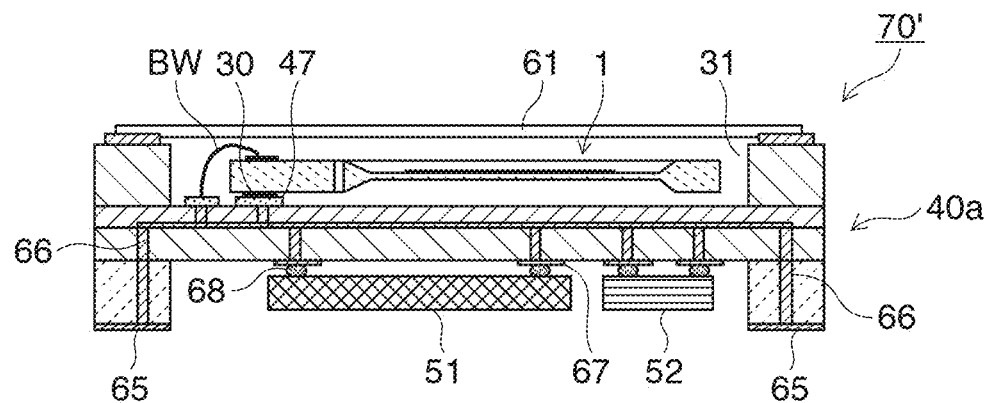
FIG. 27 is a vertical cross-sectional view of a modification example of an electronic device.

By using the piezoelectric oscillators 70 and 70' (for example, voltage-controlled piezoelectric oscillators) which are one type of an electronic device as illustrated in FIGS. 26A and 26B and FIG. 27, it is possible to obtain a high-frequency (for example, 490 MHz band) compact voltage-controlled piezoelectric oscillator having excellent frequency reproducibility, frequency-temperature characteristics, and frequency-aging characteristics. Moreover, since the piezoelectric oscillators 70 and 70' use the fundamental frequency piezoelectric vibrating element 1 having a small capacitance ratio, it is possible to obtain a voltage-controlled piezoelectric oscillator having a wide frequency-variable range and an excellent S/N ratio.

Moreover, a piezoelectric oscillator, a temperature-compensation piezoelectric oscillator, a voltage-controlled piezoelectric oscillator, and the like can be configured as the electronic device. Further, it is possible to configure a piezoelectric oscillator having excellent frequency reproducibility and frequency-aging characteristics, a temperature-compensation piezoelectric oscillator having excellent frequency-temperature characteristics, and a voltage-controlled piezoelectric oscillator having stable frequency, a wide frequency-variable range, and an excellent S/N ratio (signal-to-noise ratio).

Electronic Apparatus

Figure 28:
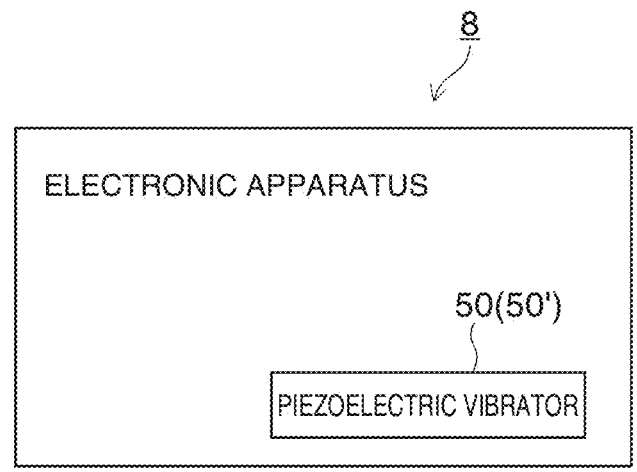
FIG. 28 is a schematic view of an electronic apparatus.

FIG. 28 is a schematic view illustrating the configuration of an electronic apparatus 8 according to an embodiment of the invention. The electronic apparatus 8 includes the piezoelectric resonator 50 or 50' described above. An example of the electronic apparatus 8 using the piezoelectric resonator 50 is a signal transmission apparatus. The piezoelectric resonator 50 or 50' in the electronic apparatus 8 is used as a reference signal source or a voltage-variable piezoelectric oscillator (VCXO). Thus, it is possible to provide a compact electronic apparatus having excellent characteristics.

When the piezoelectric resonator according to the embodiment of the invention is used in an electronic apparatus, it is possible to provide an electronic apparatus which includes a reference frequency source having excellent frequency stability at high frequencies and an excellent S/N ratio.

Next, an electronic apparatus to which the vibrating element according to the embodiment of the invention is applied will be described in detail with reference to FIGS. 29 to 31.

Figure 29:
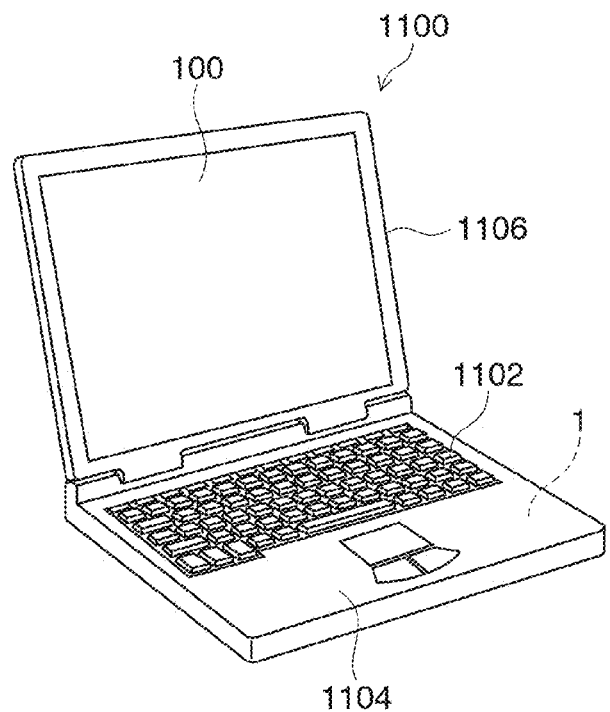
FIG. 29 is a perspective view illustrating the configuration of a mobile personal computer as an example of an electronic apparatus.

FIG. 29 is a schematic perspective view illustrating the configuration of a mobile-type (or a note-type) personal computer 1100 as an electronic apparatus having the vibrating element according to the embodiment of the invention. In FIG. 29, the personal computer 1100 includes a body portion 1104 including a keyboard 1102 and a display unit 1106 including a display portion 100. The display unit 1106 is pivotably supported via a hinge structure with respect to the body portion 1104. In the personal computer 1100, the vibrating element 1 that functions as a filter, a resonator, a reference clock, or the like is included.

Figure 30:
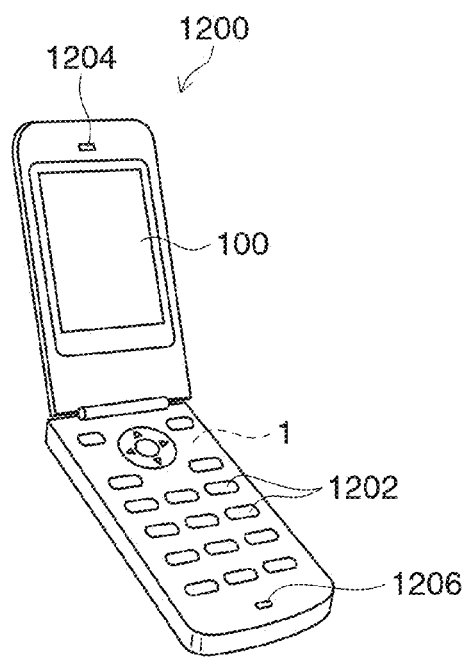
FIG. 30 is a perspective view illustrating the configuration of a portable phone as an example of an electronic apparatus.

FIG. 30 is a schematic perspective view illustrating the configuration of a portable phone 1200 (including a personal handyphone system (PHS)) as an electronic apparatus including the vibrating element according to the embodiment of the invention. In FIG. 30, the portable phone 1200 includes multiple operation buttons 1202, an ear piece 1204, and a mouth piece 1206, and a display portion 100 is disposed between the operation buttons 1202 and the ear piece 1204. In the portable phone 1200, the vibrating element 1 that functions as a filter, a resonator, or the like is included.

Figure 31:
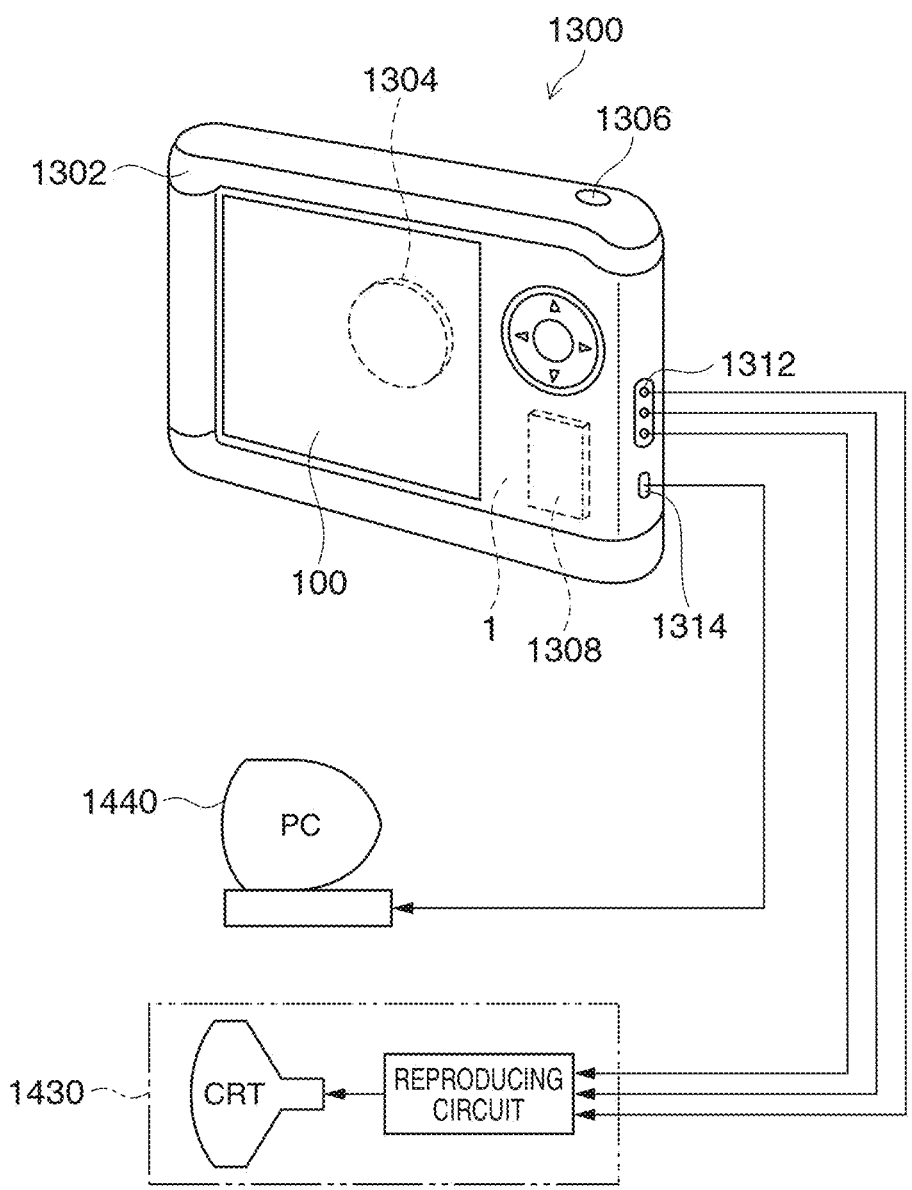
FIG. 31 is a perspective view illustrating the configuration of a digital camera as an example of an electronic apparatus.

FIG. 31 is a schematic perspective view illustrating the configuration of a digital camera 1300 as an electronic apparatus including the vibrating element according to the embodiment of the invention. In FIG. 31, the illustration of connection to external devices is simplified. In normal cameras, a silver halide film is sensitized by an optical image of a subject. However, the digital camera 1300 generates an imaging signal (image signal) by photoelectrically converting the optical image of a subject using an imaging element such as a charge coupled device (CCD).

The display portion 100 is provided on the back surface of a case (body) 1302 of the digital camera 1300, and an image is displayed based on an imaging signal generated by the CCD. The display portion 100 functions as a finder that displays the subject as an electronic image. Moreover, a light-receiving unit 1304 including an optical lens (imaging optical system), a CCD, and the like is provided on the front surface side (the rear surface side of the drawing) of the case 1302.

When a photographer presses a shutter button 1306 while viewing a subject image displayed on the display portion 100, an imaging signal generated by the CCD at that point in time is transferred to and stored in a memory 1308. Moreover, the digital camera 1300 includes a video signal output terminal 1312 and an input/output terminal 1314 for data communication which are provided on the side surface of the case 1302. Further, as illustrated in the drawing, a television monitor 1430 and a personal computer (PC) 1440 are connected to the video signal output terminal 1312 and the input/output terminal 1314 for data communication, respectively, as necessary. In addition, the imaging signals stored in the memory 1308 are output to the television monitor 1430 or the personal computer 1440 in accordance with a predetermined operation. In the digital camera 1300, the vibrating element 1 that functions as a filter, a resonator, or the like is included.

In addition to the personal computer (mobile-type personal computer) of FIG. 29, the portable phone of FIG. 30, and the digital camera of FIG. 31, examples of the electronic apparatus including the vibrating element according to the embodiment of the invention include an ink jet ejection apparatus (for example, an ink jet printer), a laptop personal computer, a television, a video camera, a video tape recorder, a car navigation apparatus, a pager, an electronic pocket book (including one with communication capability), an electronic dictionary, a calculator, an electronic game machine, a word processor, a work station, a television phone, a surveillance TV monitor, electronic binoculars, a POS terminal, a medical device (for example, an electronic thermometer, a sphygmomanometer, a glucose meter, an electrocardiogram measuring system, an ultrasonic diagnosis device, and an electronic endoscope), a fish finder, various measurement instruments, various indicators (for example, indicators used in vehicles, airplanes, and ships), a flight simulator, and the like.

Moving Vehicle

Figure 32:
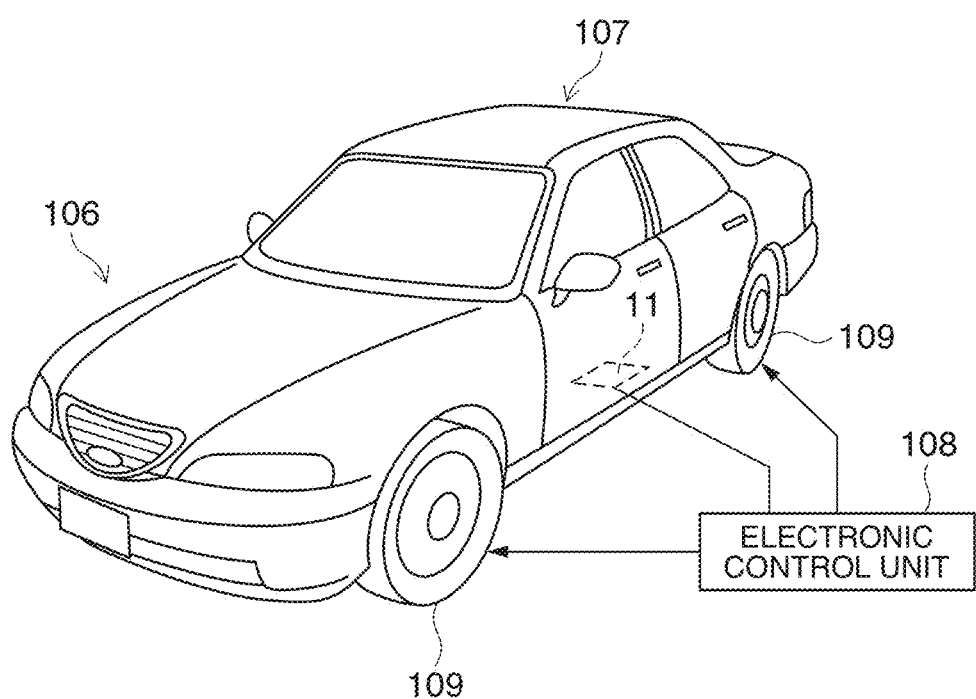
FIG. 32 is a perspective view illustrating the configuration of an automobile as an example of a moving vehicle.

FIG. 32 is a perspective view schematically illustrating an automobile 106 as an example of a moving vehicle. A resonator or an electronic device including the vibrating element described above is mounted in the automobile 106. For example, the vibrating element can be broadly applied to various electronic control units (ECUs) such as a remote keyless entry, an immobilizer, a car navigation system, a car air-conditioner, an anti-lock brake system (ABS), an airbag, a tire pressure monitoring system (TPMS), an engine control system, a battery monitor of a hybrid automobile or an electric automobile, or a vehicle attitude control system.

First Modification Example

The following structures may be employed as a method of further mitigating or suppressing the stress resulting from the mounting of a piezoelectric vibrating element.

Figure 33A:
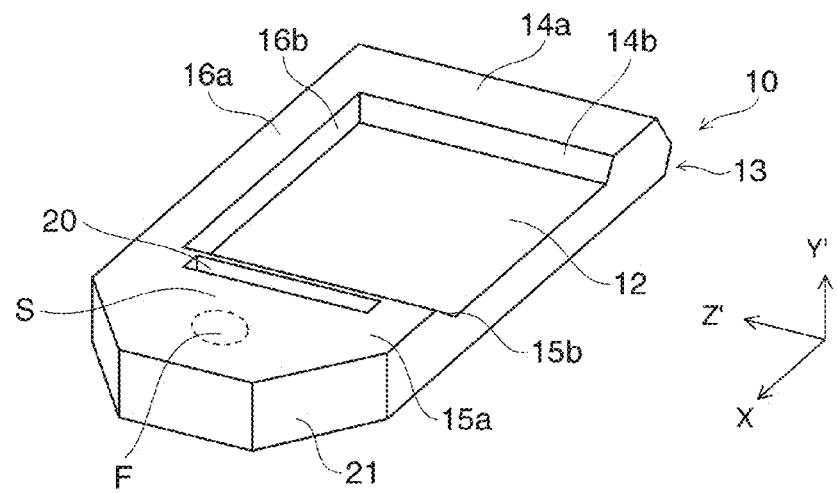
FIGS. 33A to 33C are perspective views of a modification example of a piezoelectric substrate.

A piezoelectric substrate 10 of FIG. 33A includes a thin-walled portion having a vibrating portion 12 and thick-walled portions 13 having a thickness greater than that of the thin-walled portion, formed in the peripheral edge of the thin-walled portion. A slit 20 is formed in one of the thick-walled portions 13 so as to extend along the vibrating portion 12, and a mounting portion F is connected horizontally parallel to the thick-walled portion in the edge direction through a shock-absorbing portion S being interposed. The mounting portion F has chamfered portions 21 at both end portions thereof in the direction orthogonal to the arrangement direction of the mounting portion F, the shock-absorbing portion S, and the thick-walled portion 13.

Figure 33B:
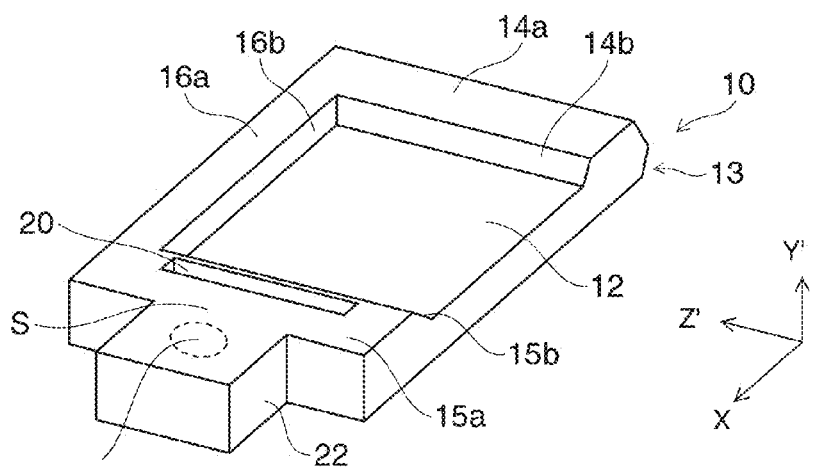

A piezoelectric substrate 10 of FIG. 33B includes a thin-walled portion having a vibrating portion 12 and thick-walled portions 13 having a thickness greater than that of the thin-walled portion, formed in the peripheral edge of the thin-walled portion. A slit 20 is formed in one of the thick-walled portions 13 so as to extend along the vibrating portion 12, and a mounting portion F is connected horizontally parallel to the thick-walled portion in the edge direction via a shock-absorbing portion S interposed. The mounting portion F has notch portions 22 at both end portions thereof in the direction orthogonal to the arrangement direction of the mounting portion F, the shock-absorbing portion S, and the thick-walled portion 13. The longitudinal direction of the slit 20 is approximately parallel to the orthogonal direction, and the width in the orthogonal direction of the mounting portion F is smaller than the width in the longitudinal direction of the slit 20. Further, both end portions in the longitudinal direction of the slit 20 are disposed closer to the outer periphery in the orthogonal direction than both end portions of the mounting portion F.

Figure 33C:
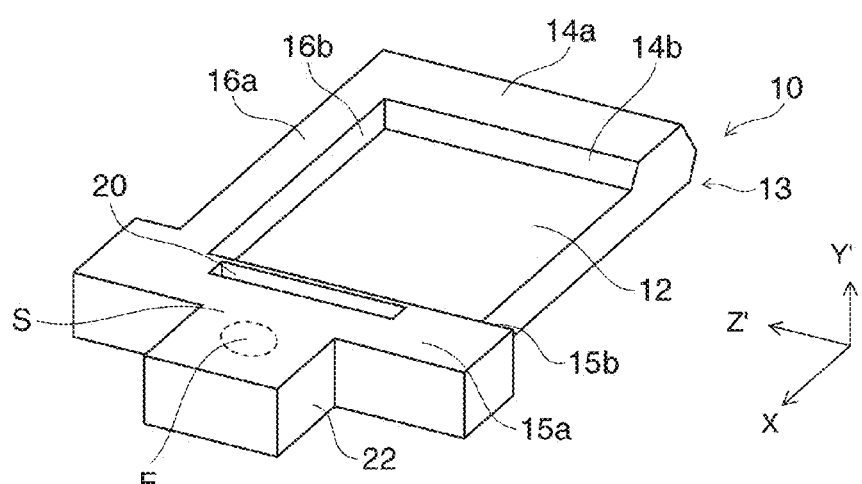

A piezoelectric substrate 10 of FIG. 33C includes a thin-walled portion having a vibrating portion 12 and thick-walled portions 13 having a thickness greater than that of the thin-walled portion, formed in the peripheral edge of the thin-walled portion. A slit 20 is formed in one of the thick-walled portions of thick-walled portions 13 so as to extend along the vibrating portion 12, and a mounting portion F is connected horizontally parallel to the thick-walled portion in the edge direction via a shock-absorbing portion S interposed. The mounting portion F has notch portions 22 at both end portions thereof in the direction orthogonal to the arrangement direction of the mounting portion F, the shock-absorbing portion S, and the thick-walled portion 13. In the thick-walled portion in which the slit 20 and the shock-absorbing portion S are formed, the end portions in the direction orthogonal to the arrangement direction of the mounting portion F and the shock-absorbing portion S protrude further than the end portions of the vibrating portion 12 and the end portions of the other thick-walled portions which are formed in the orthogonal direction to the extension direction of the thick-walled portion.

Figure 34A:
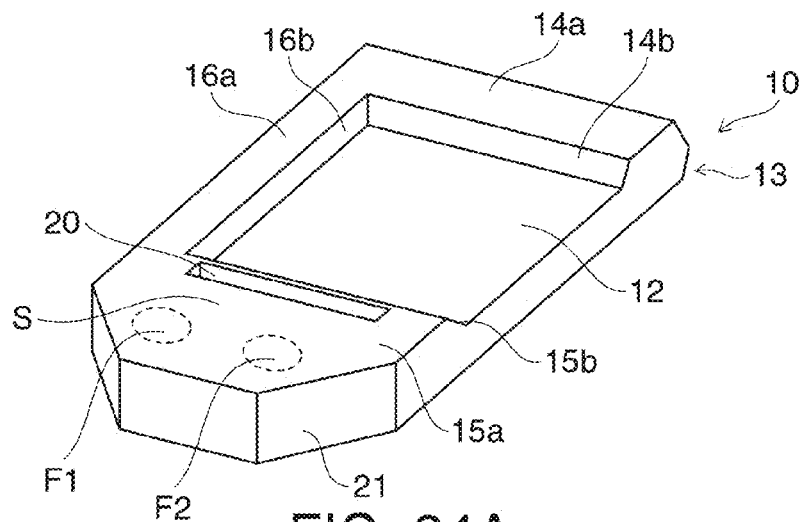
FIGS. 34A to 34C are perspective views of a modification example of a piezoelectric substrate.
Figure 34B:
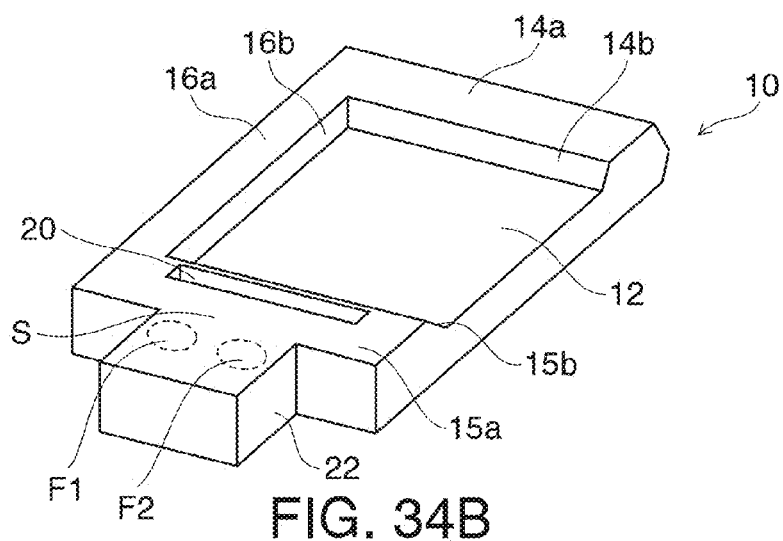
Figure 34C:
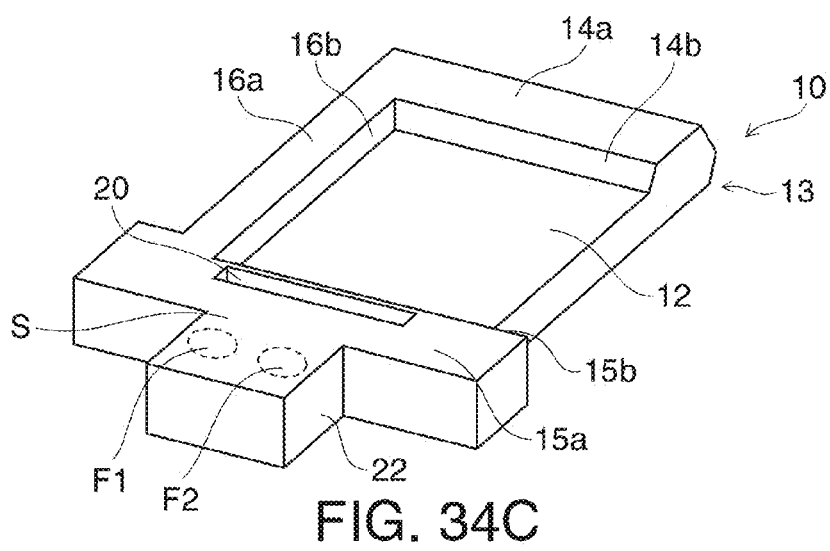

The structure illustrated in FIGS. 34A to 34C is characterized in that it has a two-point mounting structure different from the structure illustrated in FIGS. 33A to 33C. That is, the mounting portion F is replaced with mounting portions F1 and F2.

In FIGS. 33A to 33C and FIGS. 34A to 34C, a slope portion is formed on the inner walls of the respective thick-walled portions (first, third, and fourth thick-walled portions 16, 15, and 14) of the thick-walled portion 13. Although not illustrated in the drawings, a sloped surface as illustrated in FIGS. 21A and 21B are formed on the outer side wall surfaces of the thick-walled portions 13. These slope portions and sloped surfaces are formed in the corresponding portions as illustrated in FIGS. 21A and 21B.

The respective reference numerals in FIGS. 33A to 33C and FIGS. 34A to 34C correspond to the portions denoted by the same reference numerals in the respective embodiments.

Second Modification Example

Figure 35A:
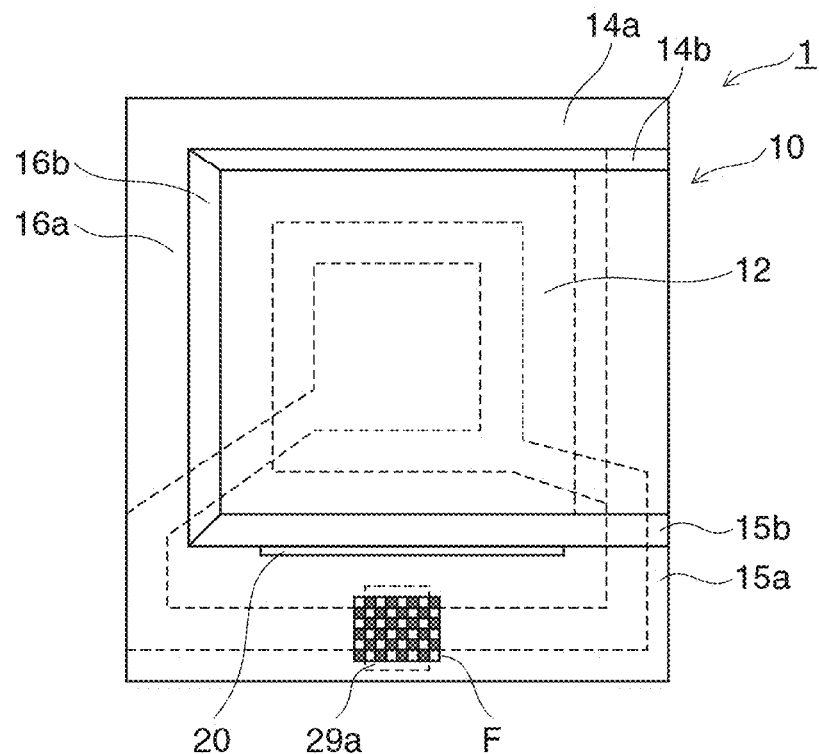
Figure 35B:
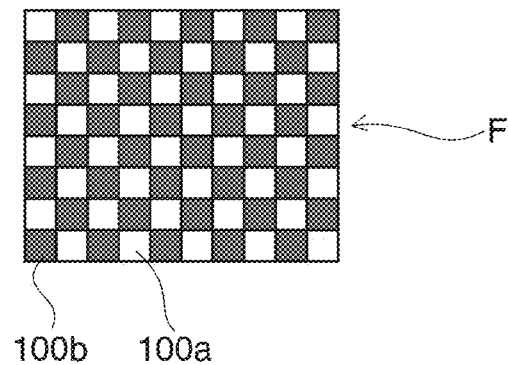
Figure 35C:
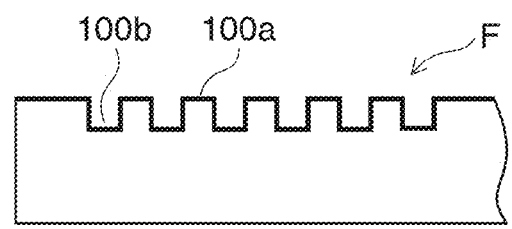

FIGS. 35A to 35C illustrate a modification example of the piezoelectric vibrating element 1, in which FIG. 35A is a plan view, FIG. 35B is an enlarged plan view of the pad electrode 29a (the mounting portion F) of the piezoelectric vibrating element 1, and FIG. 35C is a cross-sectional view of the mounting portion F. In the mounting portion F, a bonding area is increased by forming an uneven surface in order to improve bonding strength.

The entire disclosure of Japanese Patent Application No. 2011-182245, filed Aug. 24, 2011, Japanese Patent Application No. 2011-178783, filed Aug. 18, 2011 and Japanese Patent Application No. 2012-131639, filed Jun. 11, 2012 is expressly incorporated by reference herein.

What is claimed is:

1. A resonating element comprising a substrate, the substrate including:
   a vibrating portion that is in a quadrangle shape with first through fourth sides, that has top and bottom surfaces opposite to each other, and that has a first thickness;
   a first thick-walled portion that is continuously connected to the first side of the vibrating portion, that has top and bottom surfaces opposite to each other, and that has a second thickness;
   a second thick-walled portion that is continuously connected to the second side of the vibrating portion and the first thick-walled portion, that has top and bottom surfaces opposite to each other, and that has a third thickness; and
   a third thick-walled portion that is continuously connected to the third side of the vibrating portion and the first thick-walled portion, that has to and bottom surfaces opposite to each other, and that has a fourth thickness, wherein
   the first thickness is smaller than the second through fourth thicknesses, and the second thickness is larger than the third and fourth thicknesses,
   the top and bottom surfaces of the vibrating portion are respectively and continuously connected to the top and bottom surfaces of the first thick-walled portion via a slope,
   the top surface of the second thick-walled portion is continuously connected to the top surface of the vibrating portion via a slope, and the bottom surface of the second thick-walled portion and the bottom surface of the vibrating portion are continuously connected to each other so as to form a first even surface, and
   the bottom surface of the third thick-walled portion is continuously connected to the bottom surface of the vibrating portion via a slope, and the top surface of the third thick-walled portion and the top surface of the vibrating portion are continuously connected to each other so as to form a second even surface.

2. The resonating element according to claim 1, further comprising:
   a fourth thick-walled portion that is continuously connected to the fourth side of the vibrating portion and the second and third thick-walled portions, that has top and bottom surfaces opposite to each other, and that has second thickness, wherein
   the top and bottom surfaces of the vibrating portion are respectively and continuously connected to the top and bottom surfaces of the fourth thick-walled portion via a slope.

3. The resonating element according to claim 1, wherein the substrate is a rotated Y-cut quartz crystal substrate.

4. The resonating element according to claim 3, wherein the first thick-walled portion is on a positive X-axis side in relation to the vibrating portion in a plan view thereof.

5. The resonating element according to claim 4, wherein the fourth side of the vibrating portion is on a negative X-axis side in relation to the vibrating portion in a plan view thereof.

6. The resonating element according to claim 4, wherein at least one slit is formed in the first thick-walled portion.

7. The resonating element according to claim 6, wherein the slit is formed in a boundary portion between the first thick-walled portion and the slope located next the first side of the vibrating portion.

8. The resonating element according to claim 6, wherein the slit is disposed in the slope located next the first side of the vibrating portion.

9. The resonating element according to claim 6, wherein the at least one slit includes:
   a first slit disposed in the first thick-walled portion, and
   a second slit disposed in the slope located next the first side of the vibrating portion.

10. The resonating element according to claim 9, wherein the first slit is disposed along the boundary portion between the first thick-walled portion and the slope located next the first side of the vibrating portion.

11. A resonator comprising:
the resonating element according to claim 1; and
a package that accommodates the resonating element.

12. An electronic device comprising a package, wherein the resonating element according to claim 1, and an electronic component are included in the package.

13. The electronic device according to claim 12, wherein the electronic component includes at least one of a variable capacitance element, a thermistor, an inductor, and a capacitor.

14. An electronic device comprising a package, wherein the resonating element according to claim 1, and an oscillation circuit that excites the resonating element are included in the package.

15. An electronic apparatus comprising the electronic device according to claim 14.

16. An electronic apparatus comprising the resonating element according to claim 1.

17. A moving vehicle comprising the resonating element according to claim 1.

18. A method of manufacturing a resonating element comprising,
the resonating element includes:
   a vibrating portion that is in a quadrangle shape with first through fourth sides, that has top and bottom surfaces opposite to each other, and that has a first thickness;
   a first thick-walled portion that is continuously connected to the first side of the vibrating portion, that has top and bottom surfaces opposite to each other, and that has a second thickness;
   a second thick-walled portion that is continuously connected to the second side of the vibrating portion and the first thick-walled portion, that has top and bottom surfaces opposite to each other, and that has a third thickness; and a third thick-walled portion that is continuously connected to the third side of the vibrating portion and the first thick-walled portion, that has top and bottom surfaces opposite to each other, and that has a fourth thickness; and the method comprising:
preparing a substrate in which the resonating element is formed;
forming the first, second and third thick-walled portions by etching the substrate;
forming an outer shape of the resonating element by etching the substrate; and
forming electrodes on the resonating element, wherein the first thickness is smaller than the second through fourth thicknesses, and the second thickness is larger than the third and fourth thicknesses, the top and bottom surfaces of the vibrating portion are respectively and continuously connected to the to and bottom surfaces of the first thick-walled portion via a slope, the top surface of the second thick-walled portion is continuously connected to the top surface of the vibrating portion via a slope, and the bottom surface of the second thick-walled portion and the bottom surface of the vibrating portion are continuously connected to each other so as to form a first even surface, and the bottom surface of the third thick-walled portion is continuously connected to the bottom surface of the vibrating portion via a slope, and the top surface of the third thick-walled portion and the top surface of the vibrating portion are continuously connected to each other so as to form a second even surface.

* * * * *